United States Patent
Daniels

(10) Patent No.: US 7,256,427 B2
(45) Date of Patent: Aug. 14, 2007

(54) ORGANIC LIGHT ACTIVE DEVICES WITH PARTICULATED LIGHT ACTIVE MATERIAL IN A CARRIER MATRIX

(75) Inventor: John James Daniels, Higganum, CT (US)

(73) Assignee: Articulated Technologies, LLC, Higganum, CT (US)

( * ) Notice: Subject to any disclaimer, the term of this patent is extended or adjusted under 35 U.S.C. 154(b) by 273 days.

(21) Appl. No.: 10/375,728

(22) Filed: Feb. 26, 2003

(65) Prior Publication Data
US 2004/0097005 A1    May 20, 2004

Related U.S. Application Data

(63) Continuation-in-part of application No. 10/321,161, filed on Dec. 17, 2002, now Pat. No. 6,876,143.

(60) Provisional application No. 60/427,333, filed on Nov. 19, 2002.

(51) Int. Cl.
    *H01L 33/00* (2006.01)
(52) U.S. Cl. .............................. 257/89; 257/40; 257/79
(58) Field of Classification Search .................. 257/40, 257/79, 89
    See application file for complete search history.

(56) References Cited

U.S. PATENT DOCUMENTS

| 5,807,627 A * | 9/1998 | Friend et al. ................ 428/212 |
| 5,858,561 A | 1/1999 | Epstein et al. |
| 5,965,979 A | 10/1999 | Friend et al. |
| 5,991,456 A | 11/1999 | Rahman et al. |
| 6,087,196 A | 7/2000 | Sturm et al. |
| 6,117,567 A | 9/2000 | Andersson et al. |
| 6,252,564 B1 | 6/2001 | Albert et al. |

(Continued)

OTHER PUBLICATIONS

An Alternative Technique for the Computation of the Designator in the Retinex Theory of Color Vision,Proceedings of the National Academy of Science, vol. 83, pp. 3078-3080, 1986.

(Continued)

*Primary Examiner*—Long Pham
(74) *Attorney, Agent, or Firm*—Michaud-Duffy Group, LLP

(57) ABSTRACT

A light active device includes a semiconductor particulate dispersed within a carrier material. A first contact layer is provided so that on application of an electric field charge carriers having a polarity are injected into the semiconductor particulate through the conductive carrier material. A second contact layer is provided so that on application of the electric field to the second contact layer charge carriers having an opposite polarity are injected into the semiconductor particulate through the conductive carrier material. The semiconductor particulate comprises at least one of an organic and an inorganic semiconductor. The semiconductor particulate may comprise an organic light active particulate that includes at least one conjugated polymer. When an electric field is applied between the first and second contact layers to the semiconductor particulate through the conductive carrier material, the second contact layer becomes positive relative to the first contact layer and charge carriers of opposite polarity are injected into the semiconductor particulate. The opposite polarity charge carriers combine to form in the conjugated polymer charge carrier pairs which decay radiatively so that radiation is emitted from the conjugated polymer. In this case, the inventive light active device acts as a light emitting diode.

4 Claims, 42 Drawing Sheets

U.S. PATENT DOCUMENTS

| | | |
|---|---|---|
| 6,307,751 B1 | 10/2001 | Bodony et al. |
| 6,395,328 B1 | 5/2002 | May |
| 6,402,579 B1 | 6/2002 | Pichler et al. |
| 6,416,885 B1 | 7/2002 | Towns et al. |
| 6,420,200 B1 | 7/2002 | Yamazaki et al. |
| 6,422,687 B1 | 7/2002 | Jacobson |
| 6,433,355 B1 | 8/2002 | Riess et al. |
| 6,445,126 B1 | 9/2002 | Arai et al. |
| 6,916,554 B2 * | 7/2005 | Ma et al. ............... 428/690 |
| 7,068,418 B2 * | 6/2006 | Kawase ............... 359/296 |
| 2004/0056180 A1 * | 3/2004 | Yu ............... 250/214.1 |
| 2005/0269564 A1 * | 12/2005 | Narayan ............... 257/40 |

OTHER PUBLICATIONS

Color Vision and the Natural Image, Proceedings of the National Academy of Science, vol. 45, pp. 115-129, 1959.

Biodegradable Polymeric Nanoparticles as Drug Delivery Devices, K.S., Soppimath et al., Journal of Controlled Release, 70 (2001) pp. 1-20.

* cited by examiner

24—

24—

Step One: Provide Top and Bottom Flexible Substrates

Step Two: Form Barrier Layers on Top and Bottom Flexible Substrates

Step Three: Form Top and Bottom Electrodes on Barrier Layer

Figure 24

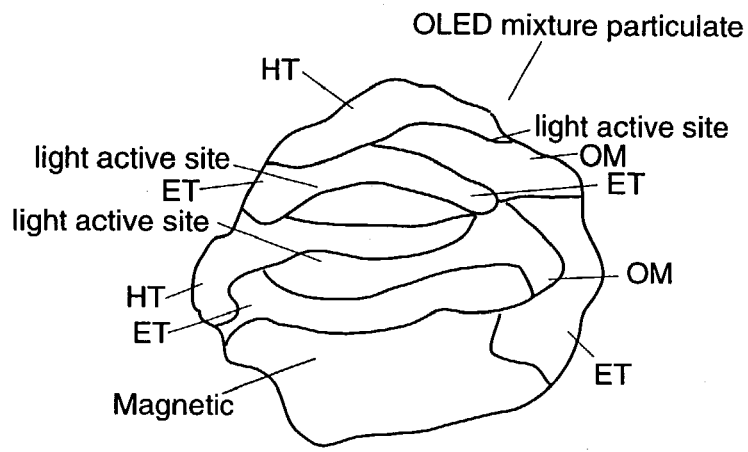
Figure 76
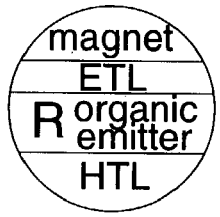 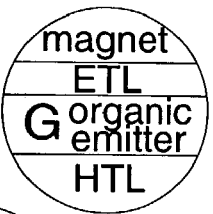
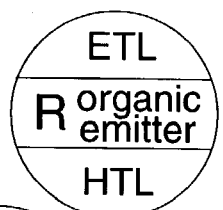
Figure 77
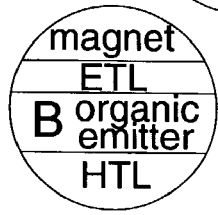
Figure 78
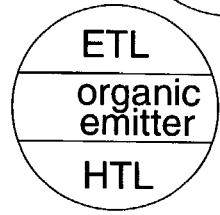 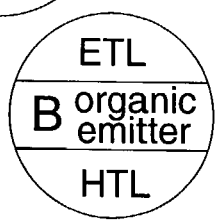
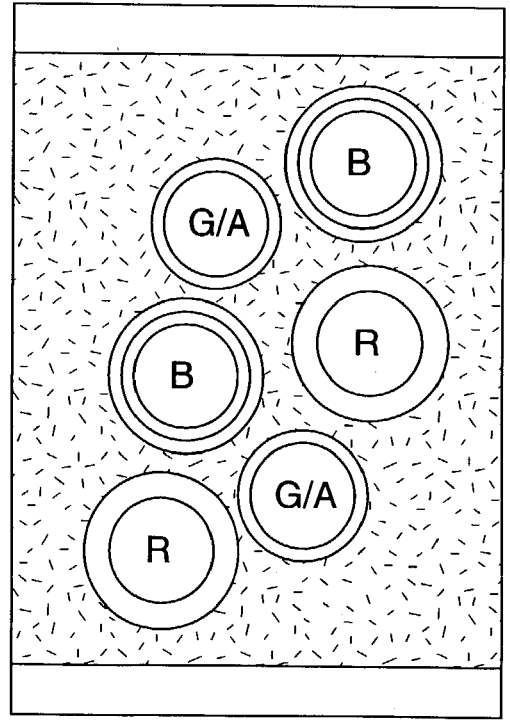
Figure 79

| | |
|---|---|
| Form a first mixture of a first organic light active material component and a first carrier fluid | Step One |
| Form a second mixture of a second organic light active material component and a second carrier | Step Two |
| Generate a first charged mist of the first mixture in an atmosphere | Step Three |
| Generate a second oppositely mist of the first mixture in an atmosphere | Step Four |
| Form a first mixture of a first organic light active material component and a first carrier fluid | Step Five |
| Allow the first particulate and the second particulate to commingle and attract together in the atmosphere to form a first layered organic light active material particulate | Step Six |

Method of forming multilayered OLAM particulate.
Depending on the particulate formula, the number
of layers and the constiuents can change.

Figure 92

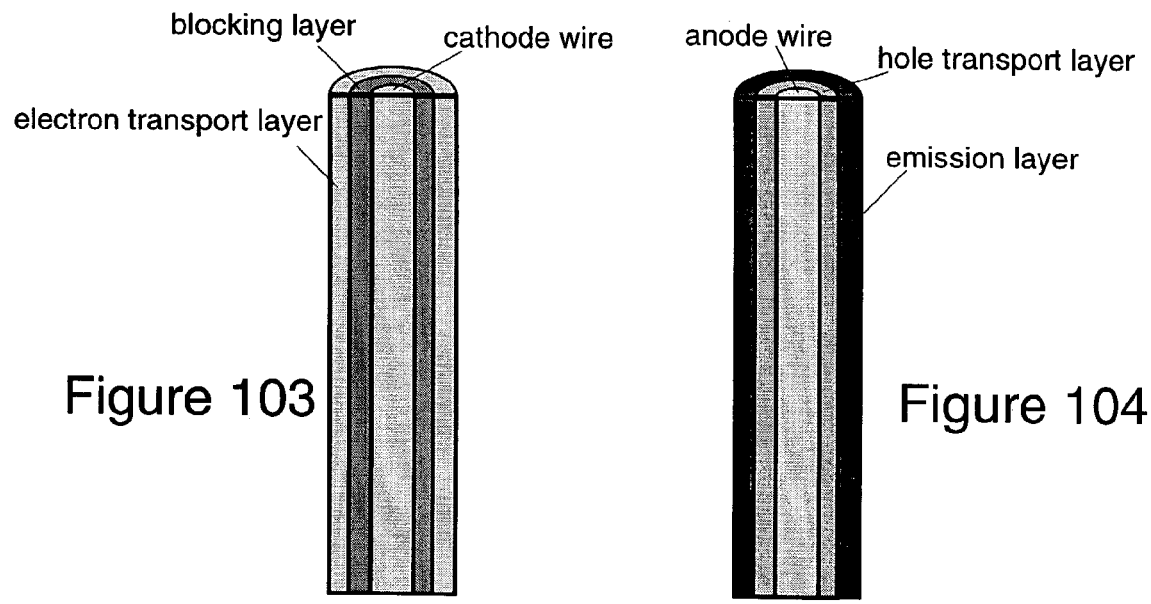
Figure 103
Figure 104
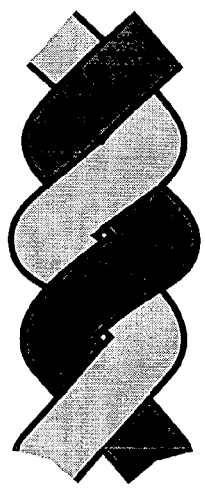
Figure 105

ORGANIC LIGHT ACTIVE DEVICES WITH PARTICULATED LIGHT ACTIVE MATERIAL IN A CARRIER MATRIX

CROSS-REFERENCE TO RELATED APPLICATIONS

This is a continuation-in-part of U.S. Utility patent application Ser. No. 10/321,161, filed Dec. 17, 2002 which is the U.S. Utility patent application of a Provisional Patent Application Ser. No. 60/427,333, filed Nov. 19, 2002.

BACKGROUND OF THE INVENTION

The present invention pertains to organic light active devices. More particularly, the present invention pertains to devices and methods for fabricating organic light active devices that can be used for applications such as general lighting, display backlighting, video displays, Internet appliances, electronic books, maps, digital newspapers, stereoscopic vision aides, head mounted displays, advanced vehicle windshields, solar cells, cameras and photodetectors. A multi-color single layer light active device is disclosed. Also disclosed is a sequential burst driving scheme for a multi-color single layer display. Further disclosed are methods for making organic light active material particulate, as well as an organic light active fiber.

A polymer is made up of organic molecules bonded together. For a polymer to be electrically conductive it must act like a metal with the electrons in the bonds mobile and not bound to the atoms making up the organic molecules. A conductive polymer must have alternate single and double bonds, termed conjugated double bonds. Polyacetylene is a simple conjugated polymer. It is made by the polymerization of acetylene. In the early 1970's, a researcher named Shirakawa was studying the polymerization of acetylene. When too much catalyst was added, the mixture seemed to have a metallic appearance. But unlike metals the resulting polyacetylene film was not an electrical conductor. In the mid-1970's the film was reacted with iodine vapor. The result was an extreme increase in the conductivity of the polymer film, and ultimately resulted in a Nobel Prize in Chemistry for the researchers who discovered it.

Although polyacetylene can be made as conductive as some metals, its conductivity drops rapidly in contact with air. This has led to the development of more stable, conjugated polymers, for example, polypyrrol, polyaniline and polytiophene.

There is now intensive development working with conjugated polymers in their un-doped, semiconductive state. It was found that some conjugated polymers exhibit electroluminescence when a voltage is applied. Further, the absorption of light by the semiconductive polymer results in positive and negative charges that produce an electric current. Thus, conjugated polymers can be used to make solar cells and light detectors.

Organic light active material ("OLAM™") makes use of the relatively recent discovery that polymers can be made to be conductors. Organic light emitting diodes ("OLED") convert electrical energy into light, behaving as a forward biased pn junction. OLAMs can be light emitters or light detectors, depending on the material composition and the device structure. For the purpose of this disclosure, the term OLAM and OLED can be interchanged. In its basic form, an OLED is comprised of a layer of hole transport material upon which is formed a layer of electron transport material. The interface between these layers forms a heterojunction. These layers are disposed between two electrodes, with the hole transport layer being adjacent to an anode electrode and the electron transport layer being adjacent to a cathode electrode. Upon application of a voltage to the electrodes, electrons and holes are injected from the cathode electrode and the anode electrode. The electron and hole carriers recombine at the heterojunction forming excitons and emitting light.

The basic structure of an OLED display is similar to a conventional LCD, where the reactive material (in the LCD case, a liquid crystal, in the OLED case, a conjugated polymer) is sandwiched between electrodes. When an electric field is applied by the electrodes, the OLED material is brought into an excited energy state, this energy state drops down by the emission of photons, packets of light. Thus, each pixel of the OLED display can be controlled to emit light as needed to create a displayed image.

Besides attractive picture quality, an OLED display device consumes less power than liquid crystal display technologies because it emits its own light and does not need backlighting. OLED displays are thin, lightweight, and may be able to be manufactured on flexible materials such as plastic.

Unlike liquid-crystal displays, OLEDs emit light that can be viewed from any angle, similar to a television screen. As compared to LCDs, OLEDs are expected to be much less expensive to manufacture, use less power to operate, emit brighter and sharper images, and "switch" images faster, meaning that videos or animation run more smoothly.

Recently, an effort has been made to create equipment and provide services for manufacturing OLED screens. The potential OLED display market includes a wide range of electronic products such as mobile phones, personal digital assistants, digital cameras, camcorders, micro-displays, personal computers, Internet appliances and other consumer products.

There is still a need, for example, for a thin, lightweight, flexible, bright, wireless display. Such a device would be self-powered, robust, include a built-in user-input mechanism, and ideally functional as a multipurpose display device for Internet, entertainment, computer, and communication use. The discovery of the OLED phenomenon puts this goal within sight.

However, there are still some technical hurdles that remain to be solved before OLED displays will realize their commercial potential. OLED's light emitting materials do not have a long service life. Presently, optimum performance in commercially viable volume production is achievable only for small screens, around 3.5 inches square or less. Storage lifetimes of at least 5 years are typically required by most consumer and business products, and operating lifetimes of >20,000 hours are relevant for most applications.

Organic-light-emitting-diode technology offers the prospect of flexible displays on plastic substrates and roll-to-roll manufacturing processes. One of the biggest challenges to the OLED display industry is from contamination by water and oxygen. The materials involved in small molecule and polymer OLEDs are vulnerable to contamination by oxygen and water vapor, which can trigger early failure. U.S. Pat. No. 5,247,190 issued to Friend et al., teaches an electroluminescent device comprising a semiconductor layer in the form of a thin dense polymer film comprising at least one conjugated polymer sandwiched between two contact layers that inject holes and electrons into the thin polymer film. The injected holes and electrons result in the emission of light from the thin polymer film.

Recently, there has been activity in developing thin, flexible displays that utilize pixels of electro-luminescent materials, such as OLEDs. Such displays do not require any back lighting since each pixel element generates its own light. Typically, the organic materials are deposited by solution processing such as spin-coating, by vacuum deposition or evaporation. As examples, U.S. Pat. No. 6,395,328, issued to May, teaches an organic light emitting color display wherein a multi-color device is formed by depositing and patterning thin layers of light emissive material. U.S. Pat. No. 5,965,979, issued to Friend, et al., teaches a method of making a light emitting device by laminating two self-supporting components, at least one of which has a thin layer of light emitting layer. U.S. Pat. No. 6,087,196, issued to Strum, et al., teaches a fabrication method for forming organic semiconductor devices using ink jet printing for forming thin layers of organic light emitting material. U.S. Pat. No. 6,416,885 B1, issued to Towns et al., teaches an electro-luminescent device wherein a conductive polymer thin layer is disposed between an organic light emitting thin layer and a charge-injecting thin layer that resists lateral spreading of charge carriers to improve the display characteristics. U.S. Pat. No. 6,48,200 B1, issued to Yamazaki et al., teaches a method of manufacturing an electro-optical device using a relief printing or screen printing method for printing thin layers of electro-optical material. U.S. Pat. No. 6,402,579 B1, issued to Pichler et al., teaches an organic light-emitting device in which a multi-layer structure is formed by DC magnetron sputtering to form multiple thin layers of organic light emitting material. U.S. Pat. No. 6,50,687 B1, issued to Jacobson, teaches an electronically addressable micro-encapsulated ink and display. In accordance with the teachings of this reference, microcapsules are formed with a reflective side and a light absorbing side. The microcapsules act as pixels that can be flipped between the two states, and then keep that state without any additional power. In accordance with the teaching of this reference, a reflective display is produced where the pixels reflect or absorb ambient light depending on the orientation of the microcapsules. U.S. Pat. No. 5,858,561, issued to Epstein et al., teaches a light emitting bipolar device consisting of a thin layer of organic light emitting material sandwiched two layers of insulating material. The device can be operated with AC voltage or DC voltage. U.S. Pat. No. 6,433,355 B1, issued to Riess et al., teaches an organic light emitting device wherein a thin organic film region is disposed between an anode electrode and a cathode electrode, at least one of the electrodes comprises a non-degenerate wide band-gap semiconductor to improve the operating characteristic of the light emitting device. U.S. Pat. No. 6,445,126 B1, issued to Arai et al., teaches an organic light emitting device wherein an organic thin layer is disposed between electrodes. An inorganic electrode or hole injecting thin film is provided to improve efficiency, extend effective life and lower the cost of the light emitting device.

It is known to form a thin OLED layer by various method including vacuum deposition, evaporation or spin coating. Thin layers of hole transport material and then electron transport material are formed by these known methods over a grid of anode electrodes. The anode electrodes are formed on a glass plate. A grid of cathode electrodes is then placed adjacent to the electron transport material supported by a second glass plate. Thus, the basic OLED organic stack is sandwiched between electrodes and glass plate substrates. It is generally very difficult to form the electrodes with the precise alignment needed for forming a pixilated display. This task is made even more difficult in a multicolor display, where the OLED pixels emitting, for example, red, green and blue, are formed side-by-side to fabricate a full color display. Because the OLED material and electrodes can be made transparent, it is possible to stack the color OLED pixels on top of each other, allowing for a higher pixel packing density and thus the potential for a higher resolution display. However, the electrode alignment issue still poses a problem. Typically, the well-known use of shadow masks are employed to fabricate the pixel components. Aligning the shadow masks is difficult, and requires extreme precision.

Currently, inkjet printing has gained ground as a promising fabrication method for making OLED displays. The core of this technology is very mature, and can be found in millions of computer printers around the world. However, there are some serious disadvantages to the adapting of inkjet printing to OLED display fabrication. It is still difficult to lay down precise layers of material using the spray heads of inkjet printers. Inkjet printing does not adequately overcome the problem of material degradation by oxygen and water vapor. Elaborate and expensive materials and fabrication processes are needed to provide adequate encapsulation of the display elements to prevent early degradation of the OLED material due to water and oxygen ingress. As an attempt to solve this contamination problem, Vitex Systems, Sunnyvale, Calif., has developed a barrier material in which a monomer vapor is deposited on a polymer substrate, and then the monomer is polymerized. A thin layer of aluminum oxide a few hundred angstroms thick is deposited on the polymerized surface. This process is repeated a number of times to form an encapsulation barrier over an OLED display. This elaborate encapsulation barrier is an example of the effort taken to prevent water and oxygen from contaminating the easily degraded OLED films that form a conventional OLED display device. Even with this elaborate encapsulation process, the edges of the OLED display still need to be sealed.

It is difficult to align display pixel-sized electrodes and inkjet printed OLED material with the accuracy needed to effect a high resolution display. Due to the very thin layers of material involved in forming conventional OLED devices, shorts and the destruction of pixels result from the inclusion of miniscule foreign particles, requiring the use of expensive clean room or vacuum manufacturing facility for the various prior art fabrication methods. Accordingly there is a need for an improved fabrication method for forming OLED devices.

There is also a need for a multi-color OLED structure whereby two or more colors of light can be produced from a single pixel or OLED device. U.S. Pat. No. 6,117,567, issued to Andersson et al, teaches a light emitting polymer device for obtaining voltage controlled colors based on a thin polymer film incorporating more than one electroluminescent conjugated polymer. The polymer thin film is sandwiched between two electrodes. Upon application of different voltages to the electrodes, different colors of light are emitted from the conjugated polymers contained in the thin film.

Edwin Land introduced a theory of color vision based on center/surround retinex (see, An Alternative Technique for the Computation of the Designator in the Retinex Theory of Color Vision," Proceedings of the National Academy of Science, Volume 83, pp. 3078-3080, 1986). Land disclosed his retinex theory in "Color Vision and The Natural Image," Proceedings of the National Academy of Science, Volume 45, pp. 115-129, 1959. These retinex concepts are models for human color perception. Others have shown that a digital image can be improved utilizing the phenomenon of retinex (see, U.S. Pat. No. 5,991,456 issued to Rahman et al, the disclosure of which is incorporated by reference herein). The inventors of the U.S. Pat. No. 5,991,456 patent used Land's retinex theory and devised a method of improving a digital image where the image is initially represented by digital data indexed to represent positions on a display. According to the inventors of the U.S. Pat. No. 5,991,456 patent, an improved digital image can then be displayed based on the adjusted intensity value for each i-th spectral band so-filtered for each position. For color images, a novel color restoration step is added to give the image true-to-life color that closely matches human observation.

Nanoparticles are used in unrelated applications, such as drug deliver devices. Others have shown that very small polymer-based particles can be made by a variety of methods. These nanoparticles vary in size from 10 to 1000 nm. A drug can be dissolved, entrapped, encapsulated or attached to a nanoparticle matrix. Depending on the method of preparation, nanparticles, nanospheres or nanocapsules can be obtianed. (see, *Biodegradable Polymeric Nanoparticles as Drug Delivery Devices*, K. S., Soppimath et al., Journal of Controlled Release, 70(2001) 1-20).

The current state of the OLED fabrication technology requires the formation of very thin films of organic light emitting material. These thin films are formed by known techniques such as vacuum deposition, screen printing, transfer printing and spin coating, or by the re-purposing of existing technology such as ink jet printing. In any case, the current state of the art has at its core the formation of very thin film layers of organic material. These thin films must also be deposited very uniformly and precisely, which has proven extremely difficult to do. These thin layers of organic material are susceptible to major problems, such as delamination, particularly when applied to a flexible substrate. The extreme thinness of the layers of organic material between conductors also results in electrical shorts easily forming due to even very small specks of dust or other contaminants. Because of this limitation, costly cleanroom facilities must be built and maintained using the conventional OLED thin film fabrication techniques. Organic light emitting devices offer tremendous potential due to the nature of the raw materials, however, the current state of the art fabrication methods are limiting the delivery of this potential to the consumer.

SUMMARY OF THE INVENTION

It is an object of the present invention to overcome the drawbacks of the prior art. It is an object of the present invention to provide a method of fabricating a light active device by dispersing three dimensionally a semiconductor particulate within a carrier material. The resulting structure has individual point sources of light emission dispersed with a protective barrier material. The barrier material provides strength to the device and adhesion to the electrodes and/or other films and prevents contamination of the semiconductor particulate. The inventive fabrication method also allows multiple colors to be emitted from the inventive mixture between a single pair of electrodes forming a pixel or device. In an inventive display driving scheme, an array of such pixels is driven so that bursts of color emissions occurs in rapid succession resulting in the perception by the human eye of a range of colors in the visible spectrum. Thus, in accordance with this aspect of the invention, a single emissive layer and pair of electrodes can be used to create a full color video display. The inventive OLAM™ structure can also be used to detect a spectrum of colors when the device is constructed as a photodetector.

In accordance with an aspect of the present invention, a light active device includes a semiconductor particulate dispersed within a carrier material. A first contact layer is provided so that on application of an electric field charge carriers having a polarity are injected into the semiconductor particulate through the conductive carrier material. A second contact layer is provided so that on application of the electric field to the second contact layer charge carriers having an opposite polarity are injected into the semiconductor particulate through the conductive carrier material. The semiconductor particulate comprises at least one of an organic and an inorganic semiconductor. The semiconductor particulate may comprise an organic light active particulate that includes at least one conjugated polymer. When an electric field is applied between the first and second contact layers to the semiconductor particulate through the conductive carrier material, the second contact layer becomes positive relative to the first contact layer and charge carriers of opposite polarity are injected into the semiconductor particulate. The opposite polarity charge carriers combine to form in the conjugated polymer charge carrier pairs which decay radiatively so that radiation is emitted from the conjugated polymer. In this case, the inventive light active device acts as a light emitting diode.

Importantly, the present invention can be used with small molecule OLED materials as well as large molecule OLED materials. It is very difficult or impossible to dissolve small molecule OLED materials in a liquid and so the current state-of-the-art requires the material to be deposited as a very thin film to form an OLED device, using for example, a process similar to the fabrication of computer microprocessor chip. But because the displays are typically much larger than chips, that fabrication process is prohibitively expensive for forming a large display. However, in accordance with the present invention, particulate of the small molecule OLED material can be mixed with the carrier material and disposed within the gap between the electrodes. The particulate can include other materials, such as organic and inorganic characteristic enhancing materials to control the electrical, chemical, optical, mechanical and magnetic properties of the light active device.

The organic light active particulate may includes particles comprised from a polymer blend. The polymer blend including at least one organic emitter blended with at least one of a hole transport material, a blocking material, and an electron transport material. The organic light active particulate may include microcapsules having a polymer shell encapsulating an internal phase. The internal phase and/or the shell can be comprised of a polymer blend including an organic emitter blended with at least one of a hole transport material, a blocking material, and an electron transport material.

To form a display device, the first contact layer and the second contact layer can be arranged to form an array of pixel electrodes. Each pixel includes a portion of the semiconductor particulate dispersed within the conductive carrier material. Each pixel is selectively addressable by applying a driving voltage to the appropriate first contact electrode and the second contact electrode.

Another aspect of the present invention provides a voltage controlled light active device for emitting two or more colors of light. A first electrode and a second electrode are disposed adjacent to each other with a gap between them. A mixture of an organic light active particulate and a conductive carrier material is disposed within the gap. Because of the particulate/carrier mixture, the gap between the electrodes (or what ever layers are sandwiching the organic emissive layer) can be wider than the thickness of the emissive particulate. The particulate is dispersed three dimensionally throughout a conductive carrier. By this construction, many of the drawbacks, such as electrical shorts, delamination, etc., that plauge the very thin polymer film fabrication methods are overcome. The organic light active particulate is comprised of first emitting particles including a first electroluminescent conjugated polymer. The first emitting particles emit a number of photons of a first color in response to a first turn-on voltage applied to the electrodes. The first emitting particles also emit a different number of photons, zero or more, of the first color in response to other turn-on voltages. The organic light active particulate further comprises second emitting particles including a second conjugated polymer. The second emitting particles emit a number of photons of a second color in response to a second turn-on voltage and a different number of photons of the second color in response to other turn-on voltages. Thus, in the case of a multi-colored diode or display, different colors are perceivable by the human eye depending on the applied turn-on voltage.

The organic light active layer may also include third emitting particles including a third electroluminescent conjugated polymer. The third emitting particles emit a number of photons of a third color and/or intensity in response to a third turn-on voltage applied to the electrodes and a different number of photons of the third color and/or intensity in response to other turn-on voltages. A full color display can be obtained by incorporating an array of pixels each capable of emitting different colors, such as a first color red, a second color green and a third color blue. The color emitters can be a mix of organic and inorganic materials. For example, an organic conjugated polymer emitter can be used as a red emitter and an inorganic rare earth metal or metal alloy, or doped inorganic semiconductor, can be used as a green emitter. This combination of organic and inorganic emitters may expand the potential candidates for emissive materials enabling the inventive device to be tuned for specific applications.

The voltage controlled organic light active device can be constructed as a display. In this case, the first electrode is part of an x-grid of electrodes and the second electrode is part of a y-grid of electrodes. The mixture of the organic light active particulate and the conductive carrier material in the gap between the first electrode and the second electrode make up an emissive component of a pixel of a display device. Depending on the device structure it can be driven as a passive matrix or an active matrix device.

In accordance with the present invention, an organic light active display device includes a substrate with a first grid of driving electrodes formed on the substrate. A second grid of electrodes is disposed adjacent to the first grid of electrodes and defines a gap therebetween. A mixture of an organic light active particulate and a conductive carrier material is disposed within the gap. The organic light active particulate includes first particles including a first electroluminescent conjugated polymer having a first turn-on voltage and second particles including a second electroluminescent conjugated polymer having a second turn-on voltage different than the first turn-on voltage. When the first turn-on voltage is applied, a first color is emitted by the first electroluminescent conjugated polymer. Light having a second color is emitted by the second electroluminescent conjugated polymer in response to the second turn-on voltage applied to the first electrode and the second electrode. Additional color emitters can be included, including emitters that emit photons predominately in the visible and/or non-visible range of the photon radiation spectrum. Also, the color emitters can be comprised of other organic or inorganic materials.

In accordance with the present invention, a method is provided for driving a multi-color light emitting device, the multi-color light emitting device is capable of emitting two or more colors in sequence. Each color is emitted in response to a respective different applied turn-on voltage. During an emission cycle, a first turn-on voltage is applied having a duration to the light emitting device so that a first burst of a predominant number of photons of a first color are emitted. A second turn-on voltage is then applied during the emission cycle having a duration and at least one of a magnitude and a polarity different than a magnitude and polarity of the first turn-on voltage. For example, a 5 volt turn-on voltage may cause a predominate emission of red photons, and a 10 volt turn-on voltage may cause a predominate emission of green photons. In response to the second turn-on voltage duration, a second burst of a predominant number of photons of a second color are emitted. In this way, during the emission cycle the first burst and the second burst occur in rapid succession. A human eye and vision system receiving the first burst and the second burst is stimulated to perceive a color that is different than the first color and the second color.

In accordance with another aspect of the present invention, a method is provided for forming a layered organic light active material particulate. This layered organic light active material particulate is mixed with the conductive carrier material and disposed between the electrodes to form the inventive light emitting devices. To form the particulate, a first mixture is formed of a first organic light active component material and a first carrier fluid. A second mixture is formed of a second organic light active component material and a second carrier fluid. A first mist is generated of the first mixture in an environment so that a first particulate of the first organic light active component material is temporarily suspended in the environment. A second mist of the second mixture is generated in the environment so that a second particulate of the second organic light active component material is temporarily suspended in the environment. The first particulate and the second particulate are allowed to commingle and attract together in the environment to form a first layered organic light active material particulate. A charge of opposite polarity can be applied to the constituents in each mist to promote electrical attraction. When the charged particles join together an electrically neutral organic light active particulate is obtained. The layered organic light active particulate has a first layer made up of the first organic light active component material and a second layer made up of the second organic light active component material. Additional layers can be added to the multilayered structure by forming another mixture of another organic light active component material and another carrier fluid and forming yet another mixture of a previously formed layered organic light active material particulate and yet another carrier fluid. The resulting particles are suspended in the environment as described above and allowed to commingle and attract together to form the multilayered particulate structure. This method can be repeated to build up multilayered organic light active material particulate having a range of selectable electrical, optical, mechanical and chemical attributes. Further, depending on the desired particulate characteristics, the constituents of the multilayered structure may be organic and/or inorganic materials. The use of organic and inorganic materials broadens the potential candidates of materials that can be combined to form the multilayered particulate. Further, the inventive method may be applied for making multilayered particles for other applications, such as drug delivery vehicles, electrical circuit components, bi-polar electropheretic microdevices, etc.

The environment in which the particulate is formed can be an inert gas, reactive gas, a vacuum, a liquid or other suitable medium. For example, it may advantageous for the environment to include elements that perform a catalytic function to promote a chemical reaction in or between the constituents in the mists. A characteristic enhancing treatment may be performed on the formed layered organic light active material particulate. The treatment may be a temperature treatment, a chemical treatment, a light energy treatment to cause, for example, light activated cross-linking, or other characteristic enhancing treatment to impart desired attributes to the formed particulate.

In accordance with the present invention, an OLED device includes a first electrode and a second electrode. The second electrode is disposed adjacent to the first electrode so that a gap is defined between them. Unlike the prior art, in accordance with the present invention, thin films of OLED material are not required to be formed. Instead, the present invention utilizes OLED particulate dispersed within a conductive carrier. The OLED particulate is dispersed within the carrier material, which is disposed within the gap between the electrodes. When an electric potential is applied to the electrodes, the electrical energy passes through the carrier material raising the energy state of the OLED particulate, resulting in the emission of light.

In a simple form, the OLED particulate may comprise organic-layered particles, each particle including a hole transport layer and an electron emitter layer. A heterojunction is formed at the interface between the hole transport layer and the electron emitter layer. Each organic-layered particle may also include a blocking layer adjacent to the electron emitter layer and an emissive layer adjacent to the hole transport layer, thereby forming a stacked organic layered structure. The blocking layer is provided for facilitating the injection of electrons and holes, and the emissive layer is provided for facilitating the emission of photons when the energy state of the OLED particulate is raised.

In accordance with an aspect of the present invention, the OLED particulate comprises microcapsules. Each microcapsule includes an internal phase and a shell. The internal phase and/or the shell include the OLED material. The internal phase and/or the shell may also include a field reactive material. Depending on the OLED fabrication method and the desire OLED characteristics, the field reactive material may be an electrostatic material and/or a magnetically reactive material.

As is described further herein, the microcapsule composition may be effective for enabling a "self healing" capability of the fabricated OLED device. In this case, the microcapsule includes a composition that causes the microcapsule to rupture if electrical energy above a threshold is applied to the microcapsule. For example, if a particular microcapsule is aligned so the during use of the OLED device it becomes a short between the electrodes, or if the microcapsule is adjacent to a dust particle or other foreign inclusion, creating such a short, when a electric potential is applied between the electrodes energy exceeding a predetermined threshold will pass through the microcapsule causing the capsule to rupture and disconnect the short. By this construction, the microcapsule is automatically removed from the path of conduction of electrical energy in the event of a short.

In accordance with another aspect of the invention, the microcapsule shell and/or internal phase may include a composition effective to provide a barrier against degradation of the OLED material. The OLED microcapsules are dispersed within a carrier fluid. This carrier fluid also provides a barrier against the intrusion of substances which degrade the OLED material.

The OLED microcapsules can have constituent parts including at least one of hole transport material, electron transport material, field reactive material, solvent material, color material, shell forming material, barrier material, desiccant material, and heat meltable material. The constituent parts form at least one internal phase and at least one shell. The constituent parts are selected so as to have electrical characteristics that result in a preferred path of electrical conduction through the hole transport material and the electron transport material. By this construction, the microcapsule behaves as a pn junction upon application of an electrical potential to the first electrode and the second electrode.

The OLED device can be constructed of suitably chosen materials so that the carrier material is relatively less electrically conductive than the OLED particulate, this ensures that the OLED particulate offers a path of less electrical resistance than the carrier material. Thus, the electric potential applied to the electrodes will pass through the carrier material, which has some electrical conductivity, and through the OLED particulate, which has relatively higher electrical conductivity. In this way, the preferred path of electrical conduction is through the OLED particulate. Likewise, the shell of the OLED microcapsules is relatively less electrically conductive than the OLED material itself, so that the OLED material offers a path of less electrical resistance than the shell.

The typical OLED includes an OLED component that is a hole transport material and an OLED component that is an electron transport material. In accordance with a formulation of the inventive microcapsules, the shell comprises an OLED component material that is either the hole transport material or the electron transport material, and the internal phase of the microcapsule includes the OLED component material that is the other of the hole transport material and the electron transport material. Depending on the desired optical qualities of the fabricated OLED device, the carrier material can be selected so that it has optical properties during use of the OLED device that are transparent, diffusive, absorptive, and/or reflective to light energy. The composition of the OLED particulate can be selected so that the electrical characteristics of the OLED particulate includes, an electro or magneto rheological characteristic. This rheological characteristic is effective for causing the OLED particulate to move within the carrier and orient in response to an applied electrical or magnetic field.

In accordance with another composition of the OLED microcapsule, the internal phase comprises OLED material and a magnetically reactive material disposed within a first shell. An electrolyte and a curable fluid material are disposed surrounding the shell. A second shell encapsulates the first shell, the electrolyte and the curable material. In response to an applied magnetic field, the position of the first shell is changeable relative to the second shell. Upon curing the curable material, the position of the first shell relative to the second shell is locked in place. As is described in detail herein, this microcapsule structure can be used to form capacitor/OLED microcapsules which may be particularly effective for use in passive matrix displays.

In accordance with the present invention, a method for forming an OLED device is provided. A top electrode and a bottom electrode are provided defining a gap there between. Within the gap a field reactive OLED particulate is disposed randomly dispersed within a fluid carrier. An aligning field is applied between the top electrode and the bottom electrode to form a desired orientation of the field reactive OLED particulate within the fluid carrier. The fluid carrier comprises a hardenable material. While the desired orientation of the field reactive OLED particulate is maintained, the carrier is cured to form a hardened support structure within which is locked in position the OLED particulate. The OLED particulate may comprise a dielectric OLED microcapsule. The OLED particulate is formed by the steps of first providing a first particle comprised of a hole transport material. The hole transport material has a net first electrical charge. A second particle comprised of an electron transport material is provided having a net second electrical charge. The first electrical charge is of opposite polarity from the second electrical charge. The first particle and the second particle are brought together to form a unified OLED particulate having a hole transport layer and an electron transport layer forming a heterojunction between them. The first particle may further include a photon-active layer. This photon-active layer may be a light emissive layer in which case the OLED forms a light emitting device, or a light receptive layer, in which case the OLED forms a light detecting device.

The OLED particulate is formed by microencapsulating an internal phase within a shell. The internal phase or the shell includes an OLED material and either the internal phase or the shell includes a field reactive material. The field reactive material comprises either or both an electrostatic and a magnetically reactive material. In accordance with another composition of the inventive microcapsule, the internal phase comprises an OLED emitter material and an OLED hole transport material dispersed in solution. Color dyes may also be included within the internal phase. The solvent may be a fluid organic solvent. In order to provide the alignment capabilities of the microcapsules, either the internal phase or the shell may include a field reactive component.

In accordance with another aspect of the present invention, a stacked OLED device is provided. The inventive OLED device includes a first OLED pixel layer comprised of a first layer electrode: A second layer electrode is disposed adjacent to the first layer electrode. A first layer gap is defined between the electrodes. An OLED particulate is dispersed within a carrier and contained within the first layer gap. At least one subsequent OLED pixel layer is formed over the first OLED pixel layer. Each subsequent OLED pixel layer includes a first subsequent layer electrode. A second subsequent layer electrode is disposed adjacent to the first subsequent layer electrode defining a second layer gap there between. An OLED particulate in a carrier material is disposed between the electrodes.

To achieve a full color OLED display, the OLED particulate of the first OLED pixel layer emits light of a first wavelength range in response to a drive voltage being applied to the first layer electrode and the second layer electrode. Each subsequent OLED pixel layer emits light of a different wavelength range in response to the driving voltage applied to the respective electrode pairs so that an RGB color display can be formed.

Further, a dichromatic pixel layer can be formed adjacent to the last subsequent OLED pixel layer. The dichromatic pixel layer can be formed from a LCD display layer or from a dichromatic microcapsule display layer along the lines described in the U.S. Pat. No. 6,50,687 B1 patent issued to Jacobson, This dichromatic pixel layer, as described fully herein, results in a display that can viewed in direct bright sunlight as well as with improved contrast in indoor ambient lighting conditions. Further, additional subsequent OLED pixel layers can be provided which emit light in additional color range having a color and/or light intensity different from the color and/or light intensity of the other OLED pixel layers.

Further, the inventive OLED device can be configured so as to detect light impinging on a pixel grid formed in accordance with the present invention. In this case, the OLED particulate of a first OLED pixel layer emits a electrical energy in response to the reception of photons and applies the electrical energy as a detectable signal to the first and second layer electrodes. Further, a full color CCD-type camera can be formed by tuning the wavelength range at which subsequent layers of OLED pixels are photo reactive.

BRIEF DESCRIPTION OF THE DRAWINGS

FIG. 22 illustrates step one of an embodiment of the inventive OLED device fabrication method;

FIG. 23 illustrates step two of an embodiment of the inventive OLED device fabrication method;

FIG. 24 illustrates step three of an embodiment of the inventive OLED device fabrication method;

FIG. 76 illustrates a polymer blend organic light active particulate having a field attractive constituent for aligning the particle in an aligning field;

FIG. 77 illustrates composite microcapsules containing multilayered organic light active particles, each having a different light wavelength emission and turn-on voltage;

FIG. 78 illustrates another composite microcapsule containing multilayered organic light active particles, at least one having a field attractive constituent;

FIG. 79 illustrates three light emitting microcapsule species, each species having a turn-on voltage controlled by the internal phase composition and the encapsulating shell composition;

FIG. 86 is a flow chart showing the steps of the inventive method for forming a multilayered organic light active material particulate;

FIG. 91 illustrates a layered organic light active material particulate formed by the commingling of a particle of blocking material with a particle of electron transport material;

FIG. 92 illustrates the inventive method of forming a layered organic light active material particulate from a blocking constituent and an electron transport constituent;

FIG. 103 is a cross section of a coated cathode fiber having a blocking layer formed on the cathode fiber and an electron transport layer formed on the blocking layer;

FIG. 104 is a cross section of a coated anode fiber having a hole transport layer formed on the anode fiber and an emissive layer formed on the hole transport layer;

FIG. 105 illustrated the coated cathode fiber and the coated anode fiber twisted together to form an emissive fiber.

DETAILED DESCRIPTION OF THE INVENTION

Figure 1:
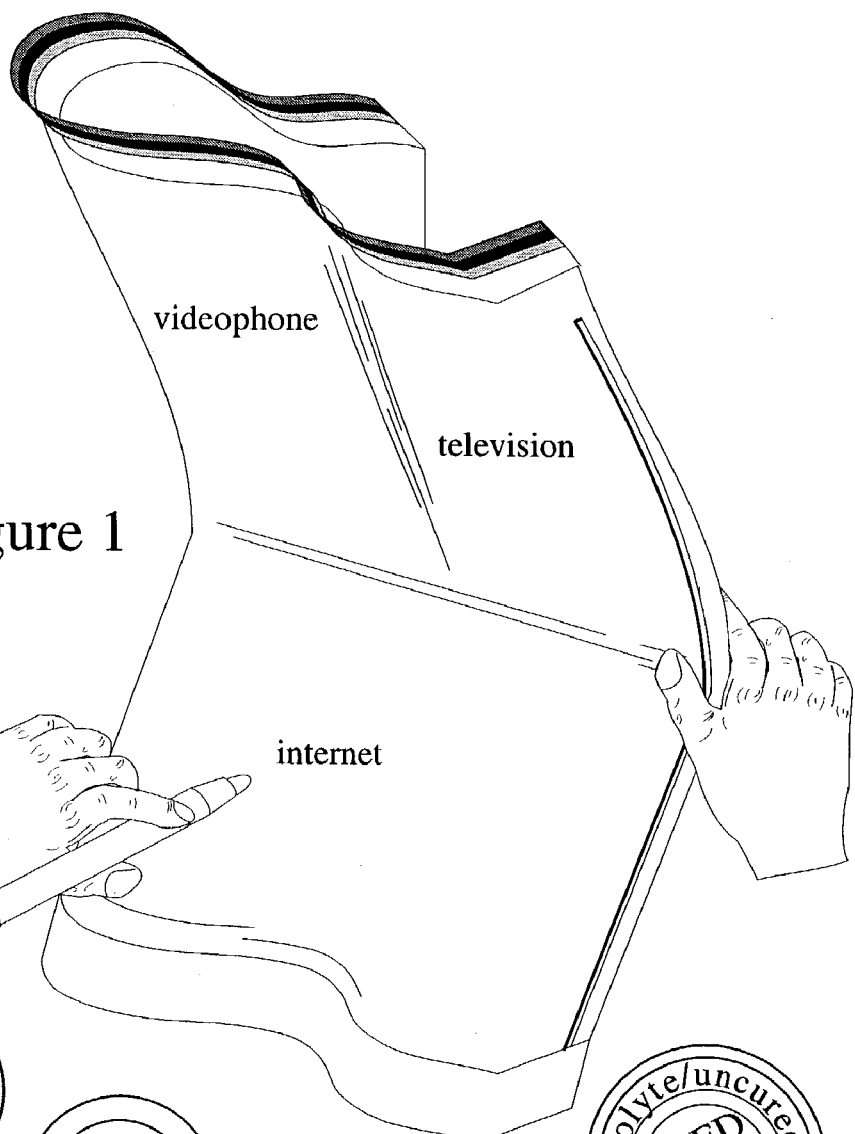
FIG. 1 illustrates an embodiment of the inventive thin, lightweight, flexible, bright wireless display having components capable of being manufactured by the inventive display fabrication method, showing the simultaneous display of mapped hyperlinked content, a videophone stream and a broadcast TV stream.

For purposes of promoting an understanding of the principles of the invention, reference will now be made to the embodiments illustrated in the drawings and specific language will be used to describe the same. It will nevertheless be understood that no limitation of the scope of the invention is thereby intended, there being contemplated such alterations and modifications of the illustrated device, and such further applications of the principles of the invention as disclosed herein, as would normally occur to one skilled in the art to which the invention pertains.

FIG. 1 illustrates an embodiment of the inventive thin, lightweight, flexible, bright wireless display having components capable of being manufactured by the inventive display fabrication method, showing the simultaneous display of mapped hyperlinked content, a videophone stream and a broadcast TV stream. FIG. 1 illustrates an embodiment of an inventive thin, lightweight, flexible, bright, wireless display showing the simultaneous display of three received display signal. The inventive thin, lightweight, flexible, bright, wireless display includes a flexible substrate 24 to provide a support structure upon which components can be manufactured by a fabrication method. As described in the co-owned U.S. patent application Ser. No. 10/234,302, entitled "A Thin, Lightweight, Flexible, Bright, Wireless Display", the disclosure of which is incorporated by reference herein, a unique and effective method for transmitting display information to a single or multiple displays enables such displays to not have to have substantial onboard storage or processing power. In accordance with this aspect of the invention, the energy drain, bulk, weight and cost normally associated with such devices is avoided; and the durability and convenience of the display is increased. Further, as shown schematically in FIG. 1, multiple streams of display information can be simultaneously received and displayed. For example, broadcast video content such as a television program may be shown at a first portion of the display, personalized video content, such as a videophone conversation may be shown at a second portion and a web page, including mapped hyperlink content, may be shown at a third portion. Most of the processing, networking, signal tuning, data storage, etc., etc., that it takes to create such a set of displayed content streams is not performed by the inventive wireless display. Other devices, such as a centralized computer, A/V or gateway device perform these functions thus allowing the opportunity for the inventive display to have tremendous mobility and convenience.

FIG. 1 illustrates an embodiment of the inventive thin, lightweight, flexible, bright wireless display having components capable of being manufactured by the inventive fabrication method, showing the simultaneous display of mapped hyperlinked content, a videophone stream and a broadcast TV stream. In accordance with the present invention, a thin, lightweight, flexible, bright wireless display is obtained having components capable of being manufactured by the inventive fabrication method. The present invention enables a low cost, flexible, robust, full color video display to be obtained. This wireless display is capable of receiving multiple display information signals and displaying the simultaneous screens of the received display information in re-configurable formats. A relatively simple signal receiving and processing circuit, using, for example, a digital signal processor such as those available from Texas Instruments, Texas or Oxford Microdevices, Connecticut, enables multiple video and still image screens to be displayed. An inventive manufacturing method described herein and in the co-owned patent application entitled "Printer and Method for Manufacturing Electronic Circuits and Displays" (incorporated by reference herein) enables the inventive wireless display to be fabricated at low cost and with the advantageous features described herein. As described in more detail herein, a flexible substrate 24 provides a support structure upon which components can be manufactured by a fabrication method. A display stratum includes light emitting pixels for displaying information. The light emitting pixels are formed, by printing a pixel layer of light-emitting conductive polymer. An electronic circuit stratum includes signal transmitting components for transmitting user input signals to a display signal generating device for controlling display information transmitted from the display signal generating device. Signal receiving components receive the display information transmitted from the display signal-generating device. Display driving components drive the display layer according to the received display information. A user input stratum receives user input and generates the user input signals. A battery stratum provides electrical energy to the electronic circuit stratum, the user input stratum and display stratum components. The signal receiving components may include first radio frequency receiving components for receiving a first display signal having first display information carried on a first radio frequency and second radio frequency receiving components for receiving a second display signal having second display information carried on a second radio frequency. The display driving components may include signal processor components for receiving the first display signal and the second display signal and generating a display driving signal for simultaneously displaying the first display information at a first location on the display stratum and the second display information at a second location on the display stratum. At least some of the components in the battery, display, user input and electronic circuit stratums are formed by printing electrically active material to form circuit elements including resistors, capacitors, inductors, antennas, conductors and semiconductor devices.

The inventive thin, lightweight, wireless display includes OLAM fabrication, such as that described herein. In accordance with the present invention, microcapsule 10 particulate are randomly dispersed within a monomer carrier fluid 12 that is injected or otherwise disposed between two electrodes 14. The term particulate can refer to particles of material or microcapsules 10. The microcapsules 10 may include additives that impart rheological properties. The microcapsules 10 form chains between the electrodes 14 when a voltage is applied. Holding the voltage to keep the chains formed, the carrier fluid 12 is polymerized and the OLAM microcapsule chains locked into alignment between the electrodes 14. The thus formed OLAM pixels emit light (or detect or convert light into electricity). The problem of contamination of the OLAM material is the major factor limiting the display life span, and thus is a bar to commercial success. The inventive fabrication method results in the corrosion sensitive OLAM material being protected by the microcapsule shell and the cured carrier 12. The pixel alignment is automatic, since the microcapsule chains are formed only between the electrodes 14. This pixel array structure also greatly limits cross talk between pixels and the optical properties of the cured monomer can be controlled to improve contrast, display brightness, transparency, etc.

Solar cell components or layers can be used to "recycle" the energy emitted by the OLED emitters. Some of the emitted and ambient light energy impinges on the solar cells and generate electricity. This, along with the inventions described herein and the sheet battery described in the above-referenced co-owned Patent Applicant entitled "Printer and Method for Manufacturing Electronic Circuits and Displays", can enable lightweight, relatively inexpensive, dichromatic newspapers (as described herein in FIG. 1) that recharge in sunlight (or even indoor ambient light) to enable full-color emissive video display.

Figure 2:
FIG. 2 illustrates a particle of OLED material for being dispersed in a carrier fluid in accordance with the inventive display fabrication method.

FIG. 2 illustrates a particle of OLED material for being dispersed in a carrier fluid 12 in accordance with the inventive display fabrication method. A typical OLED organic stack consists of a layer of hole transport material and a layer of electron transport material. In the conventional art, these layers are formed by spin coating, vacuum deposition or ink-jet printing. In accordance with the present invention, the OLED material is provided as particulate dispersed within a carrier 12 material. The carrier 12 material with the dispersed particulate is disposed between electrodes 14. Electrical potential applied to the electrodes 14 causes light emission to occur within the OLED particulate. In accordance with the present invention, the OLED phenomenon can be used to create general or specialty lighting devices, monochrome or color displays, stereoscopic vision aids, digital maps and newspapers, advanced vehicle windshields and the like. Also, the particulate can be organic light active material ("OLAM™") that is capable of generating a flow of electrons in response to impinging light energy. This phenomenon can be used to create photodetectors, cameras, solar cells and the like. In this application, where appropriate, the term OLED can mean a light emissive or a light detective material configuration.

Figure 3:
FIG. 3 illustrates an inventive microcapsule comprised of an internal phase of OLED material encapsulated within a polymer shell.

FIG. 3 illustrates an inventive microcapsule 10 comprised of an internal phase of OLAM material encapsulated within a polymer shell. To create a path of least resistance through the OLED material, the shell composition is selected to be less conductive than the OLED material.

Figure 4:
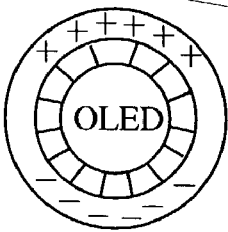
FIG. 4 illustrates an inventive dielectric microcapsule comprised of an internal phase of OLED material encapsulated within a polymer shell.

FIG. 4 illustrates an inventive electrostatically active microcapsule comprised of an internal phase of OLED material encapsulated within a polymer shell. The shell is composed of a material that can be oriented by the application of an electric field. The electrical properties of the shell enable the microcapsules 10 to be aligned into a desired formation within a fluid carrier 12 in response to an applied electric field.

Figure 5:
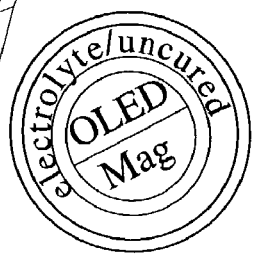
FIG. 5 illustrates an inventive microcapsule comprised of a first microcapsule including an internal phase of OLED material and magnetic material, along with a mixture of electrolyte and uncured monomer, all encapsulated within a polymer shell.

FIG. 5 illustrates an inventive microcapsule 10 comprised of a first microcapsule 10 including an internal phase of OLED material and magnetic material, along with a mixture of electrolyte and uncured monomer, all encapsulated within a polymer shell. The magnetic properties of the magnetic material enable the microcapsules 10 to be aligned into a desired formation within a fluid carrier 12 in response to an applied magnetic field.

Figure 6:
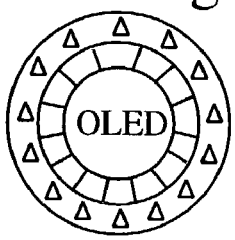
FIG. 6 illustrates an inventive microcapsule comprised of an internal phase of OLED material encapsulated within a double-wall shell, each wall having a composition selected for imparting a desired electrical, optical, magnetic and/or mechanical property to the microcapsule.

FIG. 6 illustrates an inventive microcapsule 10 comprised of an internal phase of OLED material encapsulated within a double-wall shell, each wall having a composition selected for imparting a desired electrical, optical, magnetic and/or mechanical property to the microcapsule. In accordance with the present invention, the OLED particulate comprises microcapsules 10. For example, the microcapsule 10 includes an internal phase and a shell that is composed of material selected according to a desired combination of electrical, mechanical, optical and magnetic properties. The internal phase and/or the shell may include the OLED material. The internal phase and/or the shell may also include a field reactive material. Depending on the OLED fabrication method and the desire OLED characteristics, the field reactive material may be an electrostatic material and/or a magnetically reactive material. The microcapsule 10 composition may be effective for enabling a "self healing" capability of the fabricated OLED device. In this case, the microcapsule 10 includes a composition that causes the microcapsule 10 to rupture if electrical energy above a threshold is applied to the microcapsule. A heat meltable material that heats up when electrical energy above a threshold is applied can be incorporated as the microcapsule shell. For example, if a particular microcapsule 10 ends up positioned so that during use of the OLED device it becomes a short between the electrodes 14, or if the microcapsule 10 is adjacent to a dust particle or other foreign inclusion, creating such a short, when an electric potential is applied between the electrodes 14, energy exceeding a predetermined threshold will pass through the microcapsule 10 causing the capsule to rupture and disconnect the short. By this construction, the microcapsule 10 is automatically removed from the path of conduction of electrical energy in the event of a short.

Figure 7:
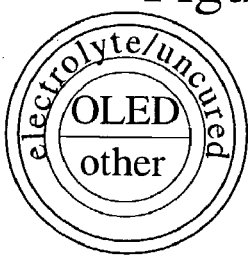
FIG. 7 illustrates an inventive microcapsule comprised of an internal phase consisting of a mixture of OLED material with other components so as to tailor the electrical, optical, magnetic and/or mechanical property of the microcapsule.

FIG. 7 illustrates an inventive microcapsule 10 comprised of an internal phase consisting of a mixture of OLED material with other components so as to tailor the electrical, optical, magnetic and/or mechanical property of the microcapsule. The other components can be field reactive, such as magnetic or electrostatically reactive materials for imparting orientation and aligning properties. Heat expandable materials can be included to provide the microcapsule 10 with the ability to burst in response to an electrical short to disconnect the microcapsule 10 and overcome the electrical short. Colorants, such as dyes and colored particles can be included to tune the light emitted from the microcapsule. Desiccant material can be included to provide protection against contamination of the OLED material.

Figure 8:
FIG. 8 illustrates an inventive microcapsule comprised of a first microcapsule including an internal phase comprised of an OLED material, and a corrosion barrier material, all encapsulated within a polymer shell.

FIG. 8 illustrates an inventive microcapsule 10 comprised of a first microcapsule 10 including an internal phase comprised of an OLED material, and a corrosion barrier material, all encapsulated within a polymer shell. In accordance with this aspect of the invention, the microcapsule shell and/or internal phase may include a composition effective to provide a barrier against degradation of the OLED material. The OLED microcapsules 10 are dispersed within a carrier fluid 12. This carrier fluid 12 also provides a barrier against the intrusion of substances which degrade the OLED material.

Figure 9:
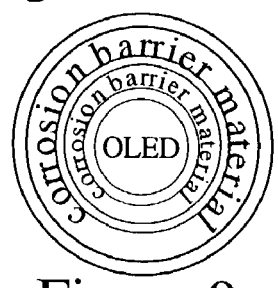
FIG. 9 illustrates an inventive microcapsule comprised of a multi-walled microcapsule structure wherein layers of corrosion barrier material are encapsulated within polymer shells with an internal phase of OLED material.

FIG. 9 illustrates an inventive microcapsule 10 comprised of a multi-walled microcapsule 10 structure wherein layers of corrosion barrier material are encapsulated within polymer shells with an internal phase of OLED material. As in the microcapsule 10 shown in FIG. 7, within the shell of the microcapsule 10 other components can be included that are field reactive, such as magnetic or electro-statically reactive materials for imparting orientation and aligning properties. Heat expandable materials can be included to provide the microcapsule 10 with the ability to burst in response to an electrical short to disconnect the microcapsule 10 and overcome the electrical short. Colorants, such as dyes and colored particles can be included to tune the light emitted from the microcapsule. Desiccant material can be included to provide protection against contamination of the OLED material.

Figure 10:
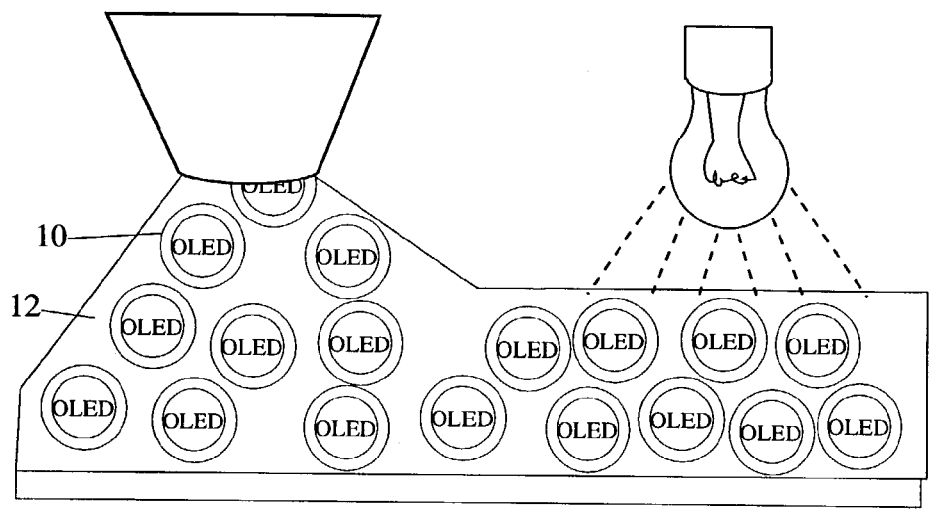
FIG. 10 illustrates an inkjet-type or other nozzle fabrication method for forming a layer of OLED microcapsules dispersed within a light curable monomer carrier.

FIG. 10 illustrates an inkjet-type or other nozzle 36 fabrication method for forming a layer of OLED microcapsules 10 dispersed within a light curable monomer carrier 12. OLED microcapsules 10 dispersed in an uncured monomer carrier fluid 12 can be utilized with inkjet printing technology to create a film of OLED microcapsules 10 contained with flexible cured monomer. The inkjet-type or other nozzle fabrication technique can be utilized to form controlled OLED deposition, with the OLED contained within a curable carrier 12. As is described elsewhere herein, desiccant particulate can be included within the carrier 12 to enhance the protection of the OLED material.

Figure 11:
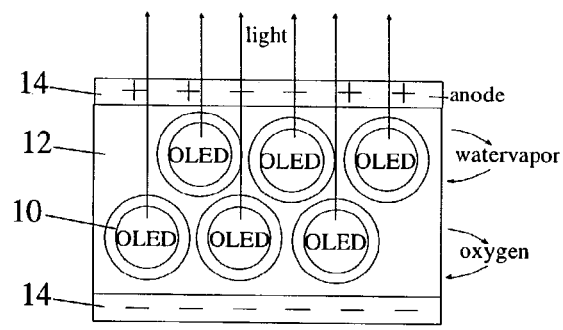
FIG. 11 illustrates a layer of OLED microcapsules fixed within a cured monomer barrier disposed between a top electrode and a bottom electrode.

FIG. 11 illustrates a layer of OLED microcapsules 10 fixed within a cured monomer barrier disposed between a top electrode 14 and a bottom electrode 14. The cured monomer and the shell of the microcapsules 10 provide a barrier to contamination from water vapor and oxygen. The OLED device can be constructed of suitably chosen materials so that the carrier 12 material is relatively less electrically conductive than the OLED particulate, this ensures that the OLED particulate offers a path of less electrical resistance than the carrier 12 material. Thus, the electric potential applied to the electrodes 14 will pass through the carrier 12 material, which has some electrical conductivity, and through the OLED particulate, which has relatively higher electrical conductivity. In this way, the preferred path of electrical conduction is through the OLED particulate. Likewise, the shell of the OLED microcapsules 10 is relatively less electrically conductive than the OLED material itself, so that the OLED material offers a path of less electrical resistance than the shell. Field-attractive microcapsules 10 containing OLED material randomly dispersed within a monomer carrier fluid 12 are injected or otherwise disposed between two electrodes 14. The microcapsules 10 may include additives that impart electro or magneto rheological-type properties. When used for a pixilated display layer, the microcapsules 10 form chains between the electrodes 14 when a aligning field is applied. Holding the aligning field to keep the chains formed, the carrier fluid 12 is polymerized and the OLED microcapsule chains are locked into alignment between the electrodes 14.

The problem of contamination of the OLED material is the major factor limiting the display life span, and thus is a bar to commercial success. The inventive fabrication method results in the corrosion sensitive OLED material being protected by the microcapsule shell and the cured carrier 12, and the pixel alignment is automatic, since the microcapsule chains are formed only between the electrodes 14 or where the aligning field is applied. This pixel array structure also greatly limits cross talk between pixels and the optical properties of the cured carrier 12 can be controlled to improve contrast, display brightness, transparency, etc. The OLED particulate in a carrier 12 disposed between two or more electrodes 14 can be utilized to create roll-to-roll sheets of displays or lights, used as "filament" in a light bulb, used to form solar cells, solar cell housing shingles, light detectors, cameras, vision aides, heads-up display windshields and the like. This OLAM construction can even be formed as fibers for light emitting flooring, wall coverings, specialty lighting, clothing, shoes, building materials, furniture, etc.

Figure 12:
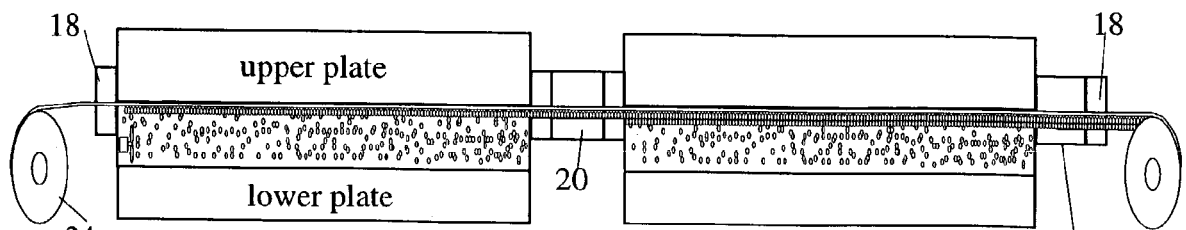
FIG. 12 illustrates sealed fabrication stations for forming a barrier protected OLED microcapsule display stratum.

FIG. 12 illustrates sealed fabrication stations 22 for forming a barrier protected OLED microcapsule 10 display stratum. The microcapsules 10 are dispersed in a carrier fluid 12. The upper and lower plate 16s, control the intensity of the attraction toward the flexible substrate 24 and sheet electrode 14. Seals 18 keep out water and air, using a vacuum airlock. The curing station 20 cures the carrier fluid 12 into a flexible water and oxygen barrier. The microcapsules 10 can be for forming emitters, detectors, various electronic circuit elements (as described in the referenced co-owned patent application). The microcapsules 10 may also be for adding other mechanical (structure, expansive, meltable, desiccant, etc.), optical (reflective, diffusive, opaque, colorant, etc.), electrical (conductive, resistive, semi-conductive, insulative, etc.). The upper and lower plate 16s are controlled to vary the attractive and/or aligning field and create controlled accumulations and alignments of the microcapsules 10. The viscosity of the fluid can also be controlled to control the accumulations of microcapsules 10 (for three-dimensional buildup, control spread of pixels, etc.). As an example, lower viscosity carrier fluid 12 with an agitator may be preferred. There can be, for example, two simultaneously applied aligning fields, magnetic and electrostatic. A mix of microcapsules 10 can be dispersed, (e.g., magnetically and conductive OLED microcapsules 10 and electrostatically conductive insulators for creating a more controllable path of least resistance).

Figure 13:
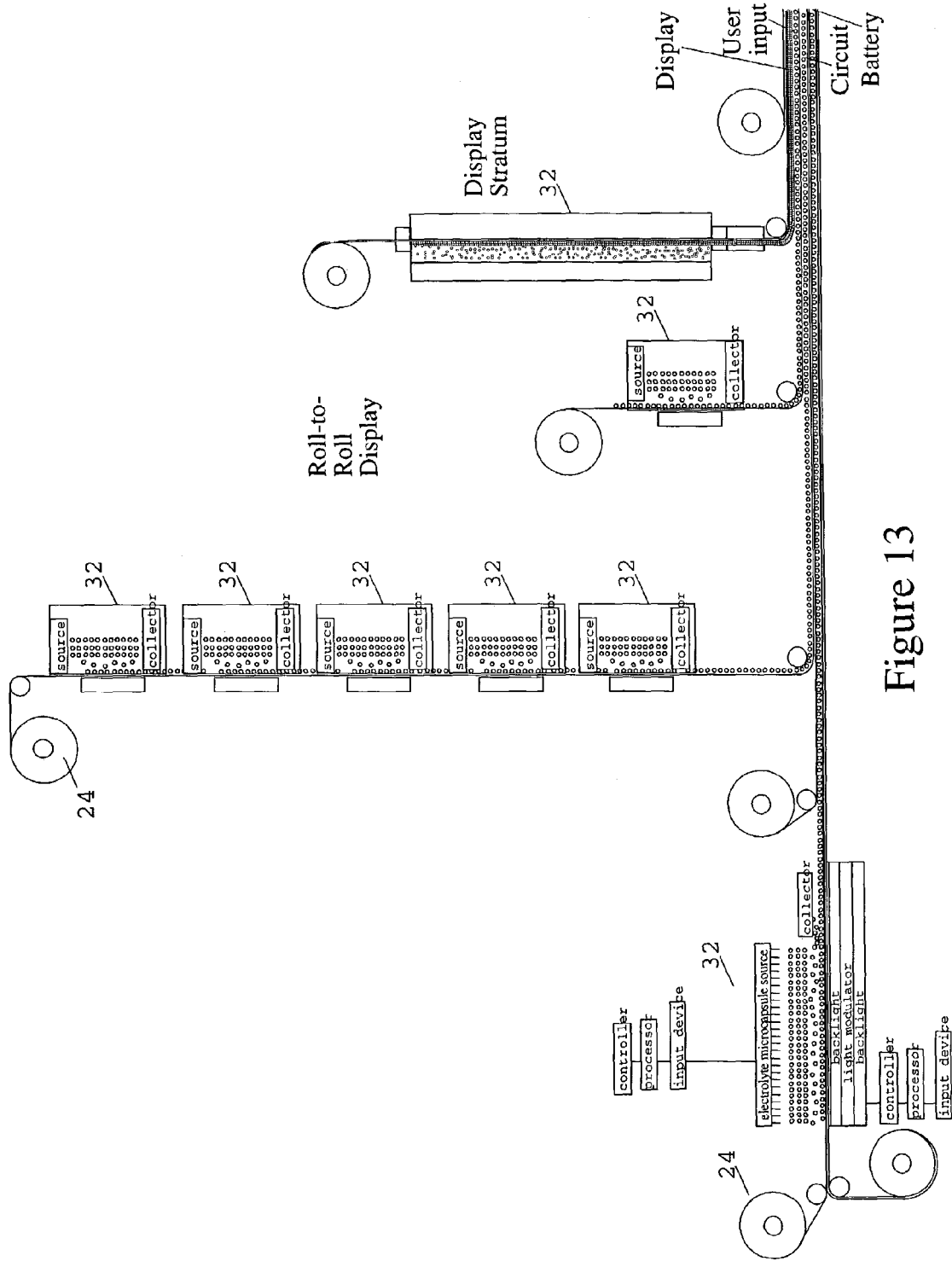
FIG. 13 illustrates an inventive display fabrication line using modular printers for forming various stratum of a thin, lightweight, flexible wireless display.

FIG. 13 illustrates an inventive display fabrication line using modular printers for forming various stratum of a thin, lightweight, flexible wireless display. Display fabrication line uses mix of different fabrication stations 22. Examples of fabrication stations 22 can be found in co-owned U.S. patent application Ser. No. 10/234,301 entitled "Printer and Method for Manufacturing Electronic Circuits and Displays". The various layers of a display include battery, electronic circuit, user input and display stratums are formed at different fabrication stations 22. In accordance with the present invention, fabrication stations 22 for forming an OLED light emissive device is provided. A top electrode 14 and a bottom electrode 14 define a gap there between. Disposed within the gap, field reactive OLED particulates are randomly dispersed within a fluid carrier 12. Depending on the device being fabricated, an aligning field may be applied between the top electrode 14 and the bottom electrode 14 to form a desired orientation of the field reactive OLED particulate within the fluid carrier 12 between the top electrode 14 and the bottom electrode 14. The carrier 12 comprises a hardenable material, such as a light-curable liquid monomer. The carrier 12 is cured to form a hardened carrier 12 for maintaining the desired orientation of the field reactive OLED particulate within the hardened carrier 12. The OLED particulate may comprise a dielectric OLED microcapsule 10 or other OLED-based structure that is capable of forming chains between the electrodes 14.

Depending on the quality of the barrier created by the inventive fabrication method, there may be no need for additional barrier layers 30 other than substrates 24 since cured carrier 12 and microcapsule shells protect OLED material from water vapor and oxygen. Alternatively, addition barrier layers 30, including monomer, polymer, ceramic or thin metal layers can be included in the structure as needed to protect the OLED material from contamination.

Each color layer can be built on the previous by fabrication method. The conductors 26 that make up the pixel electrodes 14 can also be used to fabricate the OLED microcapsule 10 structure. In this case the substrate 24 and pixel electrode 14 grid become integral parts of the completed OLED device. Further, the electric field created by applying voltage to the electrodes 14 can be used to align the OLED microcapsules 10 in chains as shown elsewhere herein. The mechanism for this alignment is similar to the phenomenon that causes electro-rheological fluids to form chains within a carrier fluid 12. In this case, the OLED microcapsule 10 or the OLED particle itself includes the appropriate material component that enables the electro-rheological effect. In addition, or alternatively, magnetic material can be employed with a magnetic field being applied as the aligning field. The light emitted from the OLED material when energized by the applied voltage can be used cure the monomer surrounding the microcapsules 10. Thus, the voltage applied to the electrodes 14 during device fabrication are utilized to form the pixel orientation and simultaneously cure the barrier material.

Figure 14:
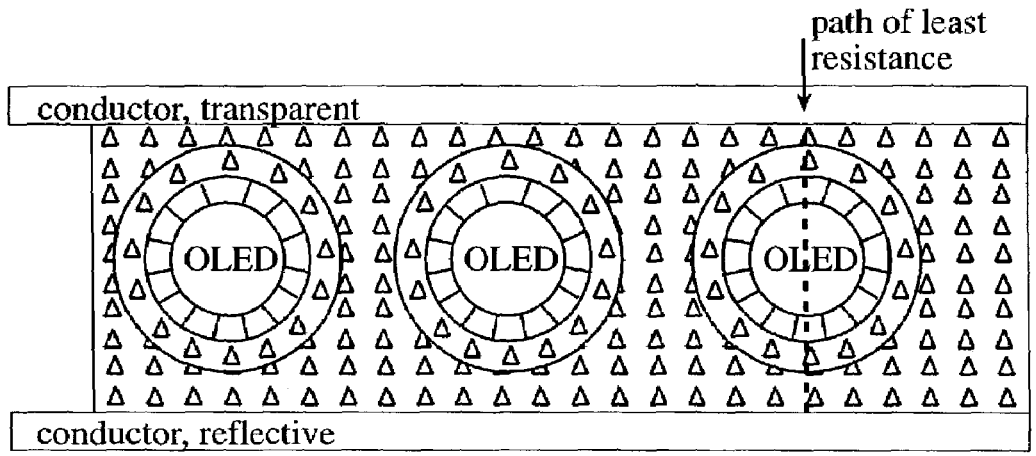
FIG. 14 illustrates a highly organized OLED microcapsule structure formed in accordance with the inventive OLED device fabrication method.

FIG. 14 illustrates a highly organized OLED microcapsule 10 structure formed in accordance with the inventive OLED device fabrication method. Pixels can be controlled down to the microcapsule 10 size, spaced apart as needed. The conductive shell having a semi-insulative or semi-conductive electrical property. The insulative or semiconductor shell creates a preferred path for the electron movement. By controlling the conductivity of the cured carrier fluid 12, the preferred path can be more pronounced through the OLED material.

Figure 15:
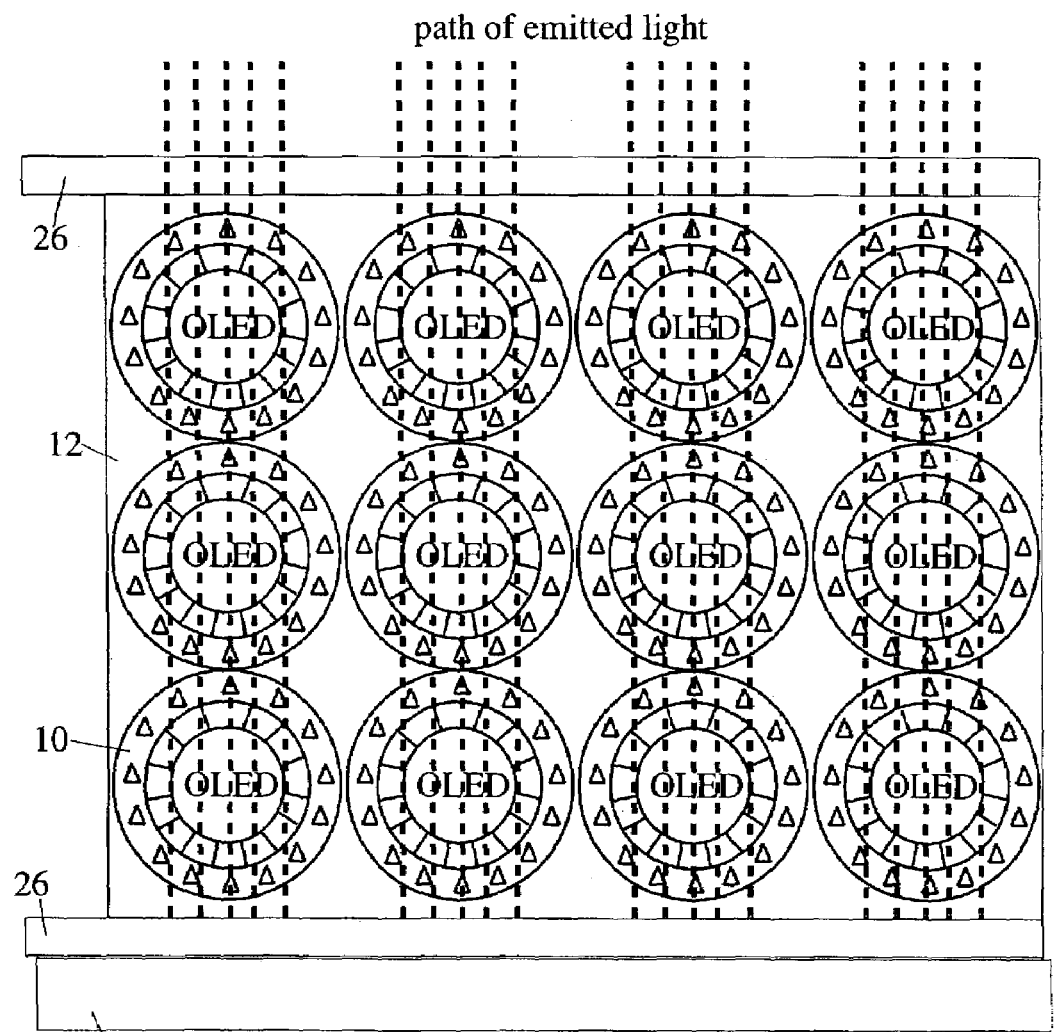
FIG. 15 illustrates a chain structure of OLED microcapsules formed in accordance with the inventive OLED device fabrication method.

FIG. 15 illustrates a chain structure of OLED microcapsules 10 formed in accordance with the inventive OLED device fabrication method. Chains of microcapsules 10 can be formed encased in opaque cured carrier 12, creating more intense light and defined pixels, or the carrier 12 can be an optical diffusion layer to create a mixing of light from adjacent pixels. In accordance with the present invention, an OLED device includes a first electrode 14 and a second electrode 14. The second electrode 14 is disposed adjacent to the first electrode 14 so that a gap is defined between them. An OLED particulate is dispersed within a carrier 12 material, which is disposed within the gap. When an electric potential is applied to the electrodes 14, the electrical energy passes through the carrier 12 material raising the energy state of the OLED particulate, resulting in the emission of light. The typical OLED includes an OLED component that is a hole transport material and an OLED component that is an electron transport material. In accordance with a formulation of the inventive microcapsules 10, the shell comprises an OLED component material that is either the hole transport material or the electron transport material, and the internal phase of the microcapsule 10 includes the OLED component material that is the other of the hole transport material or the electron transport material. Depending on the desired optical qualities of the fabricated OLED device, the carrier 12 material can be selected so that it has optical properties during use of the OLED device that are transparent, diffusive, absorptive, and/or reflective to light energy.

Figure 16:
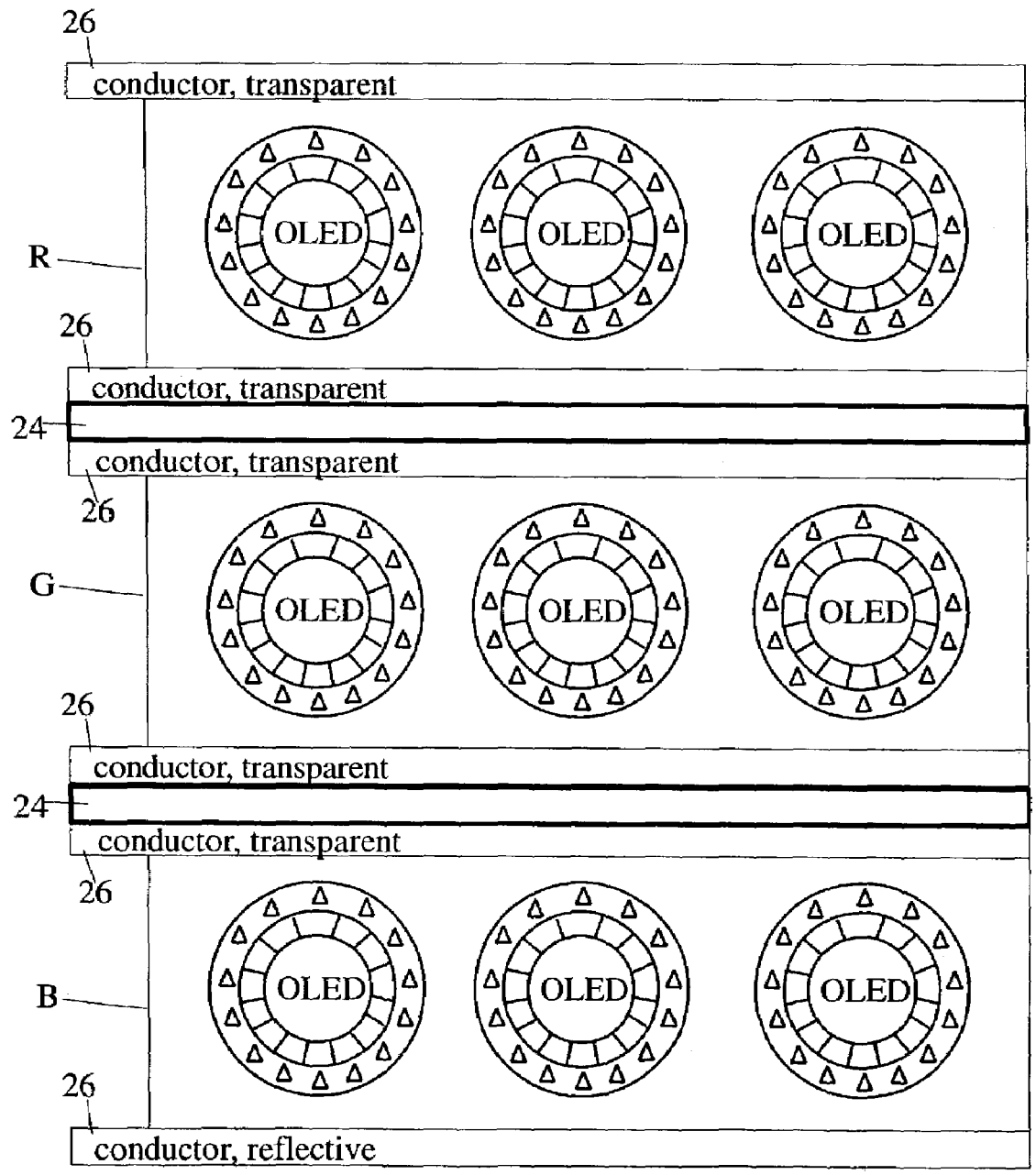
FIG. 16 illustrates a full color OLED display formed in accordance with the inventive OLED device fabrication method.

FIG. 16 illustrates a full color OLED display formed in accordance with the inventive OLED device fabrication method. The inventive microcapsule 10 fabrication is used to create a full color emissive display. Pixels can be controlled down to the microcapsule 10 size, spaced apart as needed. The conductive shell can have a semi-conductive, conductive or an insulative over shell. The composition creates a preferred path for the electron movement. By controlling the conductivity of the cured carrier fluid 12, the preferred path can be more pronounced. The inventive OLED device includes a first OLED pixel layer comprised of a first layer electrode 14. A second layer electrode 14 is disposed adjacent to the first layer electrode 14. A first layer gap is defined between the electrodes 14. An OLED particulate is dispersed within a carrier 12 and contained within the first layer gap. At least one subsequent OLED pixel layer is formed over the first OLED pixel layer. Each subsequent OLED pixel layer includes a first subsequent layer electrode 14. A second subsequent layer electrode 14 is disposed adjacent to the first subsequent layer electrode 14 defining a second layer gap there between. An OLED particulate in a carrier 12 material is disposed between the electrodes 14. To achieve a full color OLED display, the OLED particulate of the first OLED pixel layer emits light of a first wavelength range in response to a drive voltage being applied to the first layer electrode 14 and the second layer electrode 14. Each subsequent OLED pixel layer emits light of a different wavelength range in response to the driving voltage applied to the respective electrode 14 pairs so that an RGB color display can be formed.

Figure 17:
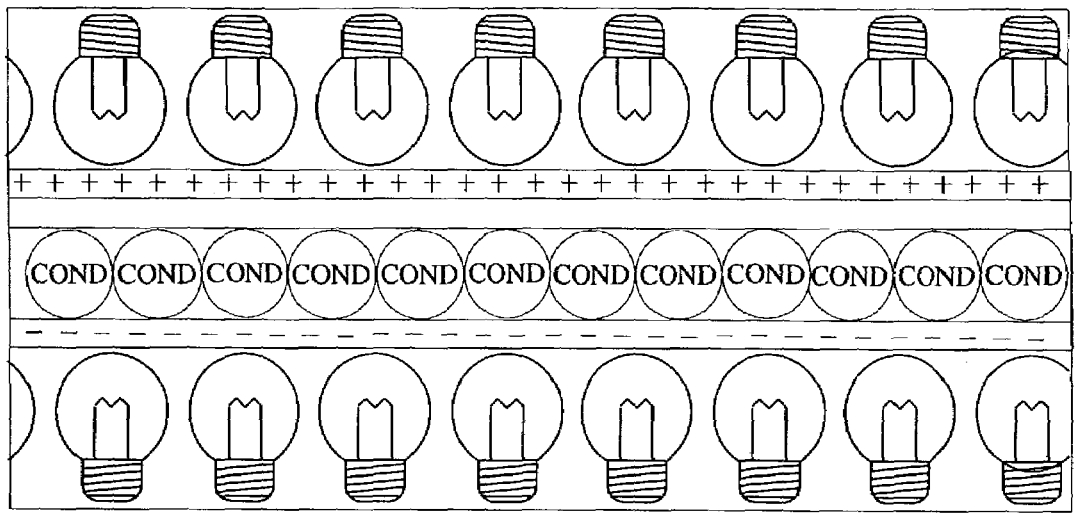
FIG. 17 illustrates a layer of conductive microcapsules for forming an electrode layer in accordance with the inventive device fabrication method.

FIG. 17 illustrates a layer of conductive microcapsules 10 for forming an electrode 14 layer in accordance with the inventive device fabrication method. The buildup of microcapsule 10 layers may occur in successive fabrication steps. The conductor 26 may be microencapsulated, or just a field attractive material. For example, a ferrous metal powder can be magnetically attracted to form one or more of the conductors. The OLED microcapsule 10 can be electrostatic or magnetically attractive. The carrier 12 substrate 24 has to pass the applied field. The carrier fluid 12 is heat or light hardenable by light emitted from a curing light source 28 to lock the microcapsules 10 in place. Alternatively, the carrier fluid 12 can be a plastic material capable of being injection molded, or a multi-part mixture such as an epoxy, a conductive powder and a hardener.

Figure 18:
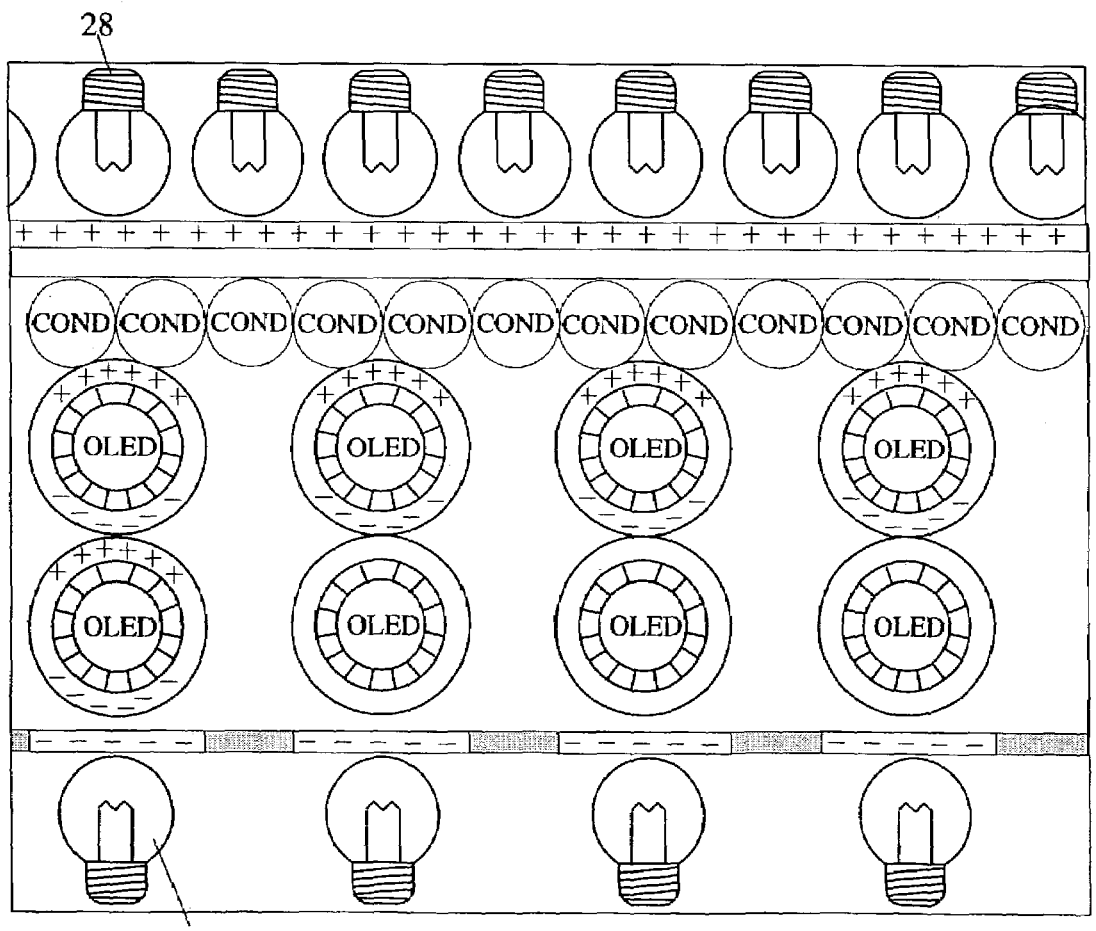
FIG. 18 illustrates the formation of OLED microcapsule chains formed on an electrode layer.

FIG. 18 illustrates the formation of OLED microcapsule chains formed on an electrode 14 layer. Conductive pixels can be etched into optomagnetic or optoelectric coating to improve resolution. Or the location of the pixel that is energized can be controlled by light or laser pulse or other mechanism. The light curable polymer can be cured to a desired depth to capture the microcapsules 10 that have been attracted, and thus lock in, for example, a microcapsule chain having a desired length.

Figure 19:
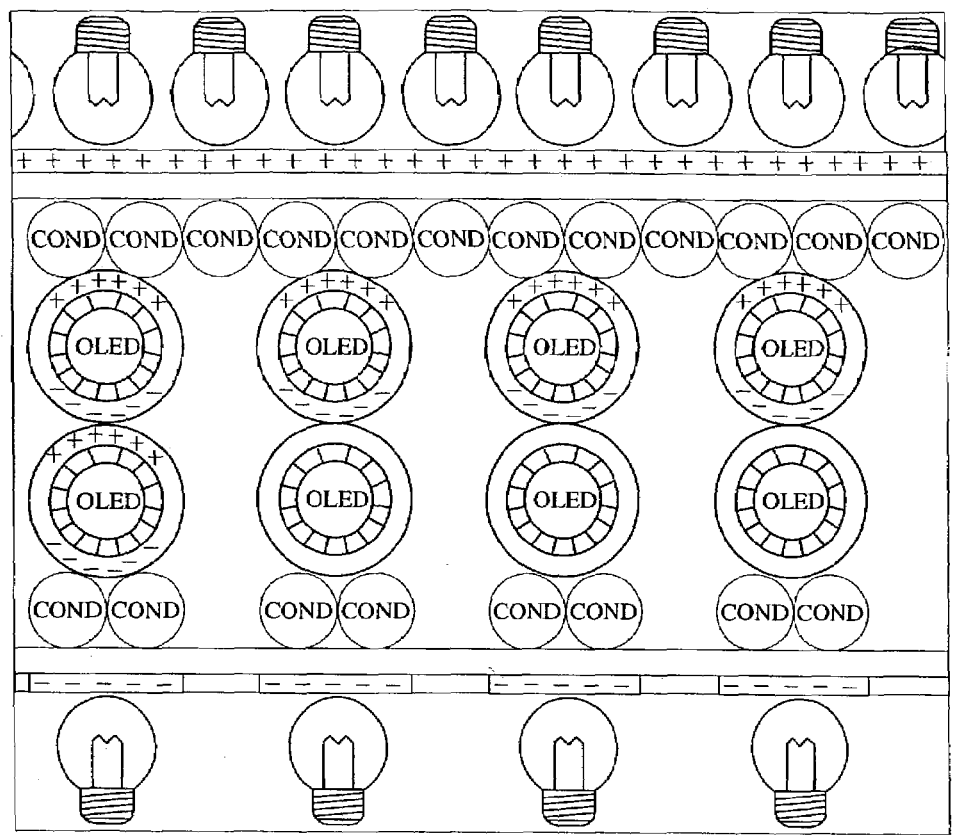
FIG. 19 illustrates the formation of OLED microcapsule chains formed between top and bottom electrode layers.

FIG. 19 illustrates the formation of OLED microcapsule chains formed between top and bottom electrode layers. The electrodes 14 can be formed in previous fabrication steps, and may be attracted by a mechanism other than the mechanism that orients the OLED particulate.

Figure 20:
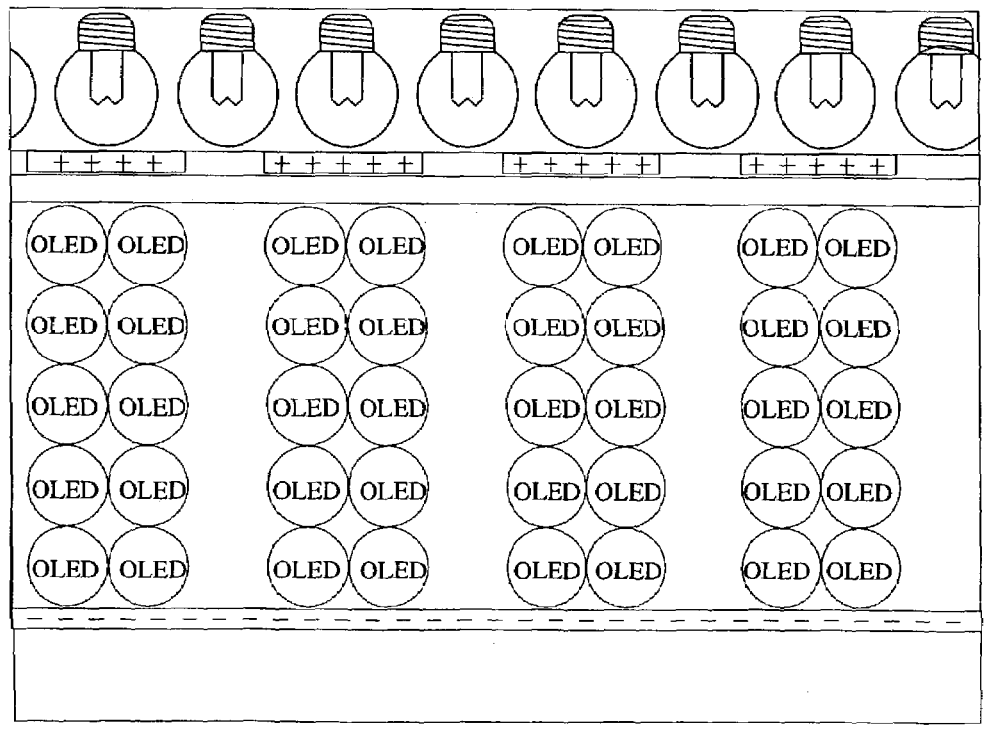
FIG. 20 illustrates the formation of OLED microcapsule chains within a cured carrier for forming a corrosion barrier.

FIG. 20 illustrates the formation of OLED microcapsule chains within a cured carrier 12 for forming a corrosion barrier. The substrate 24 upon which the microcapsules 10 are printed may be a multi-layered composition of polymer, cured monomer, ceramic and fiber, such as glass, creating a durable, flexible substrate 24 that is also a barrier to corrosion for the OLED (as is the microcapsule shell and the cured carrier fluid 12). The conductors 26 that make up the pixel electrodes 14 can also be used to apply the aligning field used to fabricate the OLED microcapsule 10 structure.

Figure 21:
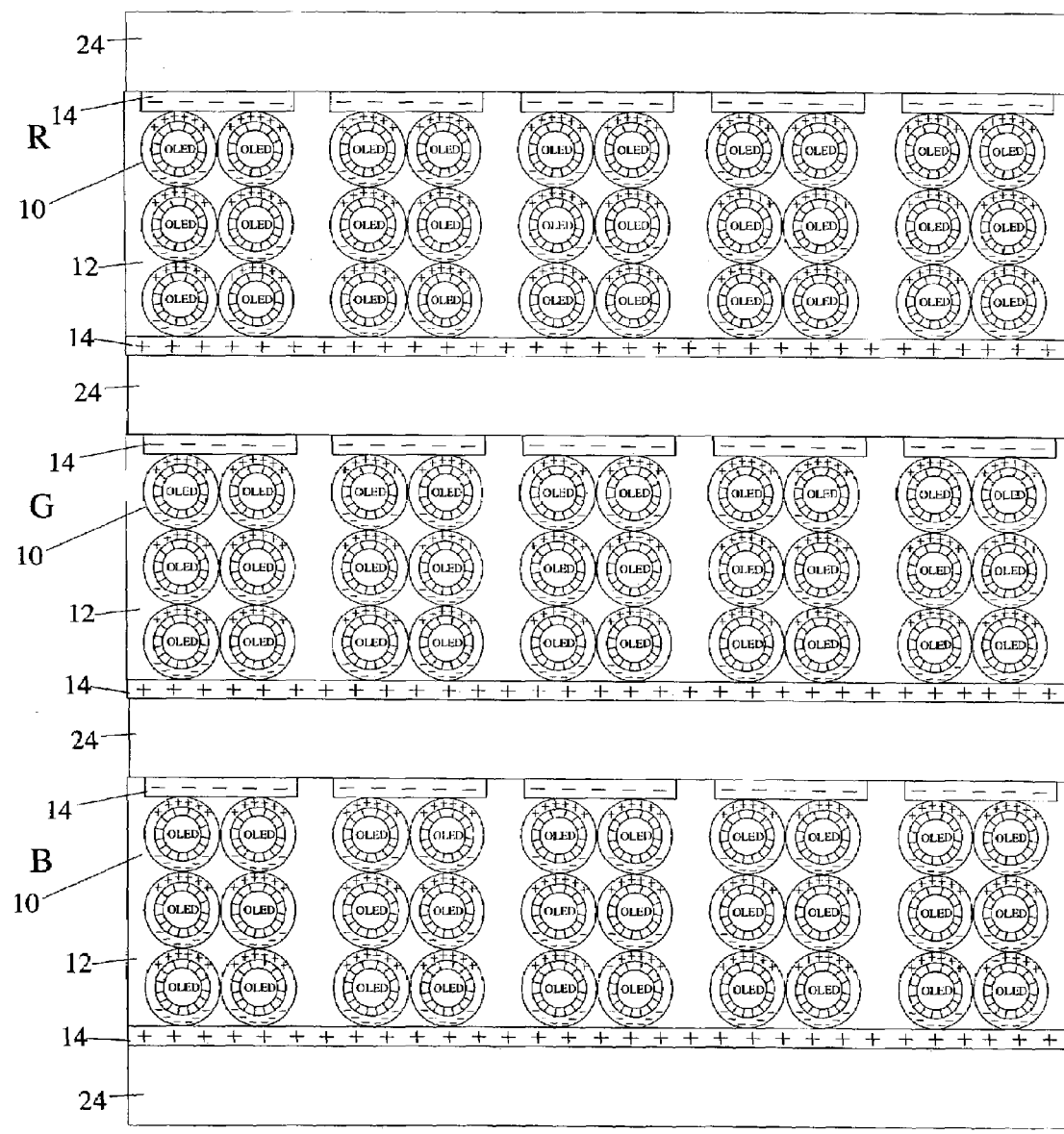
FIG. 21 illustrates a full color display formed in accordance with the inventive OLED device fabrication method.

FIG. 21 illustrates a full color display formed in accordance with the inventive OLED device fabrication method. Depending on the quality of the barrier created by the inventive fabrication method, there may be no need for additional barrier layers 30 other than substrates 24 since cured carrier 12 and microcapsule shells protect the OLED material from water vapor and oxygen. Alternatively, additional barrier layers 30, including monomer, polymer, ceramic, fiber, desiccant and/or thin metal layers can be included in the structure as needed to protect the OLED material from contamination. Each color layer can be built on the previous, by a fabrication station. The conductors 26 that make up the pixel electrodes 14 can also be used to fabricate the OLED microcapsule structure. In this case, the substrate 24 and pixel electrode grid become integral parts of the completed OLED device. The electric field created by applying voltage to the electrodes 14 can be used to align the OLED microcapsules 10 in chains as shown elsewhere herein. The mechanism for this alignment is similar to the phenomenon that causes electro-rheological fluids to form chains within a carrier fluid 12. In this case, the OLED microcapsule 10 or the OLED particle itself includes the appropriate material component that enables the rheological effect (i.e., the movement of the OLED particulate within the carrier). In addition, or alternatively, magnetic material can be used with a magnetic field being applied as the aligning field. The light emitted from the OLED material when energized by the applied driving voltage can be used to cure the monomer surrounding the microcapsules 10. Thus, the voltage applied to the electrodes 14 during device fabrication can be utilized to form the pixel orientation and simultaneously cure the barrier material.

Figure 25:
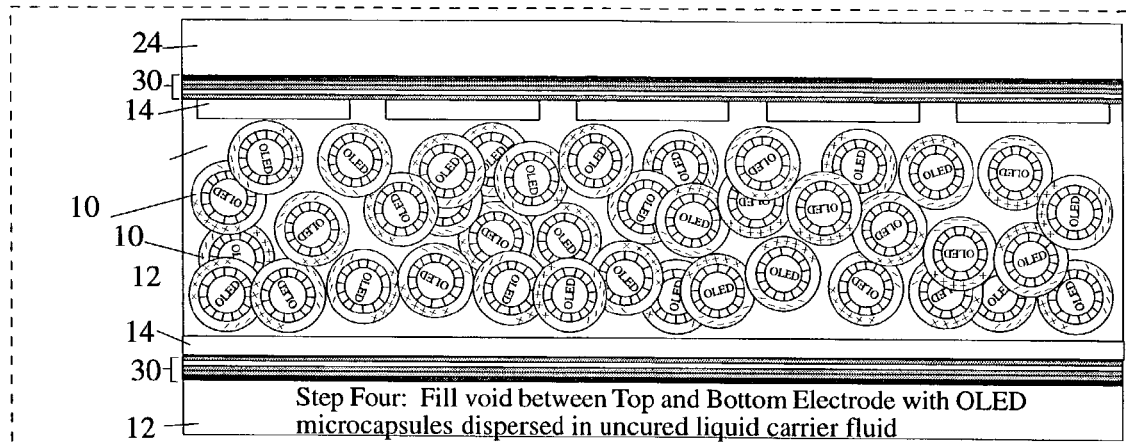
FIG. 25 illustrates step four of an embodiment of the inventive OLED device fabrication method.
Figure 26:
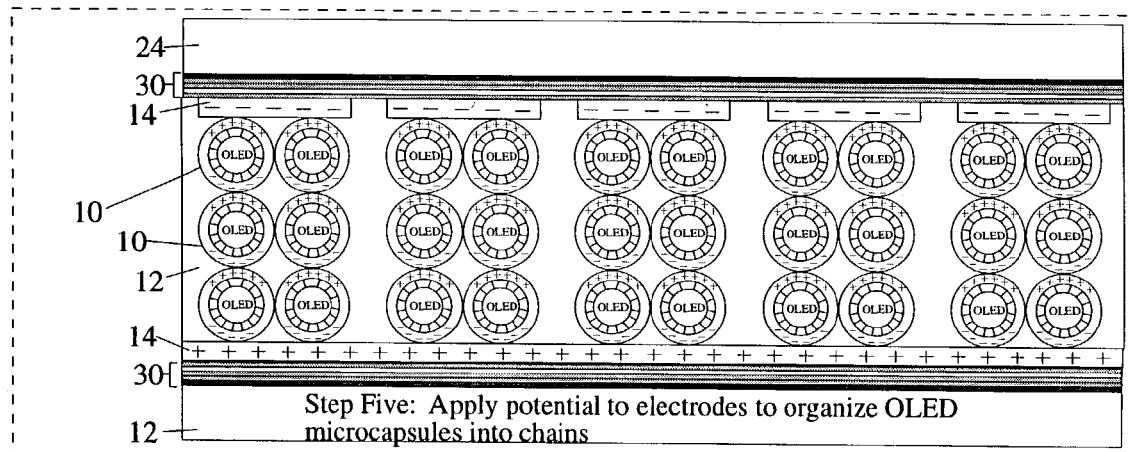
FIG. 26 illustrates step five of an embodiment of the inventive OLED device fabrication method.
Figure 27:
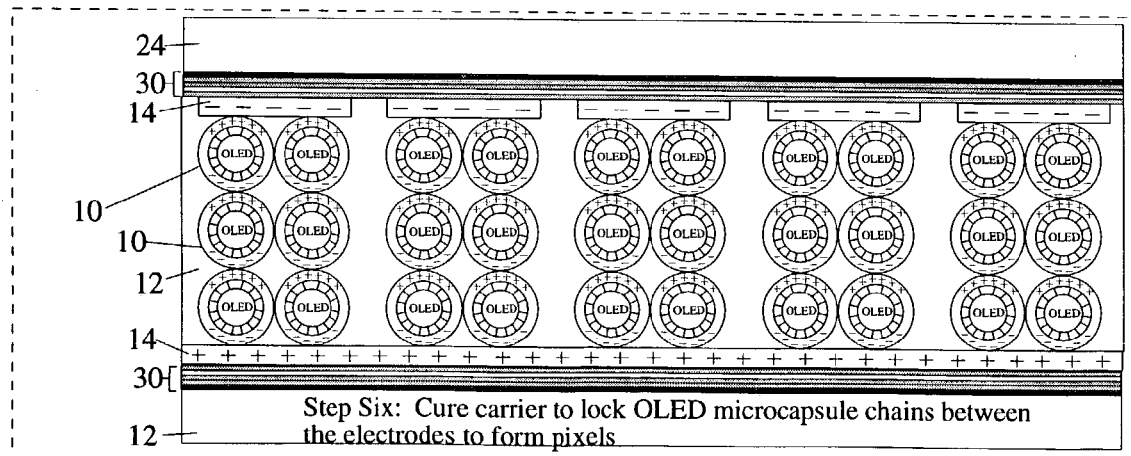
FIG. 27 illustrates step six of an embodiment of the inventive OLED device fabrication method.

FIGS. 22-27 illustrate the steps for forming an OLED device in accordance with an embodiment of the present invention. FIG. 22 illustrates step one of an embodiment of the inventive OLED device fabrication method. Step One: Provide Top and Bottom Flexible Substrates. Step Two: Form Barrier layers 30 on Top and Bottom Flexible Substrates 24 (FIG. 23). Step Three: Form Top and Bottom Electrodes 14 on Barrier layer 30 (FIG. 24). Step Four: Fill Void between Top and Bottom Electrode 14 with OLED microcapsules 10 dispersed in uncured carrier fluid 12 (FIG. 25). Step Five: Apply potential to electrodes 14 to organize OLED microcapsules 10 into chains (FIG. 26). Step Six: Cure carrier 12 to lock OLED microcapsule chains between the electrodes 14 to form pixels (FIG. 27). The composition of the OLED particulate can be selected so that the characteristics of the OLED particulate includes an electro or magneto rheological characteristic. This rheological characteristic is effective for causing the OLED particulate to orient in an applied aligning field.

Figure 28:
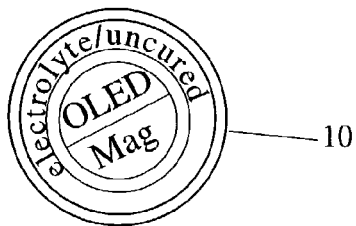
FIG. 28 shows a magnetically reactive OLED microcapsule for forming a capacitor OLED microcapsule with the aligning field turned off.

FIG. 28 shows a magnetically reactive OLED microcapsule 10 for forming a capacitor OLED microcapsule 10 with the aligning field from an aligning field source 32 turned off. An OLED microcapsule 10 is formed having a capacitor capability. An OLED material internal phase is encapsulated within a first shell. An electrolyte surrounds the first shell and a second shell encapsulates the first shell and the electrolyte. The OLED material internal phase includes a field reactive material. The field reactive material comprises at least one of a magnetically reactive material and an electrically reactive material effective to orient the OLED microcapsule 10 within an aligning field applied from the aligning field source 32. By this construction, OLED material and field attractive material, such as magnetic material, are microencapsulated within an electrically conductive shell, forming an OLED/Mag internal core. The OLED/Mag internal core is microencapsulated along with a mixture of electrolyte and light curable monomer liquid phase within a second electrically conductive shell. The microcapsule shell material is selected to have the appropriate breakdown voltage at which charge conduction occurs. The microcapsules 10 act as capacitor elements that are charged up with a charging voltage. A trigger voltage is then applied when the OLED pixel is to emit light.

Figure 29:
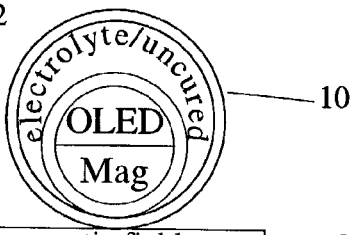
FIG. 29 shows a magnetically reactive OLED microcapsule for forming a capacitor OLED microcapsule with the magnetic aligning field turned on with uncured electrolyte mixture.
Figure 30:
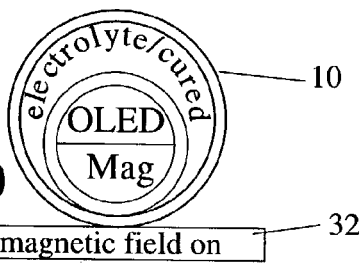
FIG. 30 shows a magnetically reactive OLED microcapsule for forming a capacitor OLED microcapsule with the magnetic aligning field turned on with cured electrolyte mixture.

FIGS. 28-30 illustrate the formation of an OLED/Capacitor microcapsule. OLED material and field attractive material, such as magnetic material, are microencapsulated within an electrically conductive shell, forming an OLED/Mag core. The OLED/Mag core is microencapsulated along with a mixture of electrolyte and light curable monomer liquid phase within a second electrically conductive shell. The microcapsule shell material is selected to have the appropriate breakdown voltage at which charge conduction occurs. FIG. 29 shows a magnetically reactive OLED microcapsule 10 for forming a capacitor OLED microcapsule 10 with the magnetic aligning field turned on with uncured electrolyte mixture. FIG. 30 shows a magnetically reactive OLED microcapsule 10 for forming a capacitor OLED microcapsule 10 with the magnetic aligning field turned on with cured electrolyte mixture. In accordance with this composition of the OLED microcapsule, the internal phase comprises OLED material and a magnetically reactive material disposed within a first shell. An electrolyte and a curable fluid material surround the first shell. A second shell encapsulates the first shell, the electrolyte and the curable material. In response to an applied magnetic field, the position of the first shell is changeable relative to the second shell. Upon curing the curable material, the position of the first shell relative to the second shell is locked in place. This microcapsule 10 structure can be used to form capacitors/OLED microcapsules 10 which may be particularly effective for use in passive matrix displays. Typically, a passive matrix display is driven with a relatively high driving energy so that the emission of light by a driven pixel is intense. This intensity overcomes the short driving time of the pixel (as compared with the more controllable active matrix backplane). This passive matrix driving scheme results in shorter display life, higher power consumption and lower display quality. When a charging voltage is applied (such as during a charging scan of a passive matrix OLED display grid), the capacitor elements of the microcapsule 10 store applied electrical energy. The charging voltage can be controllably applied to selected pixels and in multiple scans to vary the stored charge in the microcapsules 10 associated with each pixel. When a trigger voltage is applied (during the display writing scan), the OLED material emits light in response to the trigger voltage and in a manner dependent on the stored charge. With the proper selection of microcapsule 10 materials, an RC circuit is formed giving the OLED pixel an increased and more controlled light emission time and intensity.

Figure 31:
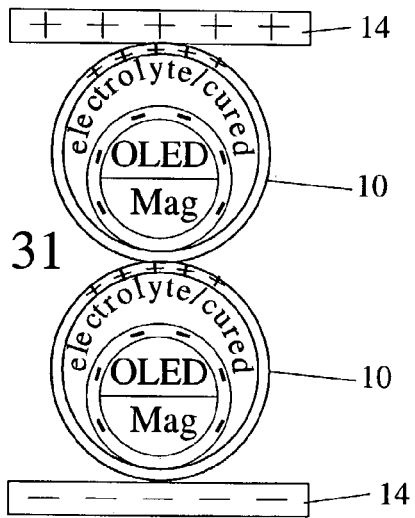
FIG. 31 shows a pixel comprised of a chain of capacitor OLED being charged by a charging voltage.
Figure 32:
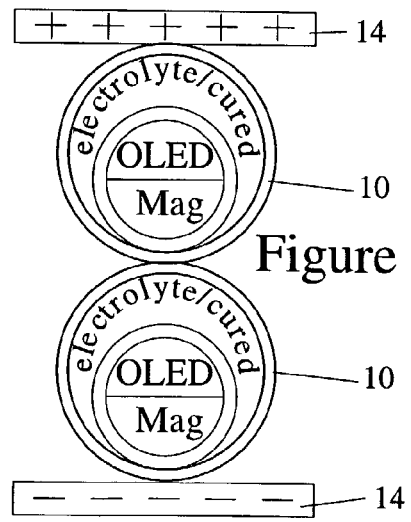
FIG. 32 shows a pixel comprised of a chain of capacitor OLED being triggered for light emission by a trigger voltage.

FIG. 31 shows a pixel comprised of a chain of capacitor OLED being charged by a charging voltage. FIG. 32 shows a pixel comprised of a chain of capacitor OLED being triggered for light emission by a trigger voltage. The microcapsules 10 act as capacitor elements that are charged up with a charging voltage. A trigger voltage is then applied when the OLED pixel is to emit light.

Figure 33:
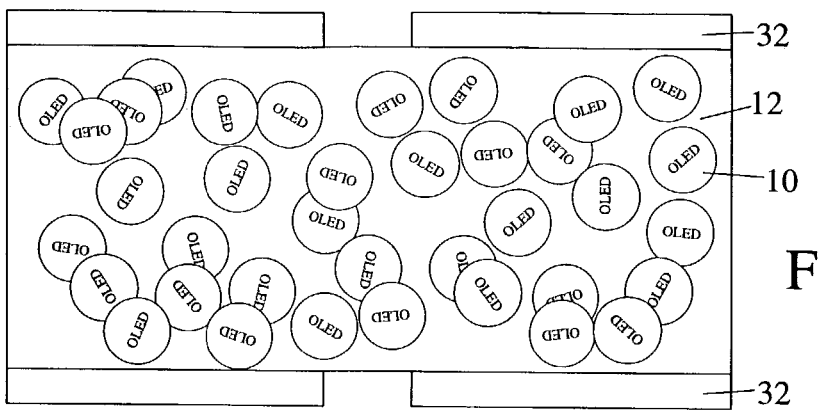
FIG. 33 shows OLED microcapsules randomly dispersed within a fluid but hardenable carrier fluid.

FIG. 33 shows OLED microcapsules 10 randomly dispersed within a fluid but hardenable carrier fluid 12. A first electrode 14 and a second electrode 14 are provided defining a gap there between. Within the gap, field reactive OLED particulate is randomly dispersed within a fluid carrier 12. The electrodes 14 can be preformed on a substrate, such as glass. Alternatively, one or both grids of electrodes 14 can be preformed on a flexible carrier 12 enabling roll-to-roll manufacturing.

Figure 34:
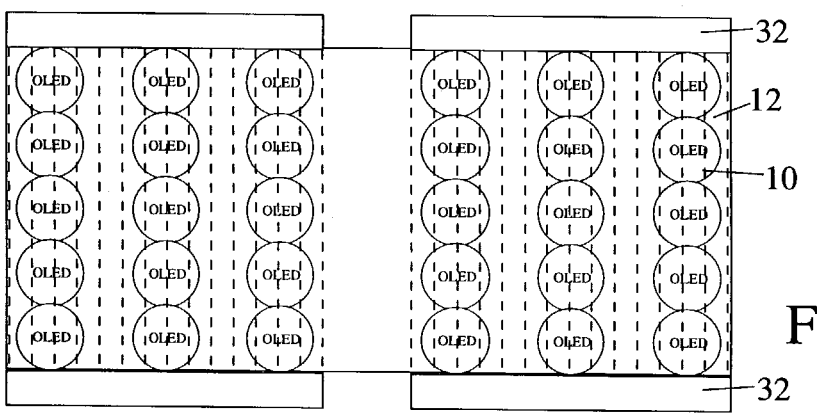
FIG. 34 shows OLED microcapsule chains aligned within an applied aligning field formed within unhardened carrier fluid.

FIG. 34 shows OLED microcapsule chains aligned within an applied aligning field formed within unhardened carrier fluid 12. Upon application of an aligning field, the OLED field-reactive material orient along the field lines and form chains within the still-fluid carrier 12 (analogous to electro rheological fluid mechanics).

Figure 35:
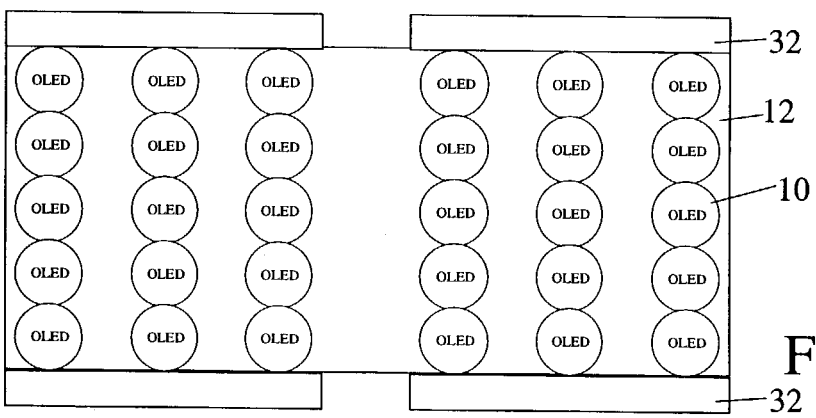
FIG. 35 shows OLED microcapsule chains aligned within an applied aligning field held in alignment within hardened carrier.

FIG. 35 shows OLED microcapsule chains aligned within an applied aligning field held in alignment within hardened carrier 12. With the aligning field still applied, the carrier 12 is cured (for example, using light or heat) to form a solid phase to lock the chains of OLED field-reactive material into position. With the proper selection of carrier 12 material, the OLEDs can be energized to create the curing light to simplify the fabrication process. Alternatively, a light source 28 such as a laser or other light emitter, can be used to controllably apply the curing light.

Figure 36:
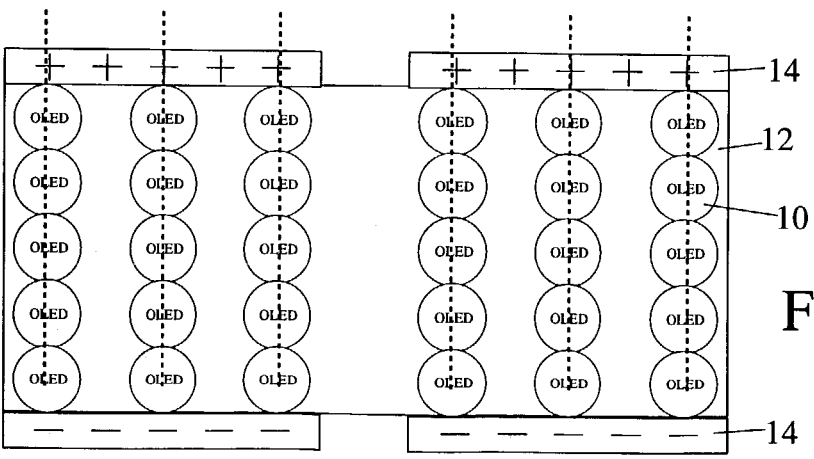
FIG. 36 shows the OLED microcapsule structure shown in FIG. 35 with a drive voltage applied and light being emitted from the OLED microcapsule chains.

FIG. 36 shows the OLED microcapsule 10 structure shown in FIG. 35 with a drive voltage applied and light being emitted from the OLED microcapsule chains. When a voltage is applied to the electrodes 14, the OLED chain enables hole and electron movement, raising the energy state of the OLED material and generating light.

Figure 37:
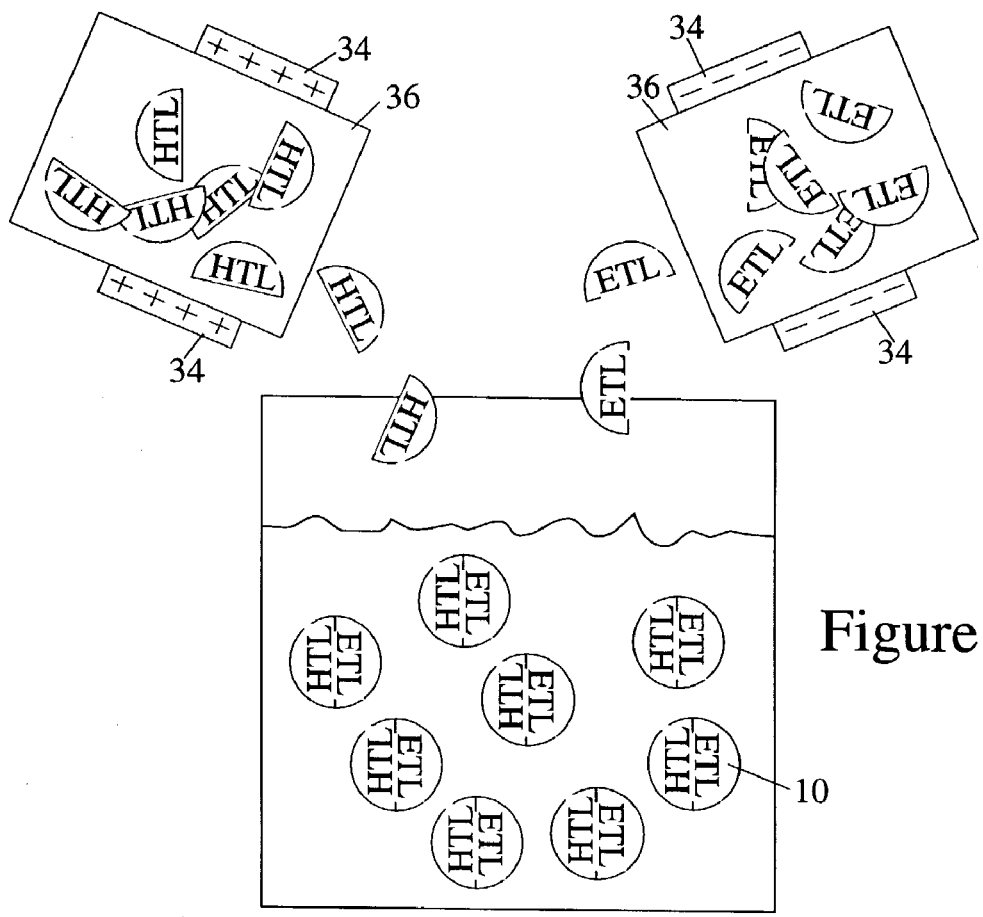
FIG. 37 illustrates a method for forming an OLED particulate having a hole transport layer and an electron transport layer.

FIG. 37 illustrates a method for forming an OLED particulate having a hole transport layer and an electron transport layer. Hole transport material and electron transport material are combined to form stable particles. FIG. 37 illustrates the formation of an OLED particle. Hole transport material having a net positive charge and electron transport material having a net negative charge are mixed together in a liquid so that the opposing polarities of the particles creates an attractive force resulting in electrically stable particles. The OLED particulate is formed by providing a first particle, comprised of a hole transport material that has a net positive electrical charge. A second particle is provided comprised of an electron transport material having a net negative electrical charge. The hole transport particle and the electron transport particle are brought together in a liquid and combined to form a unified OLED particulate having a hole transport layer and an electron transport layer forming a heterojunction between them.

Figure 38:
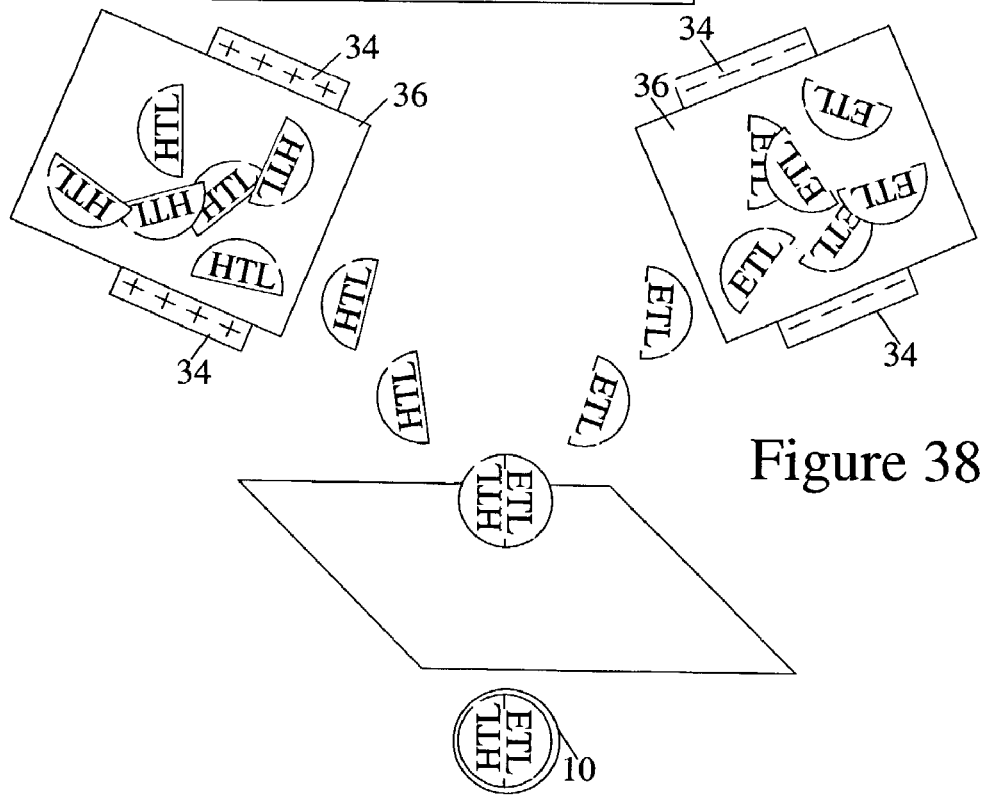
FIG. 38 illustrates a method for forming an encapsulated OLED particulate.

FIG. 38 illustrates a method for forming an encapsulated OLED particulate. The hole transport material and the electron transport material can be combined into a single particle by ejecting the constituent particles towards each other. The positive and negative charges will attract to form an electrically neutral dielectric particle. This particle may be coated with an encapsulating shell or left uncoated.

Figure 39:
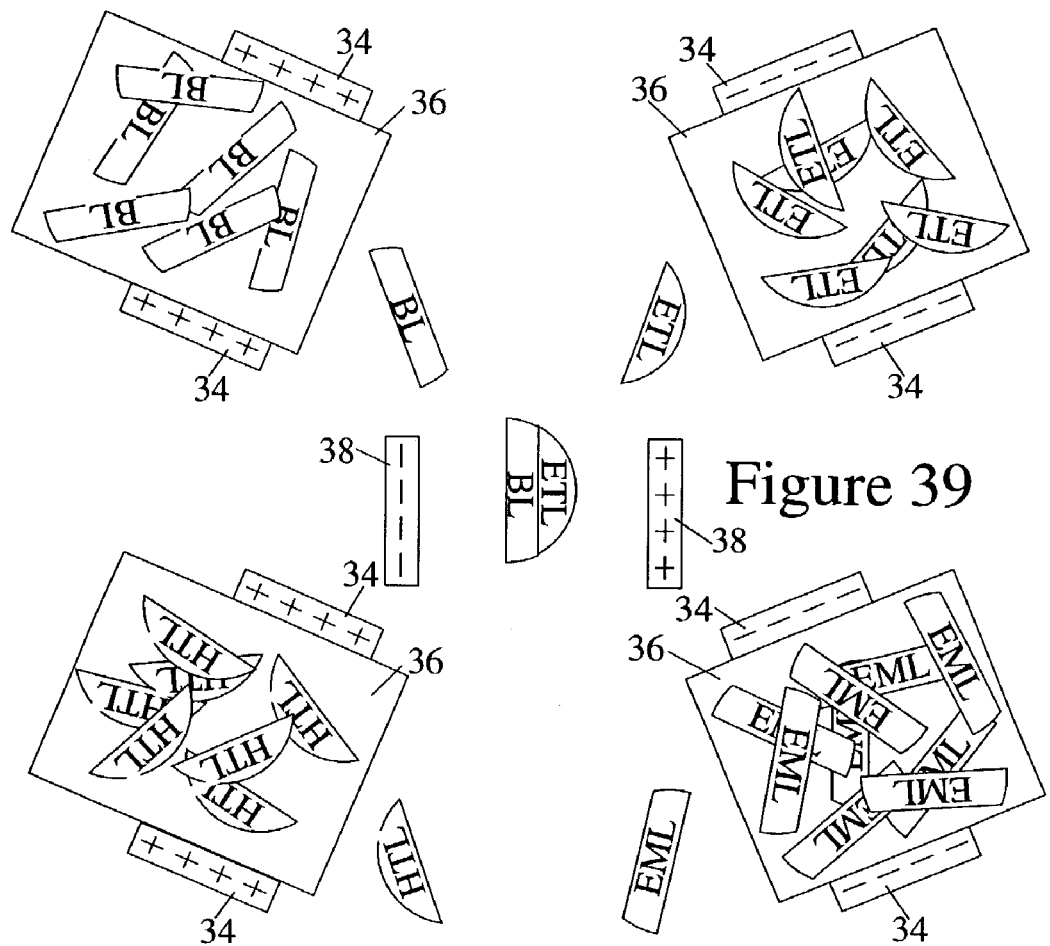
FIG. 39 illustrates a first step in forming a multi-layered OLED particulate.
Figure 40:
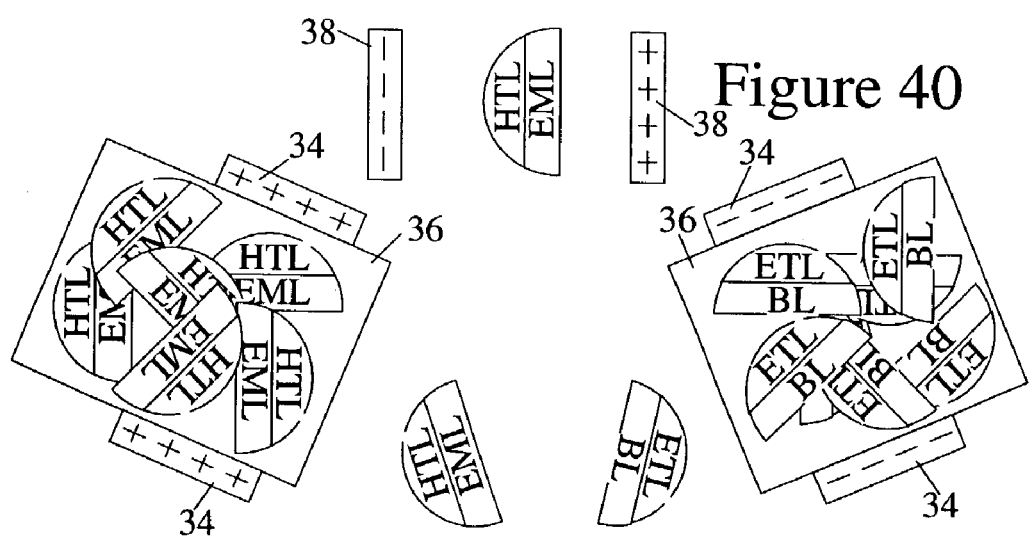
FIG. 40 illustrates a second step in forming a multi-layered OLED particulate.
Figure 41:
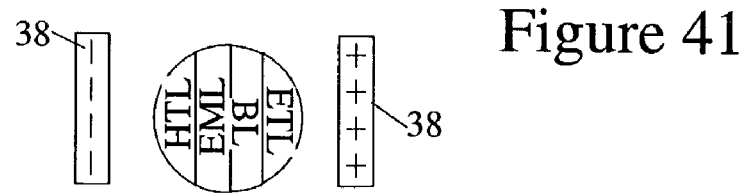
FIG. 41 illustrates a third step in forming a multi-layered OLED particulate.

FIGS. 39-41 show the steps for forming a multi-layered OLED particle. In this case, as shown in FIG. 39, individual particles of electron transport material are imparted with a net negative electrical charge by a charge source 34 and ejected from a nozzle 36. Particles of a blocking material are imparted with a net positive charge and ejected from a second nozzle 36 towards the stream of electron transport material particles. Field applying electrodes 38 may be provided for directing the respective charged particles so that they combine together to form an electrically neutral dual layer particle. The field applying electrodes 38 may also be useful for attracting and removing from the combined particle stream the charged particles that do not combine in the dual layer particle. In a similar manner, a dual layer hole transport and photo active layer particles can be ejected with induced charges and directed to combine into a dual layer particle containing the hole transport material and the photo active material. As shown in FIG. 41, the two dual layer particles are imparted with opposite electrical charge and ejected from nozzle 36 towards each other where they combine to form the completed multi layered OLED particulate. The amount of charged induced in the particles can be controlled to adjust the alignment of attracted constituents.

The OLED particulate comprises organic-layered particles, which include a hole transport layer and an electron emitter layer. A heterojunction is formed at the interface between the hole transport layer and the electron emitter layer. Each organic-layered particle may also include a blocking layer adjacent to the electron emitter layer and an emissive layer adjacent to the hole transport layer, thereby forming a stacked organic layered structure. The blocking layer is provided for facilitating the proper flow of electrons and hole, and the emissive layer is provided for facilitating the emission of photons when the energy state of the OLED particulate is raised.

FIG. 40 illustrates a second step in forming a multi-layered OLED particulate. The amount of charge induced in particles can be controlled to adjust alignment of attracted constituents. FIG. 41 illustrates a third step in forming a multi-layered OLED particulate. Relatively weak attractive field keeps layered particles properly aligned, without causing attachment of particles to electrodes 14. The relatively more negatively attractive ETL side attracted to a positive attractive force. More positive towards one end, with an overall net positive charge on HTL/EML layered particle and more negative towards another end, with an overall net negative charge on ETL/BL layered particle. With the proper selection of constituent materials, the electrical properties of the HTL and ETL material should be effective to cause the larger degree of induced charge to occur at the those ends of the layered particles.

The OLED particulate may comprise a dielectric OLED microcapsule. The OLED particulate is formed by the steps of first providing a first particle comprised of a hole transport material. The hole transport material has a net first electrical charge. A second particle comprised of an electron transport material is provided having a net second electrical charge. The first electrical charge is of opposite polarity from the second electrical charge. The first particle and the second particle are brought together to form a unified OLED particulate having a hole transport layer and an electron transport layer forming a hetero-junction between them. The first particle may further include a photon-active layer. This photon-active layer may be a light emissive layer in which case the OLED forms a light emitting device, or a light receptive layer, in which case the OLED forms a light-detecting device.

Figure 42:
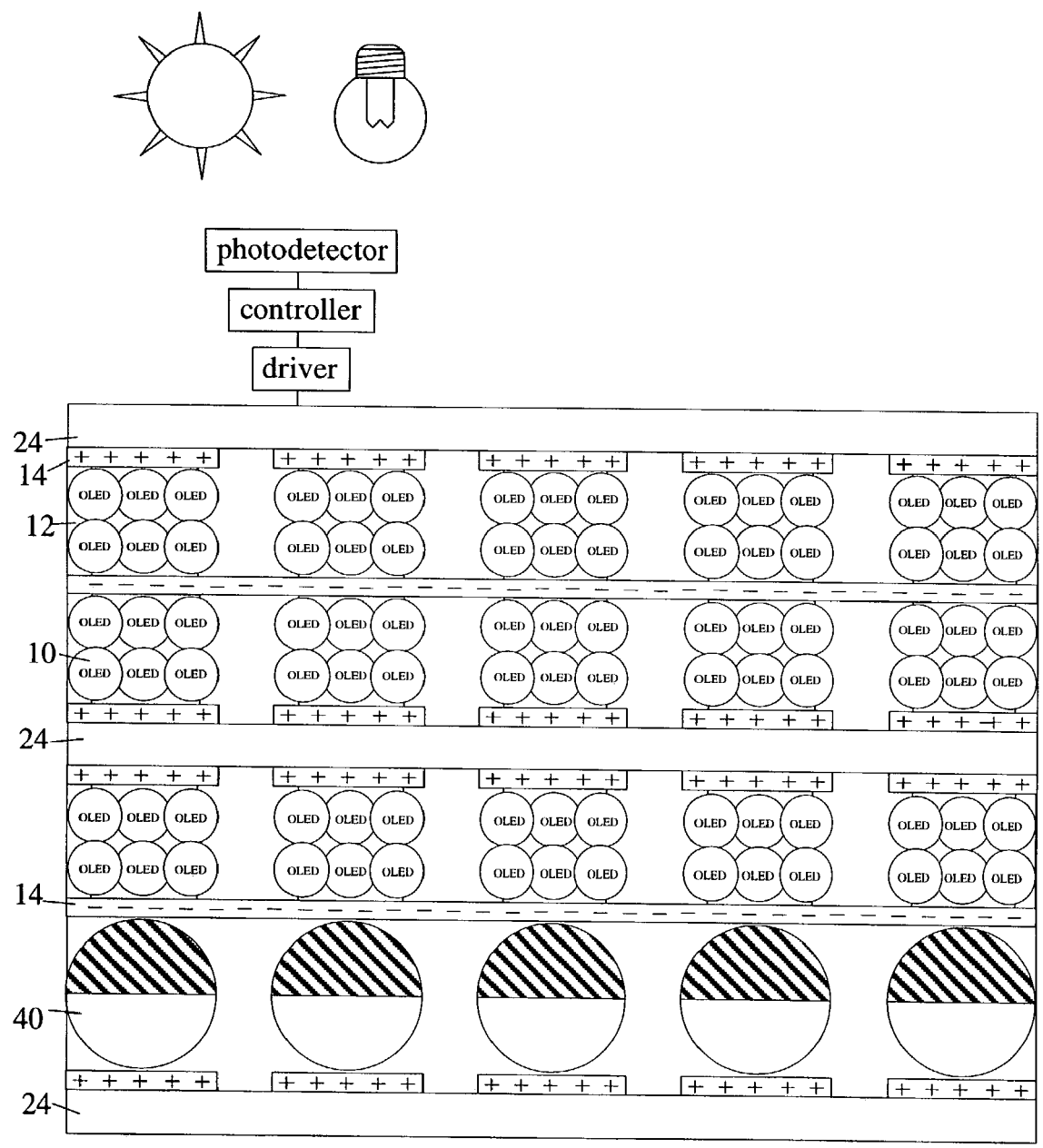
FIG. 42 schematically shows a full-color OLED display constructed in accordance with the present invention, and having a dichromatic display layer for improving the display contrast, power efficiency and for providing display viewing in bright sunlight.

FIG. 42 schematically shows a full-color OLED display, constructed in accordance with the present invention, having a dichromatic display layer for improving the display contrast, power efficiency and for providing display viewing in bright sunlight. The dichromatic display layer may be formed, for example, using a conventional LCD pixilated light modulator layer. Further, the dichromatic display layer can be comprised of dichromatic microcapsules that can be oriented to reflect or absorb impinging light using an aligning field. The dichromatic microcapsules 40 can be oriented using an applied electrical field. In this case, the dichromatic microcapsules 40 are electrically reactive. Alternatively, in accordance with the present invention, the dichromatic microcapsules may be magnetically reactive. In this case, the microcapsule can be constructed having a north magnetic pole and a south magnetic pole, each pole being associated with a respective color of a bi-color microcapsule. A construction similar to the capacitor/OLED microcapsule shown in FIGS. 28-32 can be used to create microcapsules that can be controllably oriented in an applied magnetic field. The dichromatic display layer provides a light reflective display for use in bright sunlight and other appropriate ambient light conditions, as well as other display enhancing effects. The dichromatic pixel layer can be formed adjacent to the last subsequent OLED pixel layer. This dichromatic pixel layer results in a display that can viewed in direct bright sunlight as well as with improved contrast in indoor ambient lighting conditions. Further, additional subsequent OLED pixel layers can be provided which emit light in additional color range having a color and/or light intensity different from the color and/or light intensity of the other OLED pixel layers.

To control the reflection of the emitted light from the OLED RGB pixels in automatic mode the OLED brightness and the reflection/absorption dichromatic microcapsule 40 is automatically controlled to optimize power consumption and display quality. Photodetection elements are used to determine that level of ambient light and adjust the reflection/absorption/image displaying capabilities of the inventive display. Further, the inventive OLED device can be configured so as to detect light impinging on a pixel grid formed in accordance with the present invention. In this case, the OLED particulate of a first OLED pixel layer emits electrical energy in response to the reception of photons and applies the electrical energy as a detectable signal to the first and second layer electrodes 14. Further, a black and white and/or full color CCD-type camera can be formed, by tuning the wavelength range at which subsequent layers of OLED pixels are photo reactive. Photodetectors are used to determine when to use dichromatic display elements. If the dichromatic pixels (e.g., dichromatic microcapsules 40) are turned to the reflection side, OLED emission will be reflected and more light emitted from the display. If turned to the absorption side, better display contrast may be obtained. If the OLED layers are turned off, the dichromatic pixels become a reflective (or two color) display for use in bright light or energy saving conditions. This driving scheme requires very low power—only have to apply power to the pixels to change orientation, then the state remains until power is applied again. For applications such as cell phones, the ability to see a display in bright light is an important consideration. When the phone is in bright sunlight, the dichromatic display elements are used and the OLEDs are off and transparent (the display is reflective and monochrome (e.g., a black and white display)). When the phone is indoors or in lower ambient light, the emissive pixels are used (full color display). As examples of how the dichromatic display layer improves the inventive display, under normal ambient light (indoor, office lighting) the dichromatic microcapsules 40 can be oriented to absorb the reflection of ambient light to improve the contrast of the display.

In low ambient light (airplane, car, dusk) the dichromatic display elements can be turned oriented to reflect the OLED emission so that the OLED display elements can be driven with lower energy consumption. The dichromatic display elements can be automatically oriented and controlled to provide power savings and improve contrast. Light filters and side/side pixels can be mixed with the display stack to create a variety of display options. Further, IR and other emitters and detectors can also be included to create "invisible" maps that can only be read with night vision aides. Other display possibilities include windshields that automatically block out high light sources like the sun and oncoming high beams; and goggles that enhance vision, provide night vision, and include telescopic and stereoscopic capabilities.

Figure 43:
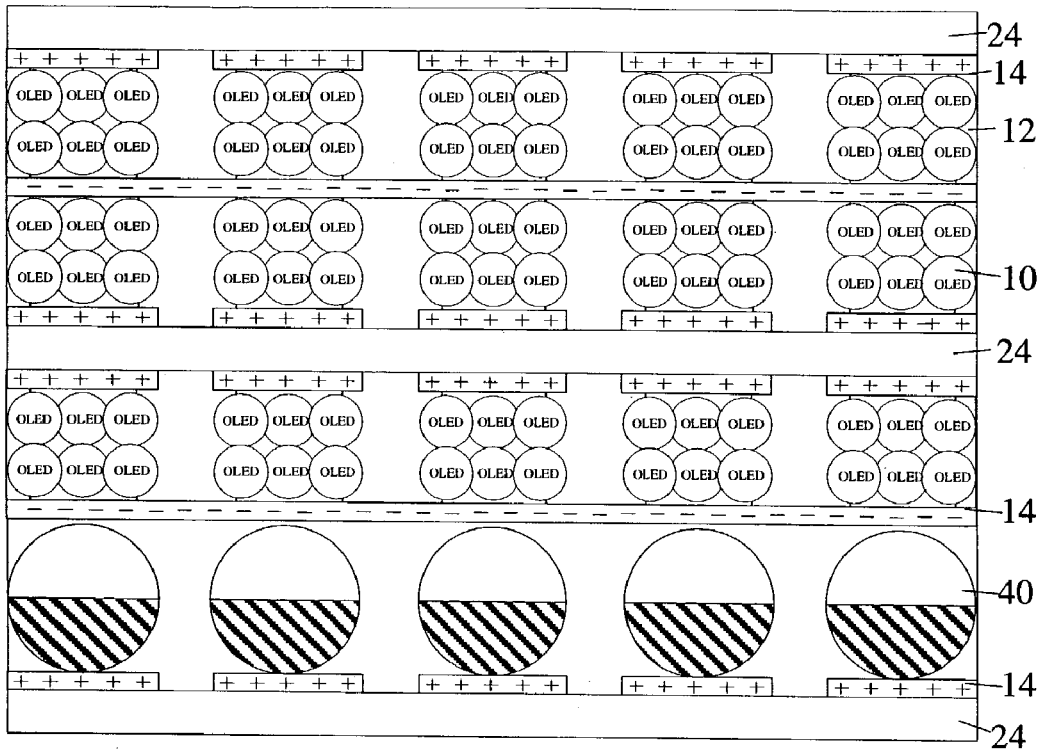
FIG. 43 schematically shows the full-color OLED display shown in FIG. 42, with the dichromatic pixels oriented for reflecting emitted OLED light.

FIG. 43 schematically shows the full-color OLED display shown in FIG. 42, with the dichromatic pixels oriented for reflecting emitted OLED light. When the dichromatic picture elements are reflective (oriented so that the reflective side of the sphere is facing toward the emissive side of the display), then the light emitted from the OLED elements is reflected for use in forming the display image. The orientation of the dichromatic picture elements can be automatically controlled depending on the ambient light detected by a photodetector.

Figure 44:
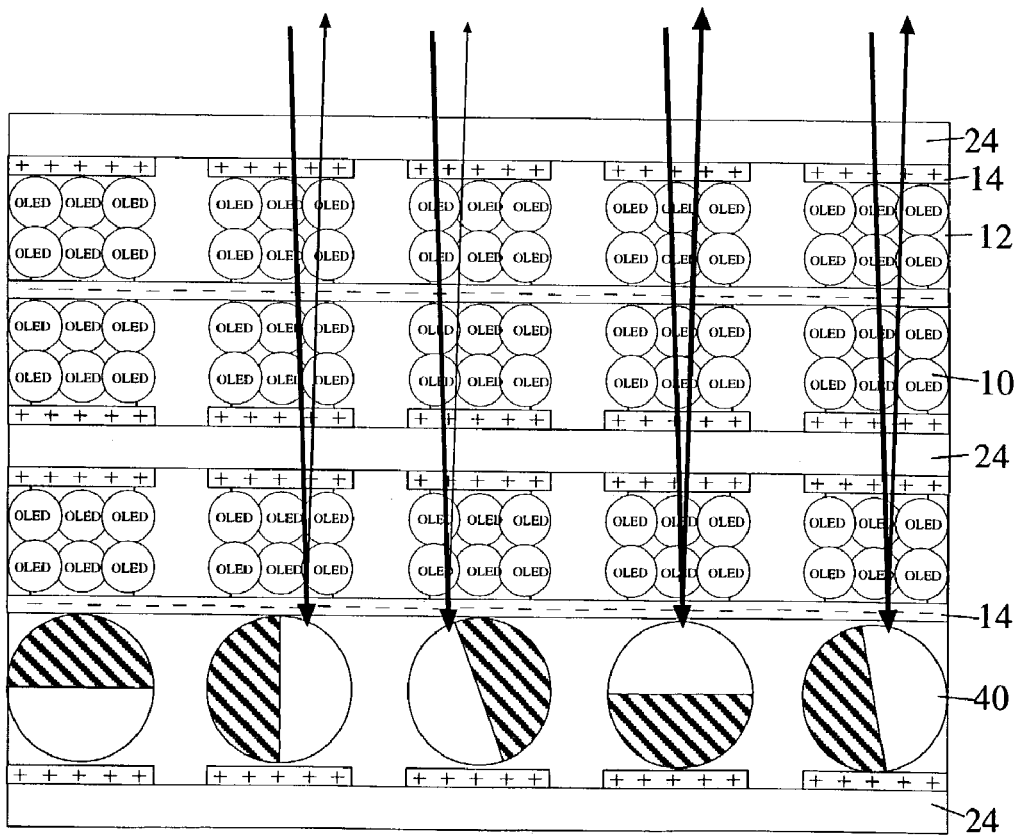
FIG. 44 schematically shows the full-color OLED display shown in FIG. 42, showing the relative strength of reflected light depending on the dichromatic pixel orientations.

FIG. 44 schematically shows the full-color OLED display shown in FIG. 42, showing the relative strength of reflected light depending on the dichromatic pixel orientations. The orientation of each respective pixel stack's dichromatic pixel element, determines the contrast, ambient and emitted light reflectivity.

Figure 45:
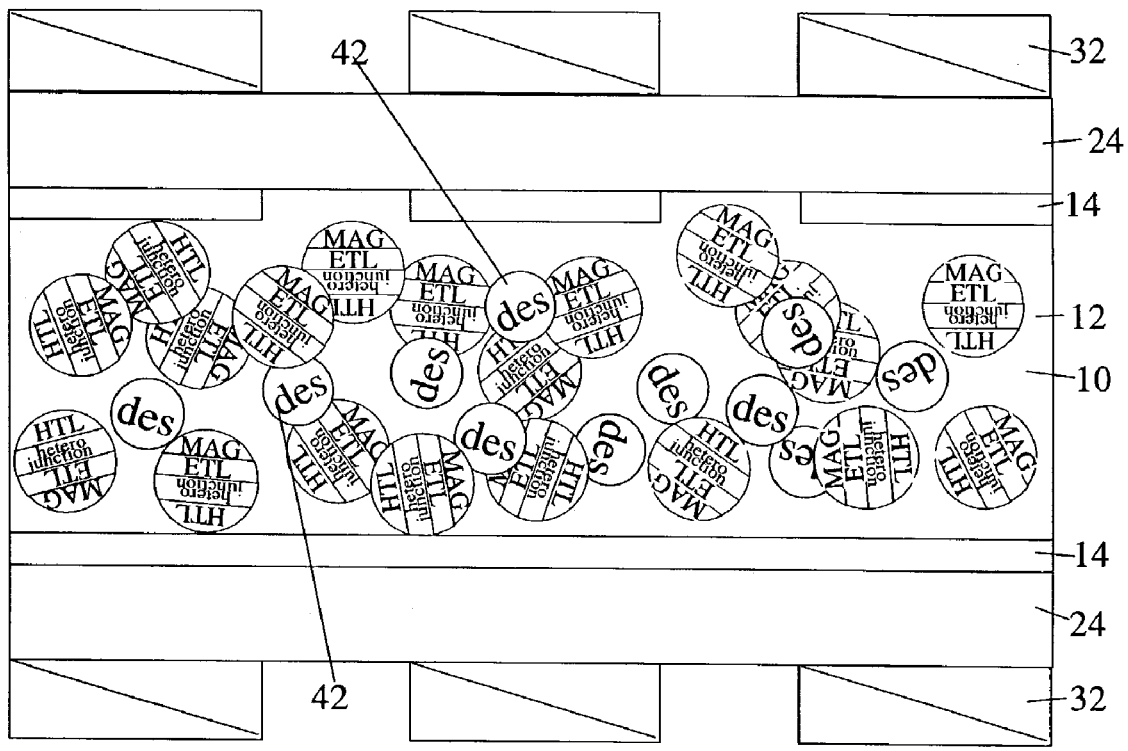
FIG. 45 shows magnetically-active OLED microcapsules randomly dispersed within a fluid but hardenable carrier fluid along with desiccant particulate.

FIG. 45 shows magnetically-active OLED microcapsules 10 randomly dispersed within a fluid but hardenable carrier fluid 12 along with desiccant particulate. The carrier fluid 12 can include a conductive element, carbon or powdered iron for example. The carrier fluid 12 should be selected to have the appropriate electrical properties so that the path of least electrical resistance in the completed display device is through the OLED material, and not through the carrier 12. Accordingly, the carrier fluid 12 may have a semi-conductive composition. Desiccant particles 42 are included within the carrier fluid 12 to improve protection against contamination. The desiccant can be for example, a finely powdered silica based particulate. This desiccant can be included in the shell and/or the internal phase of the OLAM microcapsules, depending on the microcapsule composition.

Figure 46:
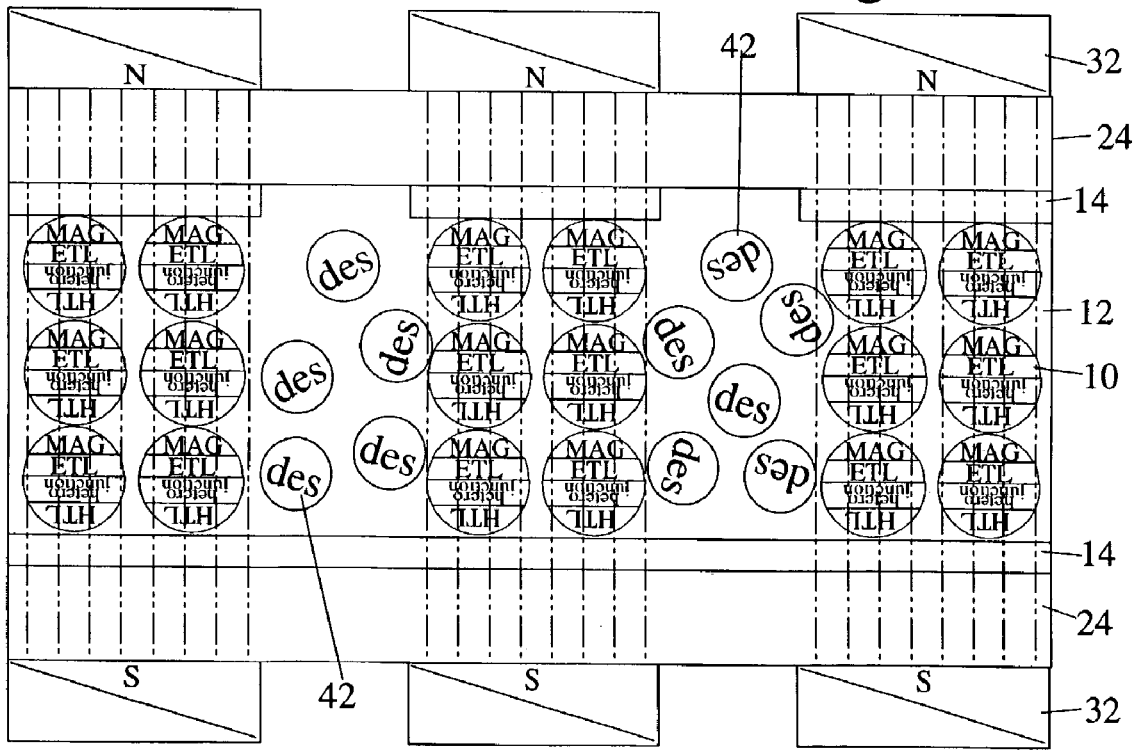
FIG. 46 shows the magnetically-active OLED microcapsule chains aligned within an applied magnetic aligning field within the unhardened carrier fluid.

FIG. 46 shows the magnetically-active OLED microcapsule chains aligned within an applied magnetic aligning field within the unhardened carrier fluid 12. The applied magnetic field can be obtained by permanent magnets brought into position relative to the display electrodes, or electromagnets that are controlled to apply the magnetic field as needed to cause the desired microcapsule alignment and orientation.

Figure 47:
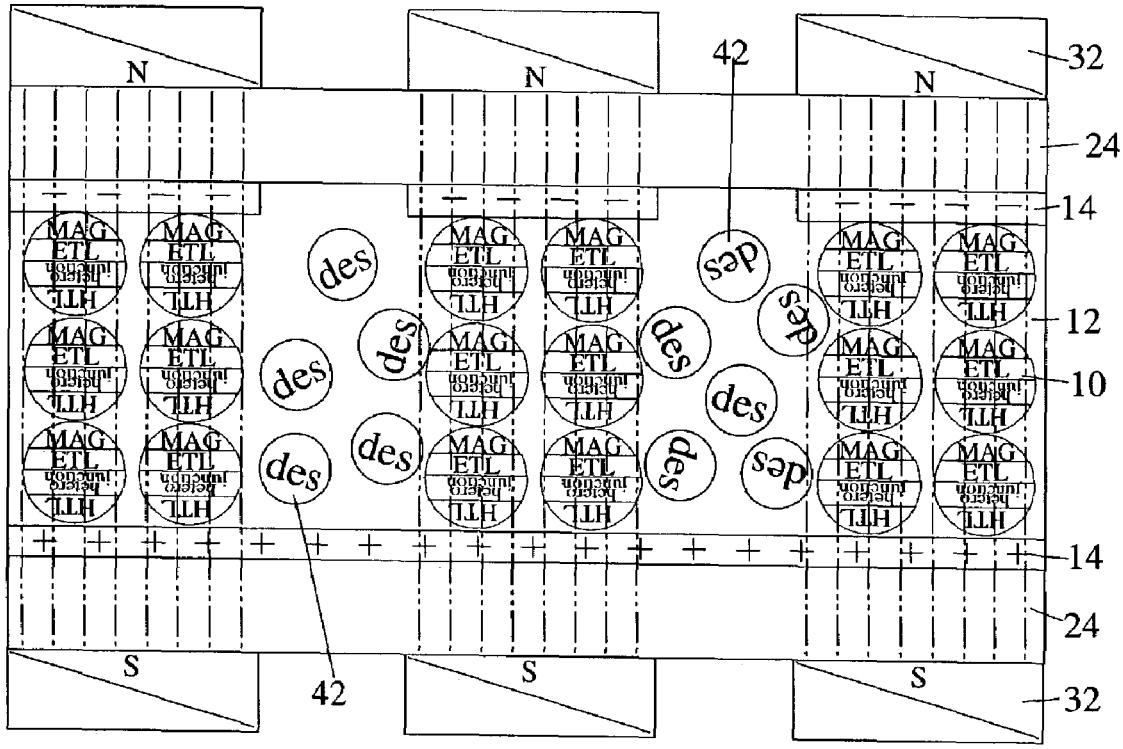
FIG. 47 shows the magnetically-active OLED microcapsule chains aligned within the applied magnetic aligning field held in position within the hardened carrier.

FIG. 47 shows the magnetically-active OLED microcapsule chains aligned within the applied magnetic aligning field held in position within the hardened carrier 12. The carrier fluid 12 can include a conductive element—carbon, for example. Desiccant particles 42 are included within the carrier fluid 12 to improve protection against contamination.

Figure 48:
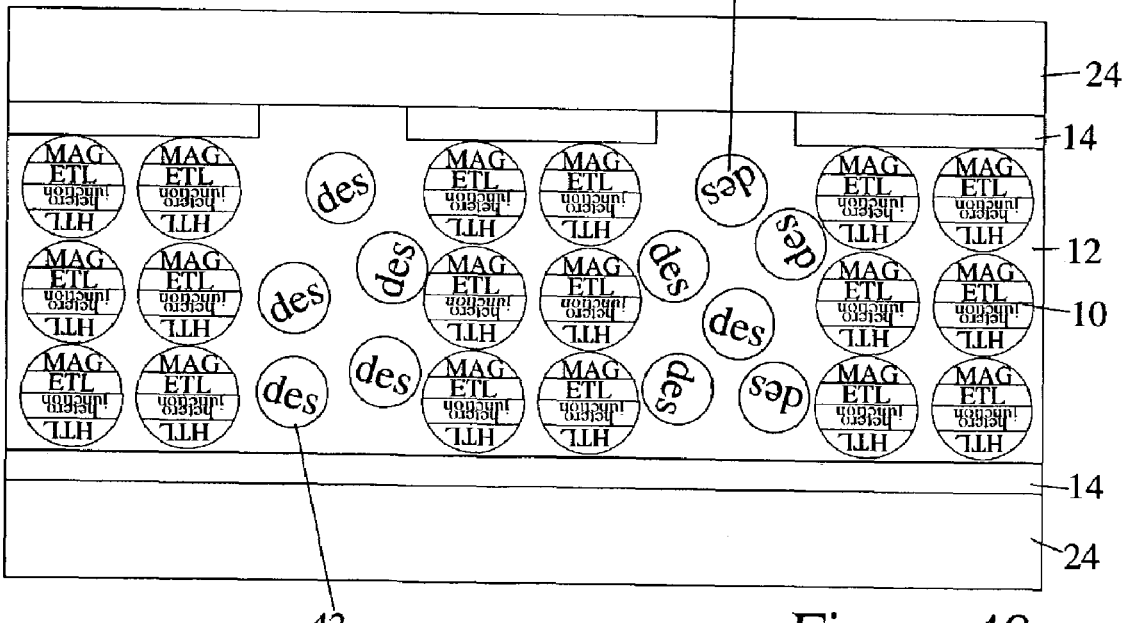
FIG. 48 shows the magnetically-active OLED microcapsule structure with light being emitted from the OLED microcapsule chains.
Figure 49:
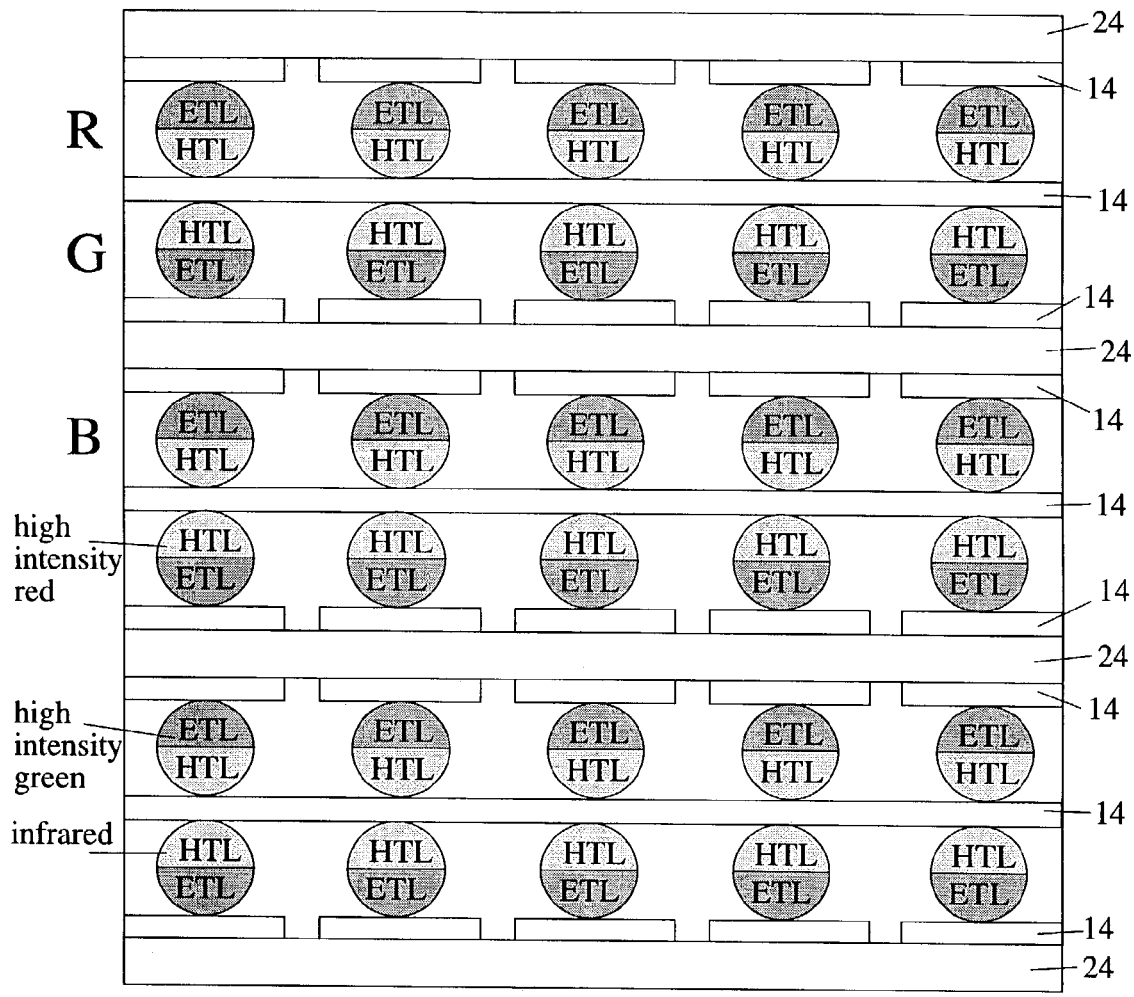
FIG. 49 schematically illustrates a full color OLED display having high intensity visible light display layers and an infrared display layer.

FIG. 48 shows the magnetically-active OLED microcapsule 10 structure with light being emitted from the OLED microcapsule chains in response to a driving applied to the electrodes. FIG. 49 schematically illustrates a full color OLED display having high intensity visible light display layers and an infrared display layer.

Figure 50:
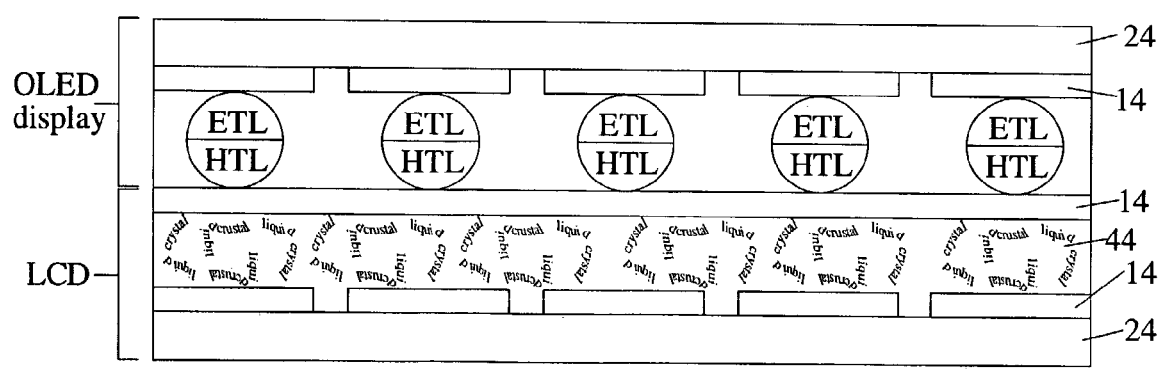
FIG. 50 shows an OLED display layer and a liquid crystal display layer.
Figure 57:
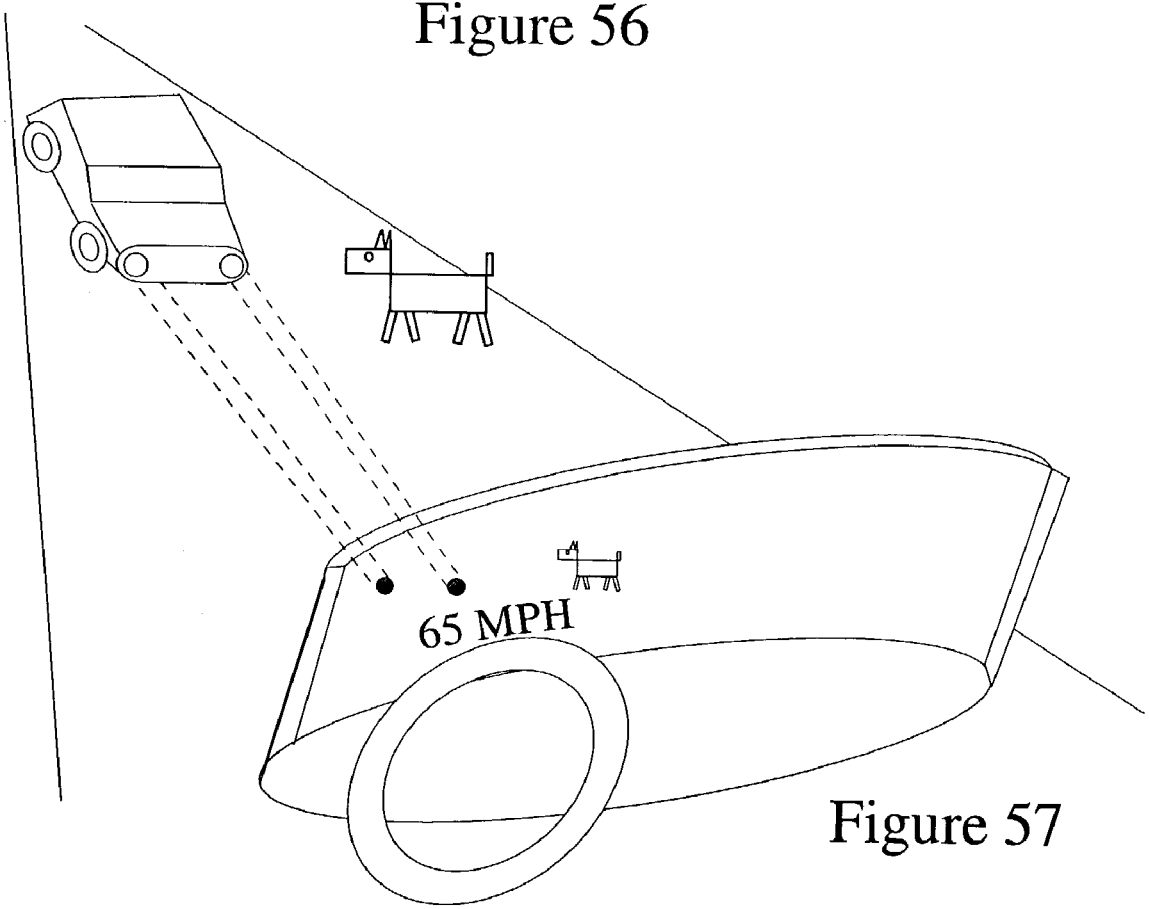
FIG. 57 illustrates a transparent, flexible OLED display fabricated for use as part of a vehicle windshield.
Figure 58:
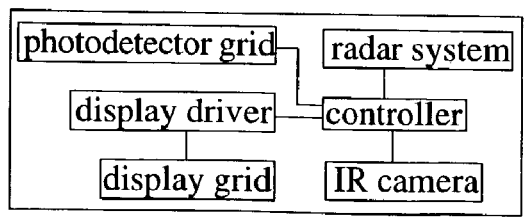
FIG. 58 is a block diagram showing the basic components of an active windshield display system using an OLED display.

FIG. 50 shows an OLED display layer and a liquid crystal light modulating layer 44. The liquid crystal display layer 44 can be used as the dichromatic display layer described above. The liquid crystal light modulating layer 44 can also provide the inventive display with the capability of being selectively reflective. With this capability, the light-blocking windshield described with regard to FIGS. 57 and 58 is obtained. Further, a window can be formed that is transparent when needed, can be switched to being an emissive display (viewable from both or only one side), is selectively light blocking, and can be a bi-color or reflective display.

Figures 51, 52, 53, 54, 55:
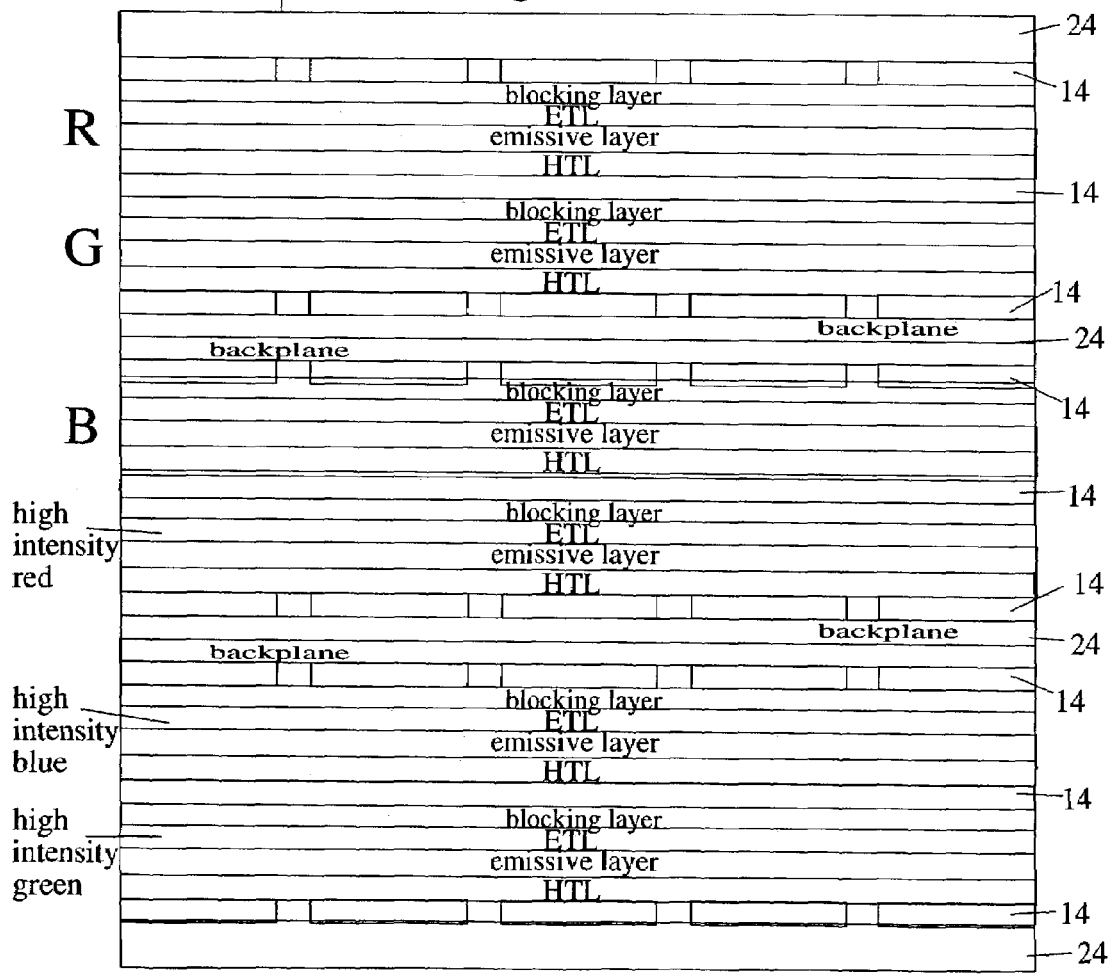
FIG. 51 shows an inventive OLED display fabricated with thin films of organic material with photodetection elements and photodetection pixel elements.
FIG. 52 shows an OLED microcapsule wherein the shell is slightly less conductive than the encapsulated OLED material.
FIG. 53 shows an OLED microcapsule wherein the OLED material is encapsulated along with an electrolyte and a magnetic inner microcapsule having an electrically insulative shell.
FIG. 54 shows an OLED microcapsule wherein the OLED material and the hole transport material are contained in solution within a conductive shell.
FIG. 55 shows the OLED microcapsules shown in FIG. 54 including a magnetically active material and color dye in the inner phase and heat meltable material in the shell.

FIG. 51 shows an inventive OLED display fabricated with thin films of organic material with photodetection elements. Photodetector elements can be incorporated into each pixel stack, or disposed in a different resolution grid. The ambient light, whether sunlight or firelight, received by the photodetectors is used to control the optical characteristics of the OLED pixels associated with each photodetector. This construction can be used with microcapsule-based fabrication or any other display constructions. This enables features such as windshields that block out (using, for example, LCD shutters) high light sources, such as bright sunshine, overhead streetlights, or headlights beaming from another car. OLED solar cell components or pixel layers can be used to "recycle" the energy emitted by the OLED emitters. Some of the emitted light energy impinges on the solar cells and generate light. This, along with the inventions described herein and the sheet battery described in the above-referenced co-owned Patent Applicant entitled "Printer and Method for Manufacturing Electronic Circuits and Displays", can enable lightweight, relatively inexpensive, dichromatic newspapers (as described herein in FIG. 1) that recharge in sunlight (or even indoor ambient light) to enable full-color emissive video or still images.

FIG. 52 shows an OLED microcapsule 10 wherein the shell is slightly less conductive than the encapsulated OLED material. The shell is slightly more resistive than the OLED material so that current does not flow around shell, but instead flows through OLED material. The particulate can be organic or inorganic, with chips of LED material combined and oriented, as necessary, with other materials as is described herein with regard to OLAM materials.

FIG. 53 shows an OLED microcapsule 10 wherein the OLED material is encapsulated along with an electrolyte. A hole transport material comprises the shell, and a shell around MAG is insulative to keep the magnetic material from having unwanted influence of the electrical behavior of microcapsule. OLED material is contained within the electrolyte solution, the electron carriers in the electrolyte can be controlled depending on the needed specification of the microcapsules 10. For example, the microcapsules 10 charge-carrying requirements of the electrolyte can be tailored to match the electrical flow for a particular OLED constituent material. Thus, microcapsules 10 can be formulated based on the empirically or otherwise determined characteristics of a particular formula, or even a particular batch, of OLAM. Other additional material can be included in the internal phase or the shell of the microcapsule, or added to the carrier material, or included as other microcapsules 10 within the carrier 12. For example, a phosphorescent OLED microcapsule 10 may require different light-inducing applied electrical energy. Light of a particular wavelength, for example infrared, can trigger the OLED emission at other wavelengths. In this case, OLAM, or other material such an inorganic semiconductor, is included to generate electricity in response to IR light. The generated electricity is used to cause an emission of other wavelengths of light by the OLED pixel layers. This capability makes possible a map, for example, that can be read with an infrared flashlight (keeping the stealth advantage, while avoiding the need for the map reader to have night vision, as is the case when the map is the IR emitter).

FIG. 54 shows an OLED microcapsule 10 wherein the OLED material and the hole transport material are contained in solution within a conductive shell. This construction may be driven with AC or DC current. The OLED particulate is formed, by microencapsulating an internal phase within a shell. The internal phase or the shell includes an OLED material and either the internal phase or the shell includes a field reactive material. The field reactive material comprises either an electrostatic and a magnetically reactive material. In accordance with another composition of the inventive microcapsule, the internal phase comprises an OLED emitter material and an OLED hole transport material dispersed in solution. Color dyes may also be included within the internal phase. The solvent may be a fluid organic solvent. In order to provide the alignment capabilities of the microcapsules 10, either the internal phase or the shell may include a field reactive component.

FIG. 55 shows the OLED microcapsules 10 shown in FIG. 54 including a magnetically active material. The magnetic material is included as a separate microcapsule 10 with an electrically insulative shell contained within the internal phase of a second conductive shell that also encapsulates a solution of the OLED material (electron transport material and hole transport material). The electrically insulated magnetic material enables microcapsule 10 alignment within a magnetic field, without it becoming an electrical short within the microcapsule. The OLED microcapsules 10 can have constituent parts including at least one of hole transport material, electron transport material, field reactive material, solvent material, color material, shell forming material, barrier material, desiccant material, colorant material, light curable, heat expandable, heat contracting, heat curable and heat meltable material. The constituent parts of the microcapsule 10 form at least one internal phase and at least one shell. The constituent parts are selected so as to have electrical characteristics that result in a preferred path of electrical conduction (or electron and hole mobility) through the hole transport material and the electron transport material. By this construction, the microcapsule 10 behaves as a pn junction upon application of an electrical potential to the first electrode 14 and the second electrode 14.

Figure 56:
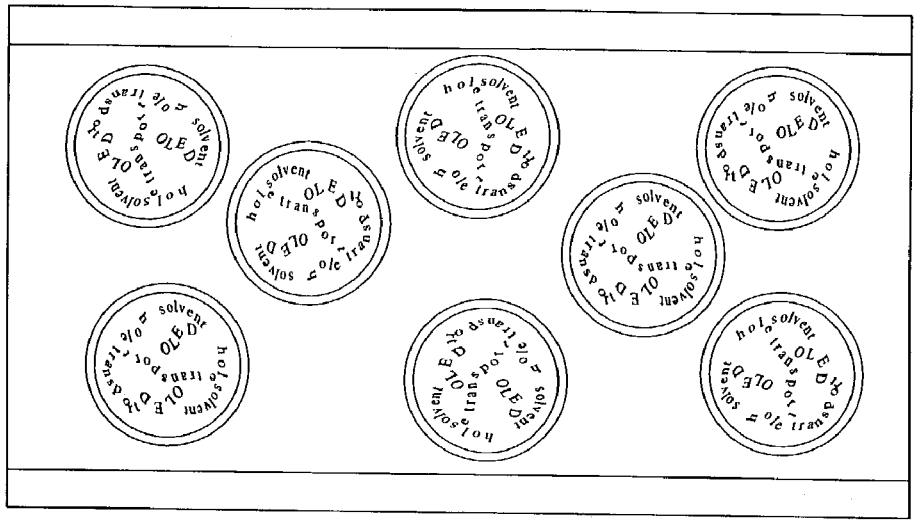
FIG. 56 illustrates the OLED microcapsule shown in FIG. 54 used for creating a general lighting or display back lighting OLED device.

FIG. 56 illustrates the OLED microcapsule 10 shown in FIG. 54 used for creating a general lighting or display back lighting OLED device. For general lighting purposes, OLED and hole transport material is microencapsulated in solvent form. The microcapsules 10 are randomly dispersed within a conductive carrier 12 material, for example a conductive epoxy mixture. The microcapsules 10 can be disposed between two planer electrodes 14. The "self-healing" capabilities described herein are used to correct electrical shorts between the planar electrodes 14.

FIG. 57 illustrates a transparent, flexible OLED display fabricated for use as part of a vehicle windshield. A liquid crystal (or other) light-modulating grid may also be included. The light-modulating grid is used to provide a shutter for blocking high intensity light source 28, such as the sun and oncoming headlights. Photodetector elements (which may be included in grid form within the windshield and/or in another arrangement such as an array) detects when a light source 28 is at a higher intensity than the ambient light. At the location of the detected high intensity light source 28, the light is shuttered (e.g., liquid crystal within certain pixels is oriented) so that the incoming light is blocked. A radar system, IR camera of other object detecting system can be used to determine when an object is in the road, such as a deer or a dog. If such an object is detected, its image of that object or some indication is produced in the OLED display at the location on the windshield corresponding to where the object would be viewed by the driver. Information, such as speed, radio channel, incoming cell call number, etc., can be displayed by the OLED display as a heads up display image. For an example of a driver circuit for the light shutter, a photoactive grid generates an electrical potential between two electrodes 14. That electrical potential (amplified if necessary) is effective to cause structures (molecules or crystals or molecular chains) to orient so that light is selectively blocked. This mechanism may also be used to create a fresnel-type lens system (creating a curvature (focus ability) of a received light image using an essentially flat optical element.

FIG. 58 is a block diagram showing the basic components of a driver display system using an OLED display. A controller controls a display grid and receives input from a photodetector grid. A display driver drives the display grid, under the control of the controller, in response to the photodetector grid, an IR camera and/or other detection system such as a radar, sonar, ultrasonic, or the like.

Figure 59:
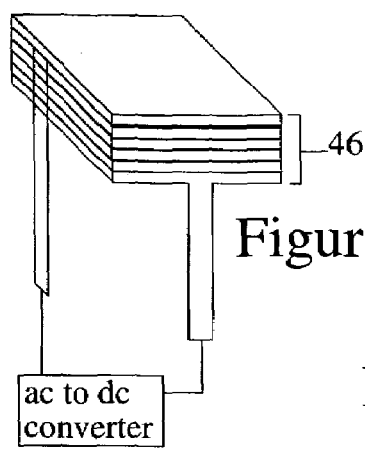
FIG. 59 illustrates an OLED light emissive element.

FIG. 59 illustrates an OLED light emissive element. The OLED element can be constructed from sheets of OLED organic material stacks 46, and can be formed on glass or plastic substrates 24 and cut to size. The electrode 14 leads can be fixed to the cut OLED stack 46 and disposed within an evacuated or inert gas filled bulb. The bulb can be solid and transparent or light diffusive, forming a robust, solid state, light bulb for flashlights or other applications where a conventional LED may otherwise be employed.

Figure 60:
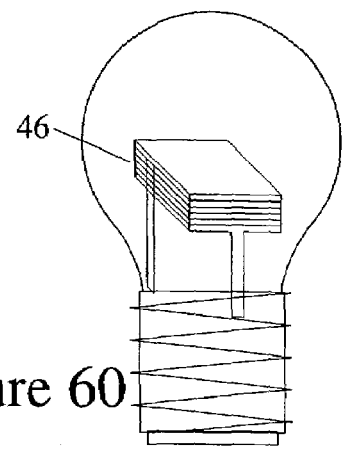
FIG. 60 shows the OLED light emissive element having a conventional light bulb form factor.

FIG. 60 shows the OLED light emissive element having a conventional light bulb form factor. OLED light can be fabricated into the same form factor as a conventional light bulb so that it can be easily installed into existing light sockets. The orientation of the organic stack 46, reflective anode and transparent anode enables the light to be projected outward from the bulb. An array of devices can be configured so that the light is emitted in an omni-directional or directional manner. The OLED element can be constructed from sheets of OLED light stacks 46, and can be formed on glass or plastic substrates 24 and cut to size. The electrode 14 leads can be fixed to the cut light stack and disposed within an evacuated or inert gas filled bulb. The threaded portion of the bulb can include an ac to dc converting circuit so that the conventional sockets, lampshades, etc., already in the home or office are still usable. Alternatively, another form factor, such as holiday lighting, rope lighting, etc., can be used. The cut OLED light stack can be shaped as desired, square, long and thin, etc. Also, the same basic structure can be used to make OLED light in a conventional LED package.

Figure 61:
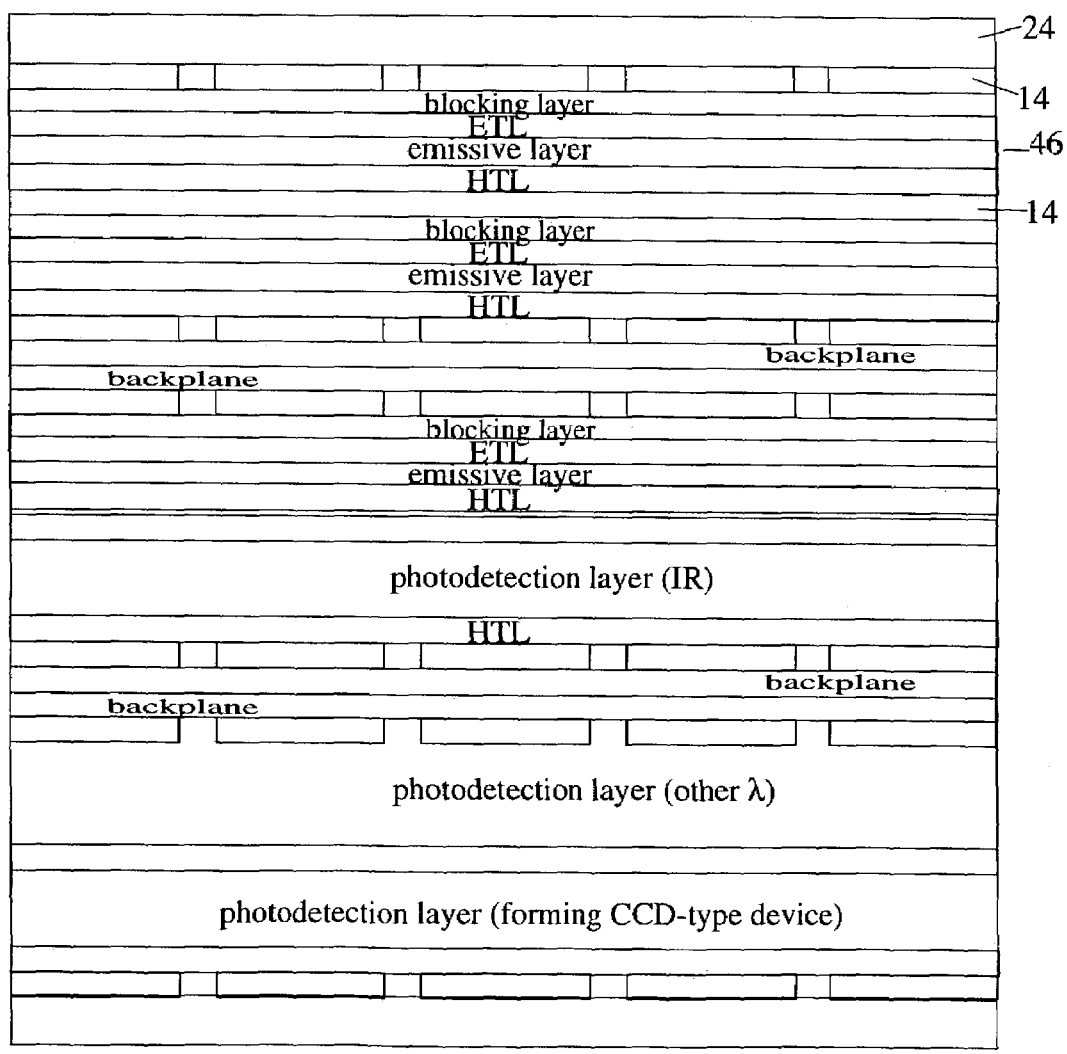
FIG. 61 illustrates an OLED device fabricated using light emissive layers and light detecting layers.

FIG. 61 illustrates an OLED device fabricated using light emissive layers and light detecting layers. The OLED display device can include layers of light emission pixels and layers of light detection pixels. The light detection pixels can be used to detect ambient light and control the intensity of the light emission pixels. As with some of the other device constructions described herein, the formation of the OLED pixel layers can be done using the inventive microcapsule 10 fabrication method and/or a combination with other fabrication methods such as inkjet, spin coating, vacuum deposition, evaporation, etc. for forming an OLED organic stack 46.

Figure 62:
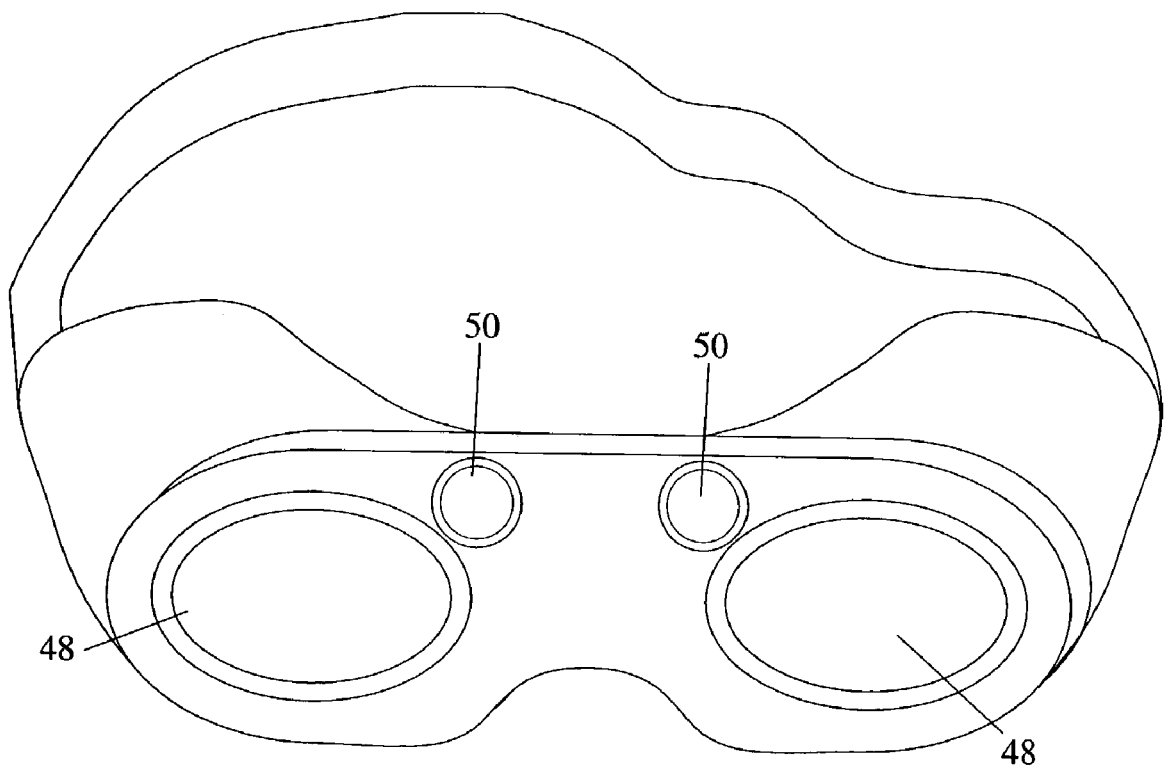
FIG. 62 illustrates stereoscopic goggles having OLED device elements.

FIG. 62 illustrates stereoscopic goggles having OLED display device elements 48. The photodetection pixels can be formed so as to effect a camera incorporated within the OLED display device elements 48. The camera optics can include lenses that change shape and/or focal point depending on whether the image is focusing on the human eye or the camera pixel elements. Alternatively, or in addition, CCD-type cameras 50 can be provided adjacent to the OLED display device elements 48.

Figure 63:
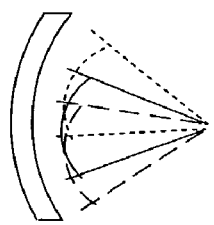
FIG. 63 illustrates a flexible OLED display having a curvature the compensates for the human eye's range of motion.

FIG. 63 illustrates a flexible OLED display having a curvature that compensates for the human eye's range of motion. The image displayed on the curved wraparound OLED display is refreshed so that the eye movement as well as the head movement of the user is accounted for. With this stereoscopic vision aide, the user's head movement can be determined by accelerometers and gyroscopic circuits. The eye movement is determined by reflecting IR (or some wavelength depending on the ambient light) off the retina and detecting the reflection by photodetectors which may be incorporated in the OLED display.

Figure 64:
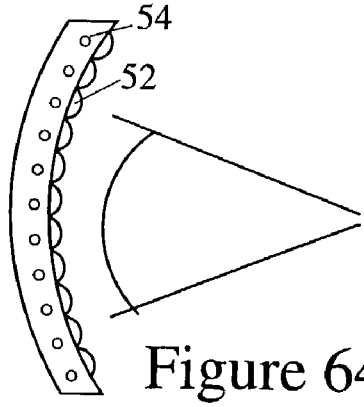
FIG. 64 illustrates a flexible OLED display having optical lens elements for focusing emitted light at the appropriate physical location within a human eye.

FIG. 64 illustrates a flexible OLED display having microlens elements 52 for focusing emitted light at the appropriate physical location within a human eye. An optical lens can be used to focus light onto CCD-type elements to create microlens elements 52 that focus the pixel light source 54 at the focus spot in the human eye. The optical properties of the microlens element 52 can compensate for vision problems.

Figure 65:
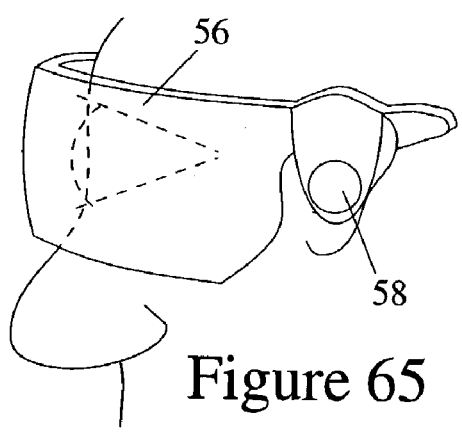
FIG. 65 illustrates a wraparound visor having a curved, flexible OLED display and speakers.

FIG. 65 illustrates a wraparound visor 56 having a curved, flexible OLED display and speakers 58. The inventive stereoscopic vision aid has a high resolution OLED display. The OLED display is shaped so that field of vision is as full as practical.

Figure 66:
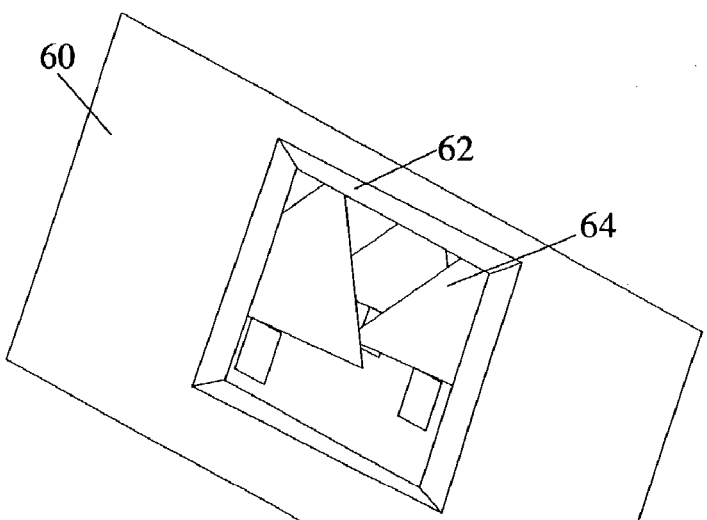
FIG. 66 illustrates a wall of a house having an inventive OLED display window, the window being driven so as to be transparent with trees outside the house visible through the window.

FIG. 66 illustrates a wall 60 of a house having an inventive OLED display window 62, the window 62 being driven so as to be transparent with trees 64 outside the house visible through the window 62. The inventive window 62 can be constructed along the lines of the OLED displays described herein. As will all of the applications for the inventive OLED technology, the various elements comprising the various versions of the invention described herein can be mixed and matched depending on the intended use for a particular OLED display. Thus, in this case, the inventive window 62 can be driven so that is transparent when needed, can be switched to being an emissive display (viewable from both or only one side), is selectively light blocking, and can be a full color, multi-color, monochrome or reflective display.

Figure 67:
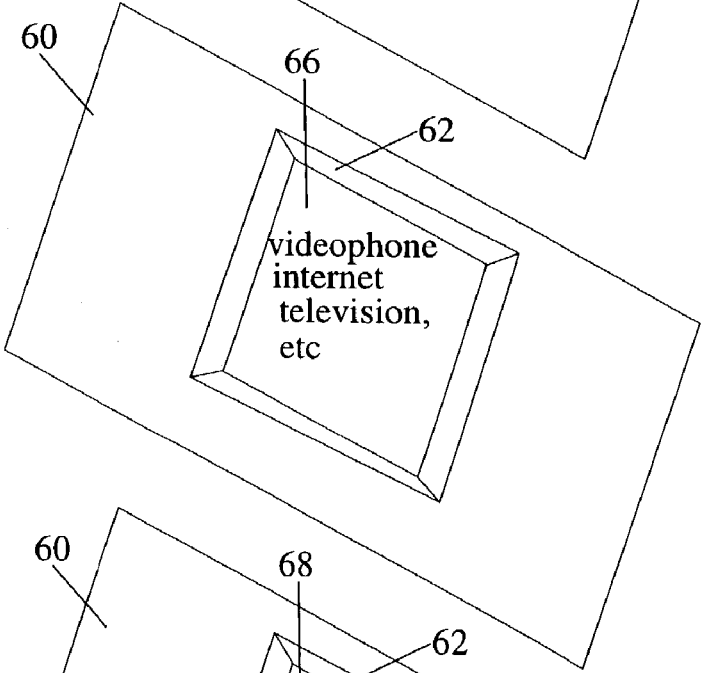
FIG. 67 illustrates the wall of a house having the inventive OLED display window, the window being driven so as to display multiple simultaneous video stream including video phone communication, Internet web page and a television program.

FIG. 67 illustrates the wall 60 of a house having the inventive OLED display window 62, the window 62 being driven so as to display multiple simultaneous video streams 66 including videophone communication, Internet web page and a television program. Multiple streams of display information 66 can be simultaneously received and displayed. For example, broadcast video content such as a television program may be shown at a first portion of the display, personalized video content, such as a videophone conversation may be shown at a second portion and a web page, including mapped hyperlink content, may be shown at a third portion. With an LCD light modulating layer, the content displayed on the inventive OLED display window 62 can be viewable from outside the house (from poolside, for example), or LCD light modulating layer can be controlled so that the emitted display light can be blocked from view from outside the house.

Figure 68:
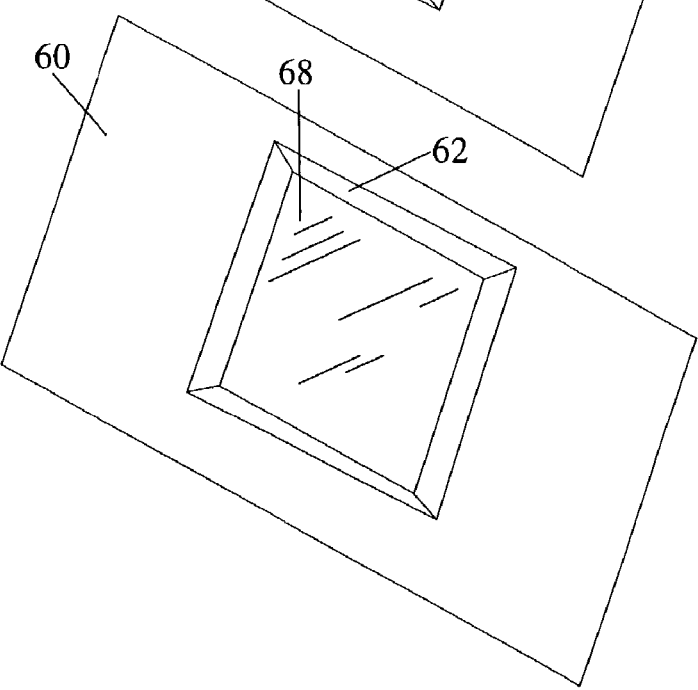
FIG. 68 illustrates the wall of a house having the inventive OLED display window, the window being driven so as to be a mirror.

FIG. 68 illustrates the wall 60 of a house having the inventive OLED display window 62, the window being driven so as to be a mirror. In this case, the LCD light modulating layer can be controlled to block light from being transmitted through the window. Further, as shown in FIG. 57, relatively high intensity light (such as from sun beaming onto the window) can be selectively blocked to prevent glare within the house and to keep the house cooler in the summer.

Figure 69:
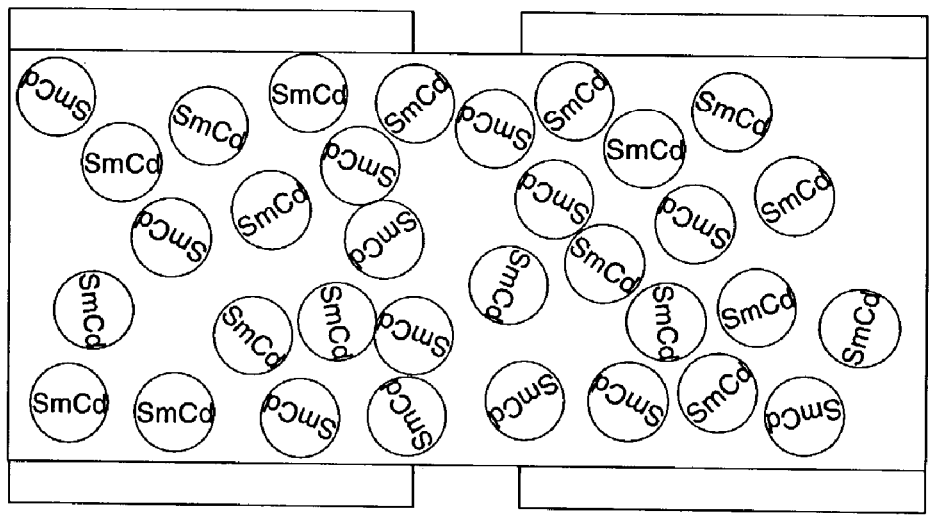
FIG. 69 illustrates an embodiment of the inventive light active device showing a semiconductor particulate randomly dispersed within a conductive carrier.

FIG. 69 illustrates an embodiment of the inventive light active device showing a semiconductor particulate randomly dispersed within a conductive carrier. A light active device includes a semiconductor particulate dispersed within a carrier material. The carrier material may be conductive, insulative or semiconductive and allows charges to move through it to the semiconductor particulate. The charges of opposite polarity moving into the semiconductive material combine to form charge carrier pairs. The charge carrier pairs decay with the emission of photons, so that light radiation is emitted from the semiconductor material. Alternatively, the semiconductor material and other components of the inventive light active device may be selected so that light received in the semiconductor particulate generates a flow of electrons. In this case, the light active device acts as a light sensor.

A first contact layer or first electrode is provided so that on application of an electric field charge carriers having a polarity are injected into the semiconductor particulate through the conductive carrier material. A second contact layer or second electrode is provided so that on application of the electric field to the second contact layer charge carriers having an opposite polarity are injected into the semiconductor particulate through the conductive carrier material. To form a display device, the first contact layer and the second contact layer can be arranged to form an array of pixel electrodes. Each pixel includes a portion of the semiconductor particulate dispersed within the conductive carrier material. Each pixel is selectively addressable by applying a driving voltage to the appropriate first contact electrode and the second contact electrode.

The semiconductor particulate comprises at least one of an organic and an inorganic semiconductor. The semiconductor particulate can be, for example, a doped inorganic particle, such as the emissive component of a conventional LED. The semiconductor particulate can be, for another example, an organic light emitting diode particle. The semiconductor particulate may also comprise a combination of organic and inorganic materials to impart characteristics such as voltage control emission, aligning field attractiveness, emission color, emission efficiency, and the like.

The electrodes can be made from any suitable conductive material including electrode materials that may be metals, degenerate semiconductors, and conducting polymers. Examples of such materials include a wide variety of conducting materials including, but not limited to, indium-tin-oxide ("ITO"), metals such as gold, aluminum, calcium, silver, copper, indium and magnesium, alloys such as magnesium-silver, conducting fibers such as carbon fibers, and highly-conducting organic polymers such as highly-conducting doped polyaniline, highly-conducting doped polypyrrole, or polyaniline salt (such as PAN-CSA) or other pyridyl nitrogen-containing polymer, such as polypyridylvinylene. Other examples may include materials that would allow the devices to be constructed as hybrid devices through the use of semiconductive materials, such as n-doped silicon, n-doped polyacetylene or n-doped polyparaphenylene.

Figure 70:
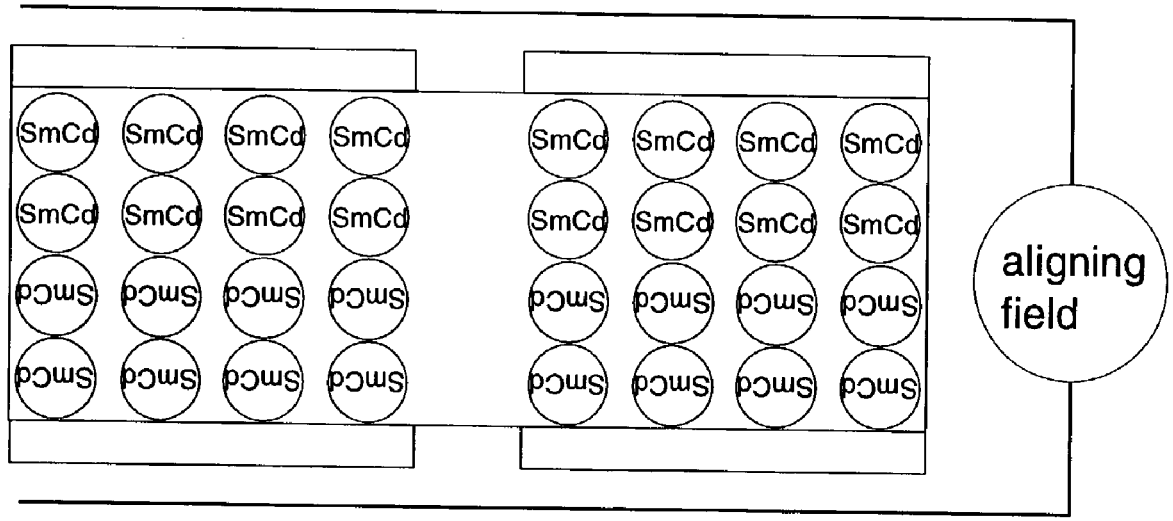
FIG. 70 illustrates an embodiment of the inventive light active device showing the semiconductor particulate aligned between electrodes.

As shown in FIG. 70, an embodiment of the inventive light active device may have the semiconductor particulate aligned between electrodes. The emissive particulate act as point light sources within the carrier material when holes and electrons are injected and recombine forming excitons. The excitons decay with the emission of radiation, such as light energy. In accordance with the present invention, the emissive particulate can be automatically aligned so that a significant majority of the point light sources are properly oriented and disposed between the electrodes (or array of electrodes in a display). This maximizes the light output from the device, greatly reduces cross-talk between pixels, and creates a protected emissive structure within the water, oxygen and contamination boundary provided by the cured carrier material.

In this case, the mixture disposed within the gap between the top and bottom electrodes includes a field reactive OLED particulate that is randomly dispersed within a fluid carrier. An aligning field is applied between the top electrode and the bottom electrode. The field reactive OLED particulate move within the carrier material under the influence of the aligning field. Depending on the particulate composition, carrier material and aligning field, the OLED particulate forms chains between the electrodes (similar to the particulate in an electrical or magnetic rheological fluid in an electric or magnetic field), or otherwise becomes oriented in the aligning field. The aligning field is applied to form a desired orientation of the field reactive OLED particulate within the fluid carrier. The fluid carrier comprises a hardenable material. It can be organic or inorganic. While the desired orientation of the field reactive OLED particulate is maintained by the aligning field, the carrier is cured to form a hardened support structure within which is locked in position the aligned OLED particulate.

Figure 71:
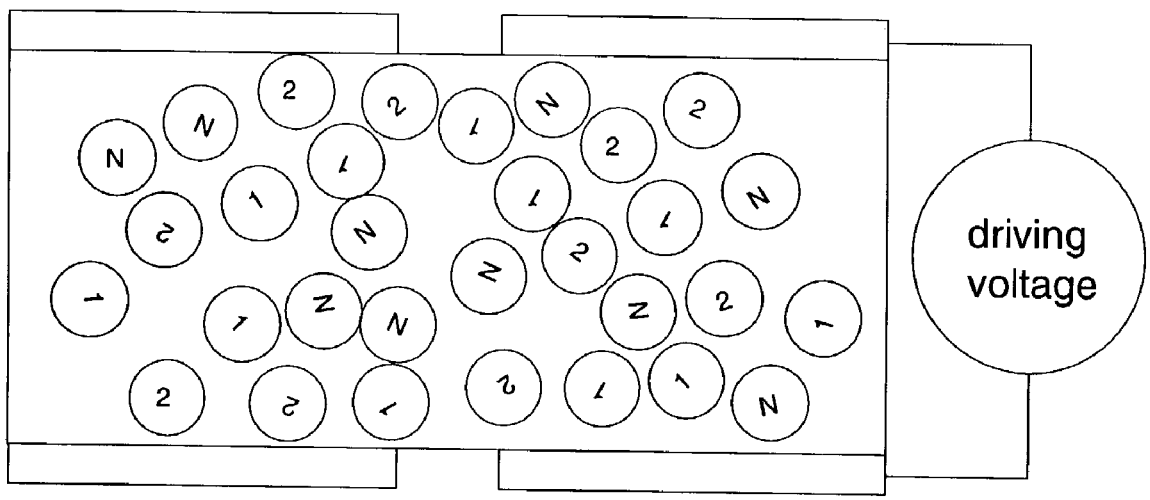
FIG. 71 illustrates an embodiment of the inventive light active device showing semiconductor particulate and other performance enhancing particulate randomly dispersed within the conductive carrier material.

FIG. 71 illustrates an embodiment of the inventive light active device showing semiconductor particulate and other performance enhancing particulate randomly dispersed within the conductive carrier material. The semiconductor particulate may comprise an organic light active particulate that includes at least one conjugated polymer. The conjugated polymers having a sufficiently low concentration of extrinsic charge carriers. An electric field applied between the first and second contact layers causes holes and electrons to be injected into the semiconductor particulate through the conductive carrier material. For example, the second contact layer becomes positive relative to the first contact layer and charge carriers of opposite polarity are injected into the semiconductor particulate. The opposite polarity charge carriers combine to form in the conjugated polymer charge carrier pairs or excitons which emit radiation in the form of light energy.

Depending on the desired mechanical, chemical, electrical and optical charactistics of the light active device, the conductive carrier material can be a binder material with one or more characteristic controlling additives. For example, the binder material may be a cross-linkable monomer, or an expoxy, or other material into which the semiconductor particulate can be dispersed. The characteristic controlling additives may be in a particulate and/or a fluid state within the binder. The characteristic controlling additives may include, for example, a desiccant; a conductive phase, a semiconductive phase, an insulative phase, a mechanical strength enhancing phase, an adhesive enhancing phase, a hole injecting material, an electron injecting material, a low work metal, a blocking material, and an emission enhancing material. A particulate, such an an ITO particulate, or a conductive metal, semiconductor, doped inorganic, doped organic, conjugated polymer, or the like can be added to control the conductivity and other electrical, mechanical and optical characteristics. Color absorbing dyes can be included to control the output color from the device. Florescent and phosphorescent components can be incorporated. Reflective material or diffusive material can be included to enhance the absorption of received light (in the case, for example, of a display or photodetector) or enhance the emitted light qualities. In the case of a solor collector, the random dispersal orientation of the particulate may be preferred because it will enable a solar cell to have light receiving particulate that are randomly oriented and the cell can receive light from the sun efficiently as it passes over head. The orientation of the particulate may also be controlled in a solar cell to provide a bias for preferred direction of capture light.

The characteristic controlling additives may also include materials that act as heat sinks to improve the thermal stability of the OLED materials. The low work metal additives can be used so that more efficient materials can be used as the electrodes. The characteristic controlling additives can also be used to improve the mobility of the carriers in the organic materials and help improve the light efficiency of the light emitting device.

Figure 72:
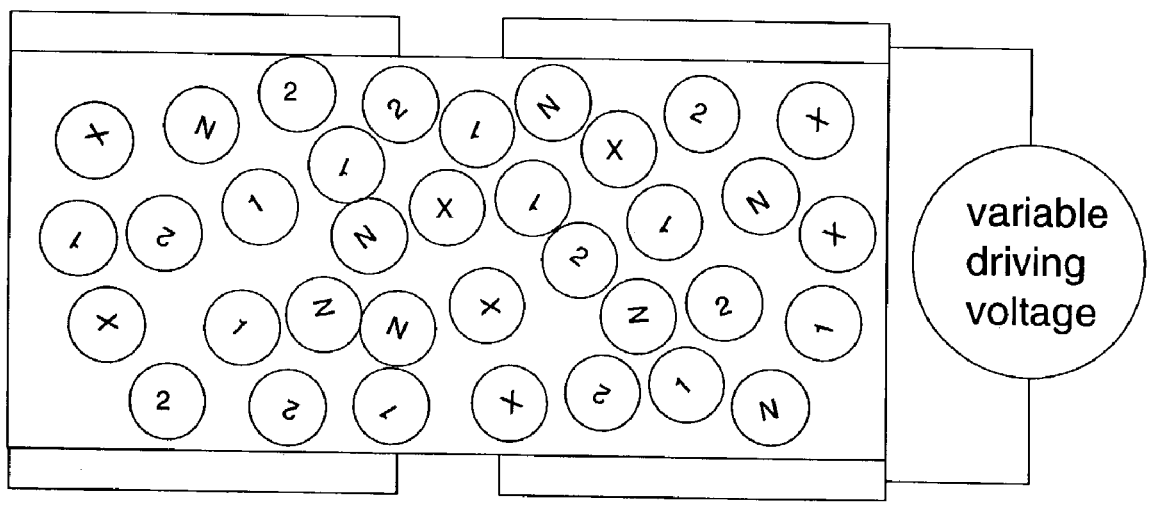
FIG. 72 illustrates an embodiment of the inventive light active device showing different species of organic light active particulate dispersed within a carrier material.

FIG. 72 illustrates an embodiment of the inventive light active device showing different species of organic light active particulate dispersed within a carrier material. The turn-on voltage for each species can be different in polarity and/or magnitude. Emissions of different wavelengths or colors can be obtained from a single layer of the mixture of the organic light active particulate and carrier material. The color, duration and intensity of the emission is thus dependent on the controlled application of an electric field to the electrodes. This structure has significant advantages over other full color or multicolor light devices, and can also be configured as a wide spectrum photodetector for applications such as cameras. The organic light active particulate can include organic and inorganic particle constituents including at least one of hole transport material, organic emitters, electron transport material, magnetic and electrostatic material, insulators, semiconductors, conductors, and the like. As is described herein, a multi-layered organic light active particulate can be formed so that its optical, chemical, mechanical and electrical properties are controlled by the various particle constituents.

Figure 73:
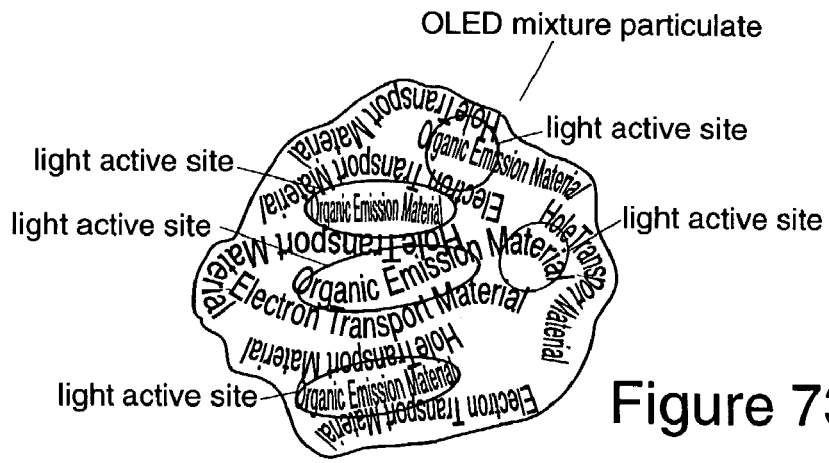
FIG. 73 illustrates an organic light active particle formed from a polymer blend.
Figure 74:
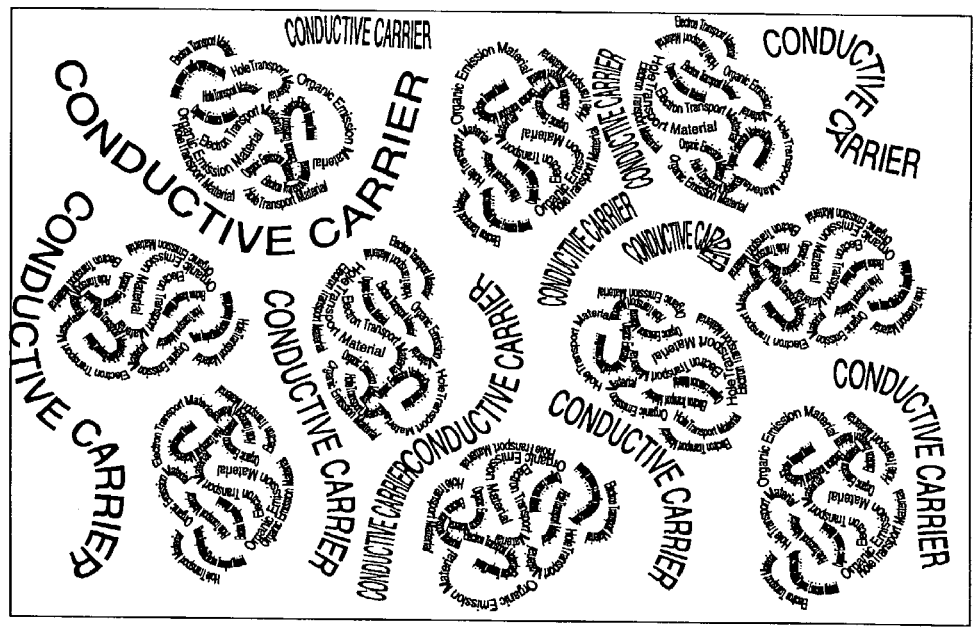
FIG. 74 illustrates the polymer blend organic light active particulate dispersed within a conductive carrier.
Figure 75:
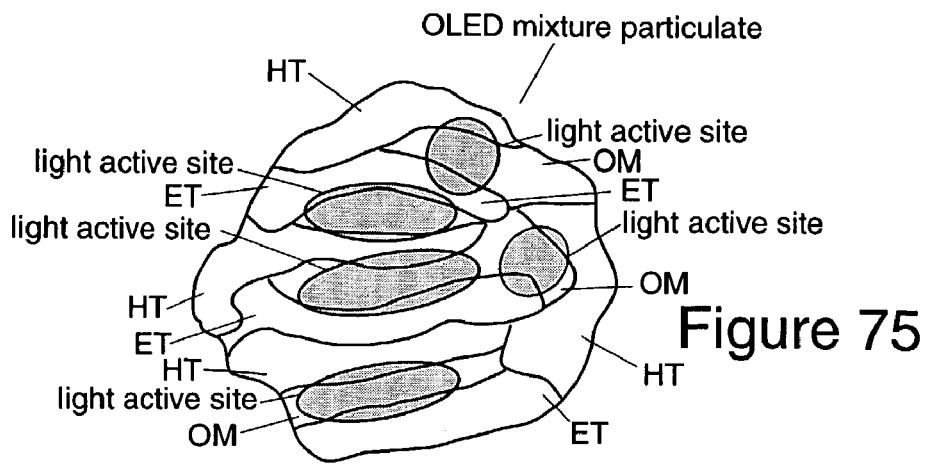
FIG. 75 illustrates the polymer blend organic light active particle showing light active sites.

FIG. 73 illustrates an organic light active particle formed from a polymer blend and FIG. 74 illustrates the polymer blend organic light active particulate dispersed within a conductive carrier. The organic light active particulate may includes particles comprised from a polymer blend, including at least one organic emitter blended with at least one of a hole transport material, an electron transport material and a blocking material. FIG. 75 illustrates the polymer blend organic light active particle showing light active sites. Upon the application of electrical field to the electrodes, sites within the polymer blend particle will act as point sources of light emissions. These light active sights are located where the appropriate constituents of the polymer blend meet so that electrons and holes injected into the semiconductor material combine into excitons and decay with the release of photons. The organic light active particulate may include microcapsules having a polymer shell encapsulating an internal phase. The internal phase and/or the shell can be comprised of the polymer blend including an organic emitter blended with at least one of a hole transport material, an electron transport material and a blocking material.

Nanoparticles are used in applications, such as drug deliver devices. Others have shown that very small polymer-based particles can be made by a variety of methods. These nanoparticles vary in size from 10 to 1000 nm. A drug can be dissolved, entrapped, encapsulated or attached to a nanoparticle matrix. Depending on the method of preparation, nanparticles, nanospheres or nanocapsules can be obtianed. (see, *Biodegradable Polymeric Nanoparticles as Drug Delivery Devices*, K. S., Soppimath et al., Journal of Controlled Release, 70(2001) 1-20, incorporated by reference herein). In accordance with the present invention, an OLED particulate can be formed having a very small particle size. The small particle size offers a number of advantages. For example, the ultimate resolution available of a display may be dependent on the size limitation of the OLED particles. Thus OLED nanoparticles utilized in accordance with the inventive fabrication methods will enable extremely high resolution display devices. Also, the very small OLED particle size will enable more light point sources within a given volume, such as the volume making up a display pixel. A large number of light point sources can result in more uniform pixel characteristics, longer device lifetimes and more efficient power consumption. In accordance with the present invention, various methods can be employed to form the OLED nanoparticles. The various methods disclosed in this reference for the formation of drug delivery nanoparticles can be adapted for the formation of OLED nanoparticles. These methods include the solvent evaporation method, spontaneous emulsification solvent diffusion method, salting out/emulsification-diffusion method, production of OLED nanoparticles using supercritical fluid technology, the polymerization of monomers, and nanoparticles prepared from hydophilic polymers.

FIG. 76 illustrates a polymer blend organic light active particulate having a field attractive constituent for aligning the particle in an aligning field. In this case, the particulate includes a field reactive material, such as a magnetically reactive speck. The magnetically reactive speck can be included in the particulate through an appropriate encapsulation, mixing, blending or coating technique.

FIG. 77 illustrates composite microcapsules containing multilayered organic light active particles, each having a different light wavelength emission and turn-on voltage.

The composite microcapsules or different species of particulate can be used to form a single layer voltage controlled light active device for emitting two or more colors of light. Instead of needing a separate set of electrodes and a separate layer of the semiconductor and carrier material mixture, the present invention enables a single layered device with a single pair of electrodes to controllably emit two or more colors of light.

FIG. 78 illustrates another composite microcapsule containing multilayered organic light active particles, at least one having a field attractive constituent. The field attractive constituent may be required to enable alignment of the particles between the driving electrodes. When an aligning field is applied, the field reactive OLED particulate move within the carrier material under the influence of the aligning field. The aligning field is applied to form a desired orientation of the field reactive OLED particulate within the fluid carrier.

FIG. 79 illustrates three light emitting microcapsule species, each species having a turn-on voltage controlled by the internal phase composition and the encapsulating shell composition. The shell may be formed of a polymer have a conductivity based on thickness and/or composition so that the specific turn-on voltage of the encapsulated conjugated polymer particulate is of a desired magnitude. By this additional turn-on voltage control enabled by the shell/internal phase electrical characteristics, the photons emitted by each species of conjugated polymer in response to an applied voltage can be tailored as required. The carrier fluid can be formulated so that it is more of an insulator prior to curing, and has the proper degree of conductivity after curing. In this case, the carrier fluid can act, more or less, like the oil in an oil/particulate electrical rheological fluid. The high voltage required to align the particulate between the electrodes can be applied without too much current passing through the particulate and burning them out. Once aligned, the electrical field can be reduced or eliminated as the carrier fluid cures. The carrier fluid can also have additives that affect the turn-on voltages of the different emitter species so that the appropriate number of photons is emitted from each point light source for each applied turn-on voltage.

Figure 80:
FIG. 80 illustrates an embodiment of the inventive voltage controlled light active device showing the composite microcapsule particulate randomly dispersed within a carrier.

FIG. 80 illustrates an embodiment of the inventive voltage controlled light active device showing the composite microcapsule particulate randomly dispersed within a carrier. The internal phase may be a polymer blend containing two or more conjugated polymers, each with a specific turn-on voltage for the controlled emission of color light. In an embodiment of a voltage controlled multi-colored light emitting device, a first electrode is provided with a second electrode disposed adjacent to it and defining a gap therebetween. A mixture of an organic light active particulate and a conductive carrier material is disposed within said gap. The organic light active particulate is comprised of first emitting particles including a first electroluminescent conjugated polymer. The first emitting particles emit a number of photons of a first color in response to a first turn-on voltage applied to the electrodes. The first emitting particles also a different number of photons, zero or more, of the first color in response to other turn-on voltages. The organic light active particulate further comprises second emitting particles including a second conjugated polymer. The second emitting particles emit a number of photons of a second color in response to a second turn-on voltage and a different number of photons of the second color in response to other turn-on voltages. Thus, in the case of a multi-colored diode or display, different colors are perceivable by the human eye depending on the applied turn-on voltage. The organic light active layer may also include third emitting particles including a third electroluminescent conjugated polymer. The third emitting particles emit a number of photons of a third color and/or intensity in response to a third turn-on voltage applied to the electrodes and a different number of photons of the third color and/or intensity in response to other turn-on voltages. A full color display can be obtained by having the first color red; the second color green and the third color blue. The composite microcapsule can contain three OLED particles or microcapsules, or it may be made from a conjugated polymers and other material, such as non-conjugated polymers, organic light active materials, field attractive materials, inorganic light active material, etc. Each emitter emits light of a specific color range, R, G or B. Each color particle is formulated so that it emits light when a voltage in a specific voltage range is applied between the electrodes. A plurality of composite microcapsules are dispersed within a carrier fluid. The carrier fluid may be a hardenable material, such as an epoxy, resin, curable organic or inorganic material, heat or light curable monomer, and the like.

Figure 81:
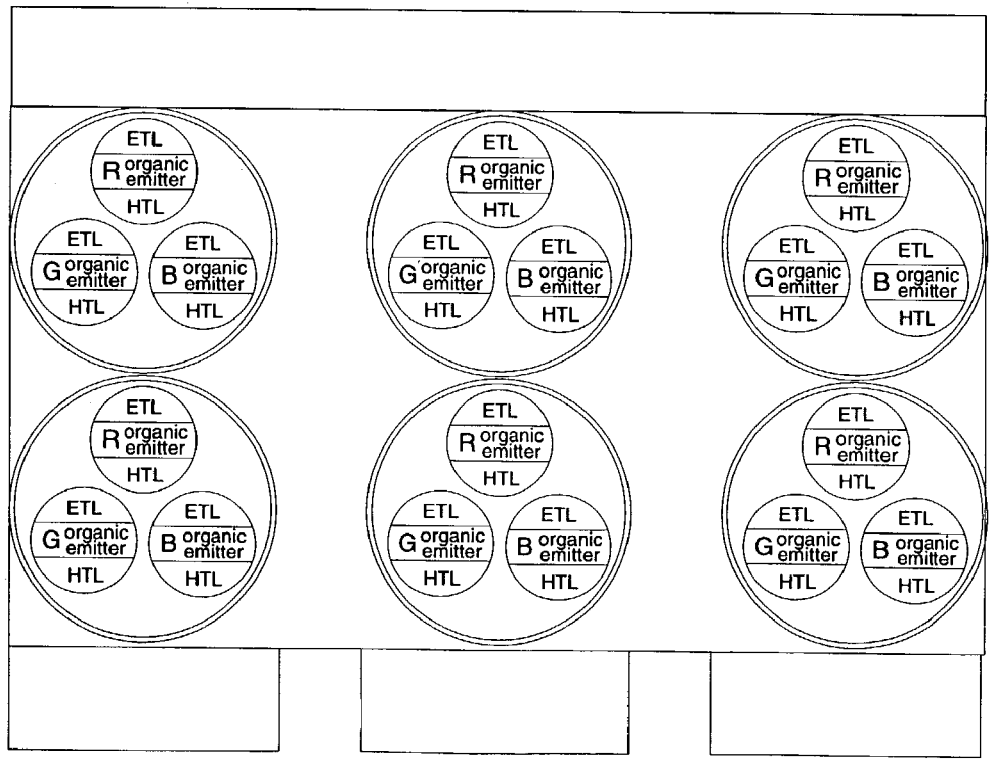
FIG. 81 illustrates an embodiment of the inventive voltage controlled light active device showing the composite microcapsule particulate aligned between electrodes.

FIG. 81 illustrates an embodiment of the inventive voltage controlled light active device showing the composite microcapsule particulate aligned between electrodes. An aligning field applied between the top electrode and the bottom electrode causes the field reactive OLED particulate to move under the influence of the aligning field. Depending on the particulate composition, carrier material and aligning field, the OLED particulate forms chains between the electrodes (similar to the particulate in an electrical or magnetic rheological fluid when an electrical or magnetic field is applied), or otherwise becomes oriented in the aligning field. The aligning field is applied to form a desired orientation of the field reactive OLED particulate within the fluid carrier. The fluid carrier may comprise a hardenable material. While the desired orientation of the field reactive OLED particulate is maintained by the aligning field, the carrier is cured to form a hardened support structure within which is locked in position the aligned OLED particulate.

Figure 82:
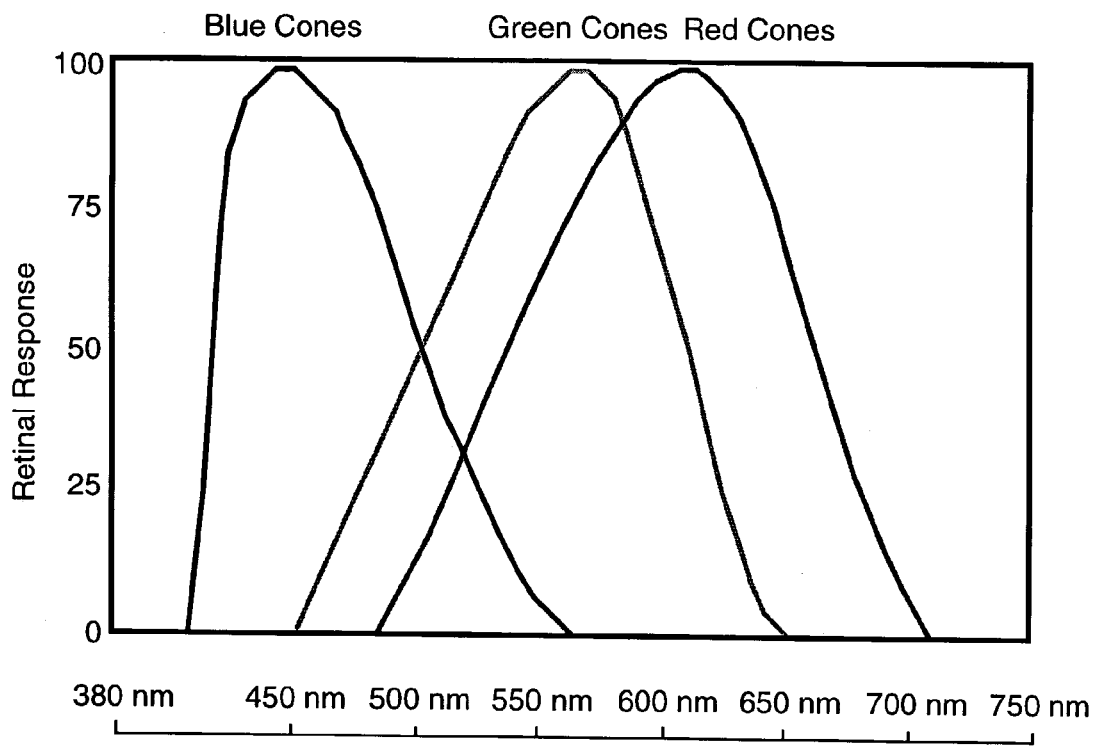
FIG. 82 illustrates the retinal response of the human eye to wavelengths of light in the visible spectrum.

FIG. 82 illustrates the retinal response of the human eye to wavelengths of light in the visible spectrum. When light enters the eye, it first passes through the cornea at the front of the eye and ultimately reaches the retina at the back of the eye. The retina is the light-sensing structure of the eye. The retina includes two types of cells, called rods and cones. Rods are responsible for vision in low light, and cones responsible for color vision and detail. There are three types of cones, each type responsive primarily to a specific segment of the visual spectrum. The light received by these rod and cone cells sets off complex chemical reactions. The chemical that is formed (activated rhodopsin) creates electrical impulses in the optic nerve. The brain interprets these electrical impulses in the visual cortex. The color-responsive chemicals in the cones are called cone pigments and are very similar to the chemicals in the rods. There are three kinds of color-sensitive pigments, red-sensitive pigment, green-sensitive pigment and blue-sensitive pigment Each cone cell has one of these pigments so that it is sensitive to that color. The human eye can sense almost any gradation of color when red, green and blue are mixed. Humans are able to perceive color throughout the visual spectrum because of the responsiveness of the three types of cones. Red absorbing cones absorb best at the relatively long wavelengths peaking at 565 nm. Green absorbing cones have a peak absorption at 535 nm and blue absorbing cones have a peak absorption at 440 nm. The three types of cones are each most responsive to different portions (R,G,B) of the visible spectrum, but the segment of responsiveness overlap. Light of a given wavelength (color), for example 500 nm (green), stimulates all three types of cones, but the green-absorbing cones will be stimulated most strongly.

Typically, a full color display has side by side RGB pixels and generates three simultaneous emissions of RGB colored light, producing a mixture of wavelengths of light. Color is perceived by the eye through the simultaneous stimulation of the three types of cones by the color light mixture. In accordance with the present invention, a color is obtained by driving a multi-color producing light active device with an emission cycle during which the appropriate number of photons of different colors are produced in successive bursts of light emissions. A predominance of photons of a color is produced during a burst of emission in response to the application of a turn-on voltage. Another burst of a predominance of photons of another color is produced in response to the application of a different turn-on voltage. A fraction of the emission cycle is determined during which each turn-on voltage is applied so that an appropriate number of photons for each color is produce for each burst. The eye perceives the desired color by the successive predominate stimulation of each type of cone cell. Color is obtained by the combination of Xd # of photons of Red+Yd # of photons of Green+Zd # of photons of Blue. It may turn out experimentally that other wavelengths of like can be used to stimulate the vision system to perceive variable colors from the burst emission of photons, in which case the number and wavelength of the different colors along the emissive spectrum can be employed.

The shell of each particle may be a controlling effect on the turn-on voltage of the encapsulated OLED. The composition of the encapsulated OLED controls the color of the light emitted. The shell thickness and composition can be controlled so that the turn-on voltage of each primary color particulate is distinct from the turn-on voltage of the others. For example, each RGB particle can have a specific shell structure selected so that when a high turn-on voltage is applied, the electrons move too slowly through the lower voltage shell and/or internal phase to cause complete or partial turn-on (i.e., reduced number of emitted photons) of the encapsulated emitter.

Each color emitter can be formulated so that it has a different threshold turn-on voltage and/or a different threshold turn-on pulse width and/or a different threshold turn-on polarity. As an example, since more electrons and holes move at higher voltage potential, the higher voltage emitter made to have a lower pulse width would emit the same number of photons as the lower voltage, longer pulse width emitters. But, even though the voltage threshold for lower voltage emitters is exceeded when the higher voltage emitter is driven, the pulse width of the higher voltage is too short to turn-on the lower voltage emitter. As an example, the hole and/or electron transport material can be formulated to slow down the progress of the electrons and holes in the lower voltage material so that even though more electrons and holes are injected at the higher voltage, are not able to cross through the material and recombine in the lower voltage emitter (the recombination of the holes and electrons results in a photon).

A variable DC/AC voltage/current source applies electrical energy to the electrodes. In response to the applied energy, light is emitted from the particulate through the top electrode. In an AC voltage application, each cycle has a predetermined voltage. With each cycle, a predominant color of light (for example, R, G, B) is emitted in response to the predetermined voltage (or no color is emitted). The color emitted depends on the turn-on voltage of the R, G or B particles. Dual color particles or tri color particles (or 4 colors, including IR, for example) are obtainable by the various known particulate construction techniques and those described herein. The AC cycles are fast enough that the eye perceives the desired color of the visible spectra. For example, rods and cones of the eye are stimulated by the three primary colors separately but in quick succession so that each frame of a video, for example, is perceived in full color. Because of the very fast turn-on times of the emitting particles, and the AC driving scheme, a passive matrix can be used while still obtaining superior video images. Each individual scan cycle of an electrode pair can have a large number of AC cycles. With each AC cycle, a particular predominant color is emitted. Thus, in each scan cycle, the eye see separate colored light bursts but the cones and rods are stimulated in such quick succession that a mix of the primary colors (or, if preferable other two or more colors) is perceived by the brain from the optic nerve.

By selecting the appropriate formula of the conductive carrier, it can be a hole transport vehicle and an electron transport vehicle. The organic emitter may not have to be a multilayered particulate, but rather, it may be just particles of pure organic emitter.

Depending on the configuration and composition of the various components, the inventive voltage controlled light active device can be AC driven, with the first turn-on voltage having a polarity and the second turn-on voltage having an opposite polarity. The different turn-on voltages can be a mix of voltages of different polarities and magnitudes.

The organic light active layer may also comprise at least one additional emitting particles containing another electroluminescent conjugated polymer. The additional emitting particles emitting a number of photons in response to a turn-on voltage and a different number of photons in response to other turn-on voltages. The photons emitted by the additional emitting particles can have a color that is within the visible spectrum. In this case, the additional emitting particles can enhance the visible display capabilities. For example, the intensity of the light emitted by one of the primary color emitters may become diminished because of the emitter service lifetime. Other emitters having the same color, but different turn-on voltage can be put into service to maintain the effectiveness of the total display. The photons emitted by the emitting particles may also be outside the range of the visible spectrum. For example, infra-red photons can be controllably emitted to enable stealth military application of the inventive display.

The voltage controlled organic light active device can be constructed as a display. In this case, the first electrode is part of an x-grid of electrodes and the second electrode is part of a y-grid of electrodes. The mixture of the organic light active particulate and the conductive carrier material in the gap between the first electrode and the second electrode make up an emissive component of a pixel of a display device.

As an example of voltage controlled emitter, the first and the second electroluminescent conjugated polymers may include a plurality of members selected from the group consisting of polythiophenes, poly(paraphenylenes), and poly(paraphenylene vinylene), at least some of said members having substituents selected from the group ocnsisting of alkyl, alkoxy, cycloalkyl, cycloalkoxy, flouroalkyl, alkylphenylene, and alkoxyphenylene vinylene.

An organic light active display device includes a substrate with a first grid of driving electrodes formed on the substrate. A second grid of electrodes is disposed adjacent to the first grid of electrodes and defining a gap therebetween. A mixture of an organic light active particulate and a conductive carrier material is disposed within the gap. The organic light active particulate comprising first particles including a first electroluminescent conjugated polymer having a first turn-on voltage and second particles including a second electroluminescent conjugated polymer having a second turn-on voltage different than the first turn-on voltage. When the first turn-on voltage is applied, a first color is emitted by the first electroluminescent conjugated polymer. Light having a second color is emitted by the second electroluminescent conjugated polymer in response to the second turn-on voltage applied to the first electrode and the second electrode.

Figure 83:
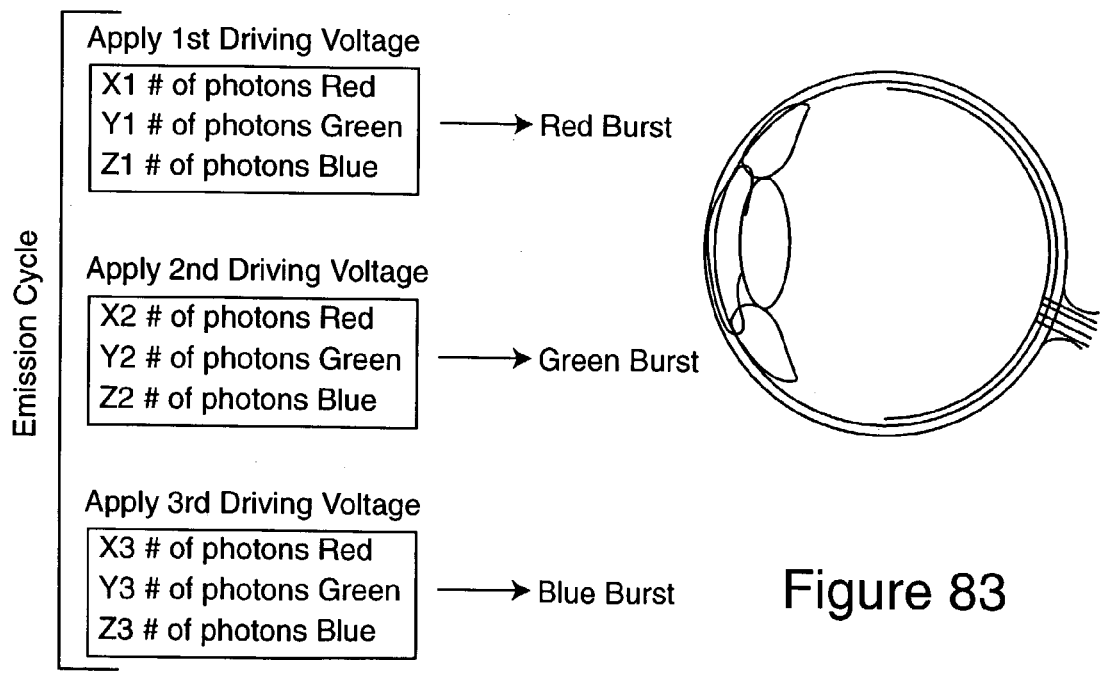
FIG. 83 illustrates the inventive primary color burst driving method for producing a perceived full color image by the rapid and sequential bursts of primary colored light emission.

FIG. 83 illustrates the inventive primary color burst driving method for producing a perceived full color image by the rapid and sequential bursts of primary colored light emission. In accordance with the present invention, a method is provided for driving a multi-color light emitting device, the multi-color light emitting device capable of emitting two or more colors in sequence. Each color is emitted in response to a respective different applied turn-on voltage. During an emission cycle, a first turn-on voltage is applied having a duration to the light emitting device so that a first burst of a predominant number of photons of a first color are emitted. A second turn-on voltage is then applied during the emission cycle having a duration and at least one of a magnitude and a polarity different than a magnitude and polarity of the first turn-on voltage. For the second turn-on voltage duration, a second burst of a predominant number of photons of a second color are emitted. In this way, during the emission cycle the first burst and the second burst occur in rapid succession. A human eye receiving the first burst and the second burst is stimulated to perceive a color that is different than the first color and the second color.

During the emission cycle, a third turn-on voltage can be applied having a duration and at least one of a magnitude and a polarity different than the magnitude and polarity of the other turn-on voltages. A third burst of a predominant number of photons of a third color are emitted. During the emission cycle, the first burst, the second burst and the third burst occur in rapid succession and the human eye receiving the bursts is stimulated to perceive a color different than the first color, the second color and the third color.

In accordance with the present invention, the first color is in the red portion of the visible spectrum, the second color is in the green portion of the visible spectrum and the third color is in the blue portion of the visible spectrum. The light emitting device is controlled so that the number of photons of each color emitted during each burst of the emission cycle results in a predetermined color within the visible spectrum being perceivable by the human eye. Even though there is not the three simultaneous emissions of R,G,B emitted by a typical full color display, in accordance with the present invention the burst emission results in the perception of a predetermined color in the visible spectrum.

Figure 84:
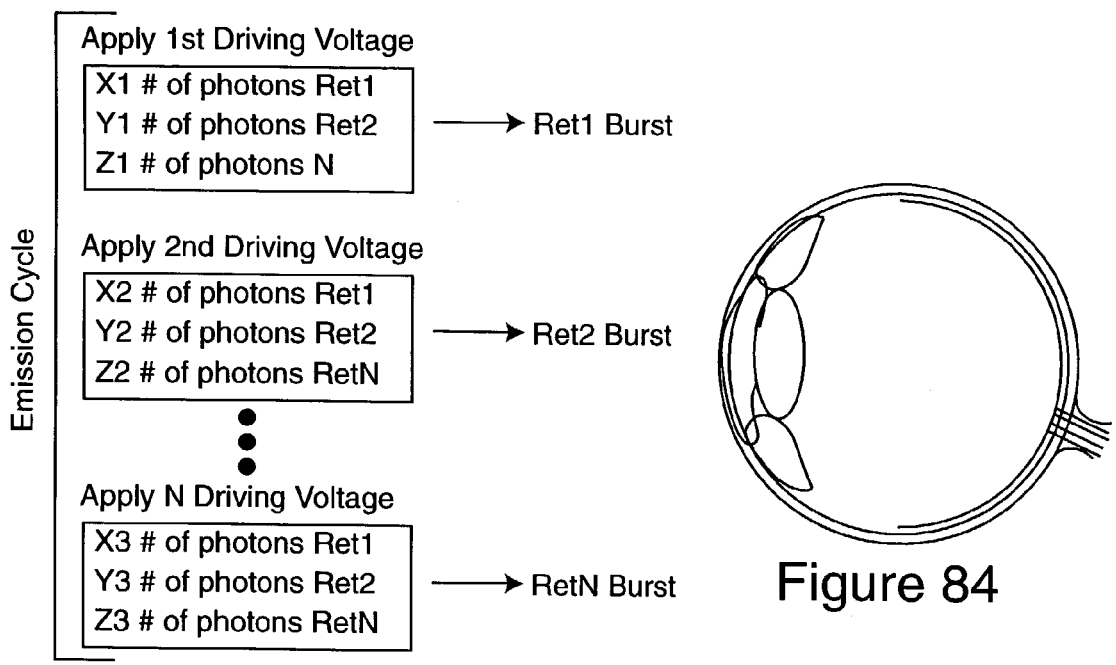
FIG. 84 illustrates the inventive retinex burst driving method for producing a perceived full color image by the rapid and sequential bursts of colored light emission.

FIG. 84 illustrates the inventive retinex burst driving method for producing a perceived full color image by the rapid and sequential bursts of colored light emission. In accordance with another aspect of the present invention, the intensity, duration and color emitted by the multi-color light emitting device is adjusted according to a retinex display operation. Edwin Land introduced a theory of color vision based on center/surround retinex (see, An Alternative Technique for the Computation of the Designator in the Retinex Theory of Color Vision," Proceedings of the National Academy of Science, Volume 83, pp. 3078-3080, 1986). Land disclosed his retinex theory in "Color Vision and The Natural Image," Proceedings of the National Academy of Science, Volume 45, pp. 115-129, 1959. These retinex concepts are models for human color perception. The earlier retinex concepts involved the computations based on when color boundaries were crossed in the light emitted from an image. Land's retinex concept of human vision has a center/surround spatial computation with a center having 2-4 arc-minutes in diameter and a surround that is an inverse square function with a diameter of about 200-250 times that of the center. Others have shown that a digital image can be improved utilizing the phenomenon of retinex (see, U.S. Pat. No. 5,991,456 issued to Rahman et al, the disclosure of which is incorporated by reference herein). The inventors of the U.S. Pat. No. 5,991,456 patent used Land's retinex theory and devised a method of improving a digital image where the image is initially represented by digital data indexed to represent positions on a display. The digital data is indicative of an intensity value $I_i$ (x,y) for each position (x,y) in each i-th spectral band. The intensity value for each position in each i-th spectral band is adjusted to generate an adjusted intensity value for each position in each i-th spectral band in accordance with an equation based on the total number of unique spectral bands. A surround function is used to improve some aspect of the digital image, e.g., dynamic range compression, color constancy, and lightness rendition. The adjusted intensity value for each position in each i-th spectral band is filtered with a common function. According to the inventors of the U.S. Pat. No. 5,991,456 patent, an improved digital image can then be displayed based on the adjusted intensity value for each i-th spectral band so-filtered for each position.

Figure 85:
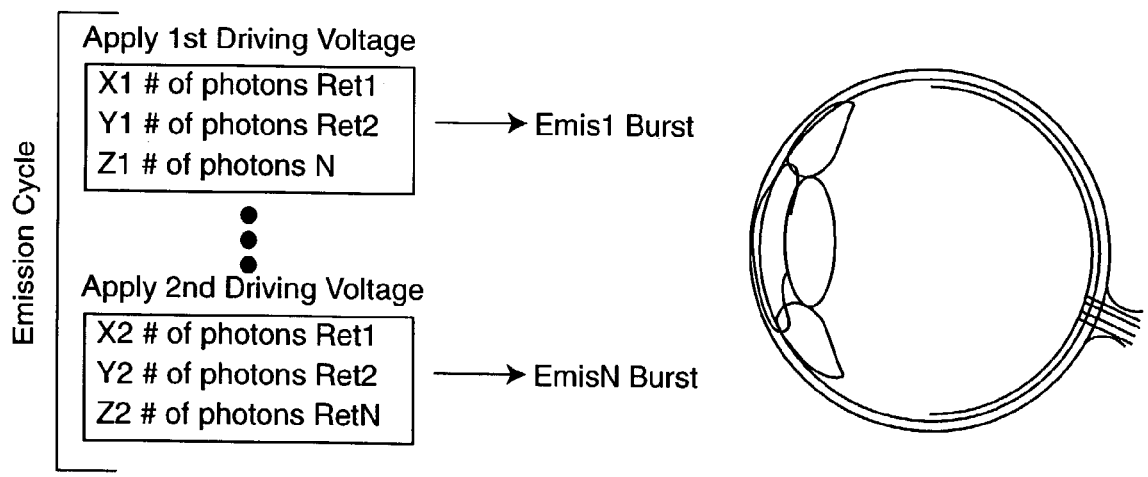
FIG. 85 illustrates the inventive adjusted color burst driving method for producing a perceived full color image by the rapid and sequential bursts of adjusted colored light emission.

FIG. 85 illustrates the inventive adjusted color burst driving method for producing a perceived full color image by the rapid and sequential bursts of adjusted colored light emission. The retinex display operation may include the steps of providing digital data indexed to represent positions on a display. The digital data is indicative of an intensity for each position in each spectral band. The intensity of each position in each spectral band is adjusted to generate an adjusted intensity value in accordance with a predetermined mathematical equation. The adjusted intensity value is filtered for each position with a common function. The turn-on voltages are controlled so that the emission of photons of each color is based on the adjusted intensity value for each filtered spectral for each position.

Figure 87:
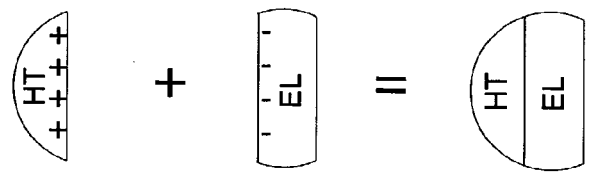
FIG. 87 illustrates a layered organic light active material particulate formed by the commingling of a particle of hole transport material with a particle of emissive layer material.
Figure 88:
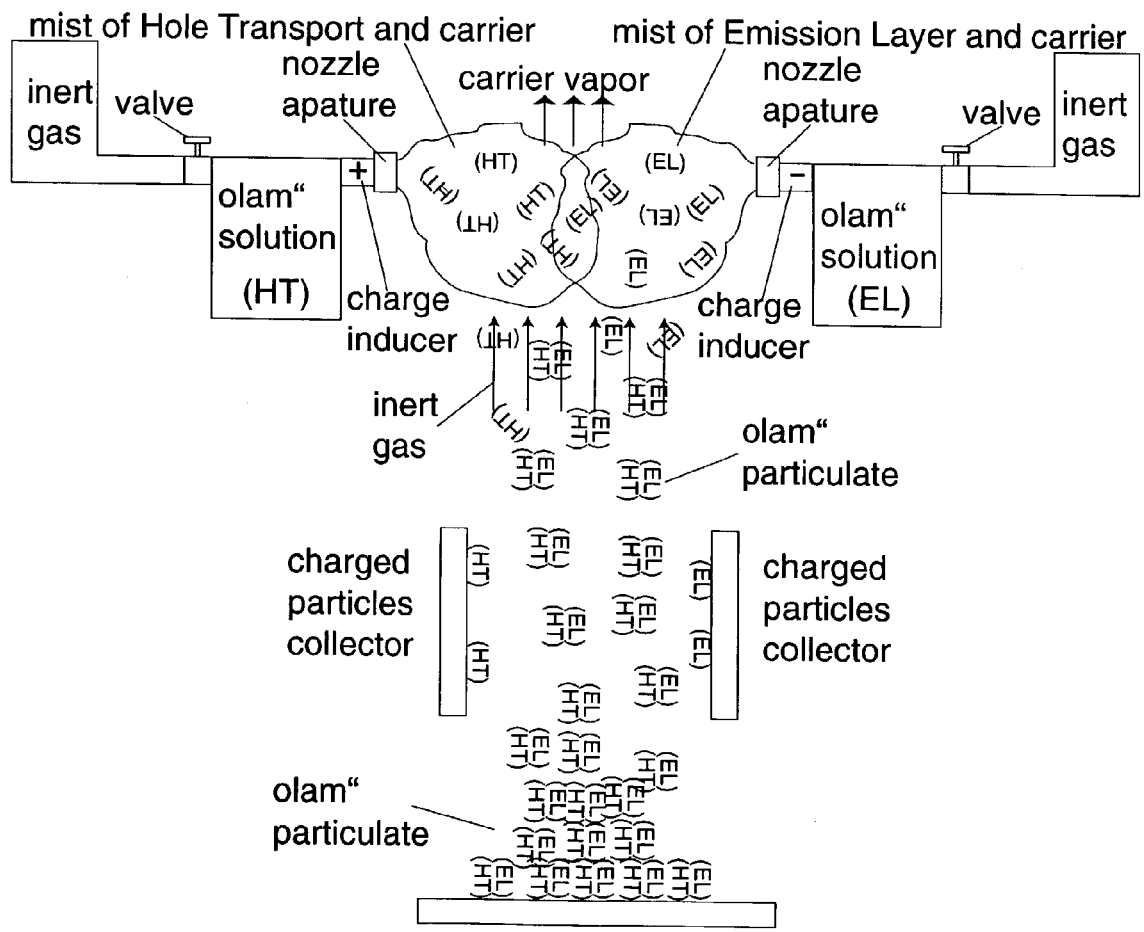
FIG. 88 illustrates the inventive method of forming a layered organic light active material particulate from a hole transport constituent and an emissive layer constituent.

FIG. 86 is a flow chart showing the steps of the inventive method for forming a multilayered organic light active material particulate. FIG. 87 illustrates a layered organic light active material particulate formed by the commingling of a particle of hole transport material with a particle of emissive layer material. In this example, the first mist comprises a hole transport material (HT) and carrier, and the second mist comprises an emission layer material (EL) and carrier. FIG. 88 illustrates the inventive method of forming a layered organic light active material particulate from a hole transport constituent and an emissive layer constituent. Referring to FIGS. 86-88, a first mixture ((HT) and carrier) is formed of a first organic light active component material and a first carrier fluid (step one). A second mixture ((EL) and carrier) is formed of a second organic light active component material and a second carrier fluid (step two). A first mist is generated of the first mixture in an environment so that a first particulate of the first organic light active component material is temporarily suspended in the environment (step three). A second mist of the second mixture is generated in the environment so that a second particulate of the second organic light active component material is temporarily suspended in the environment (step four). The first particulate and the second particulate are allowed to commingle and attract together in the environment to form a first layered organic light active material particulate ((HT)(EL)) (step six). The layered organic light active particulate has a first layer of the first organic light active component material and a second layer of the second organic light active component material.

Figure 89:
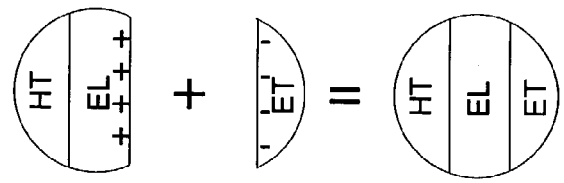
FIG. 89 illustrates a multi-layered organic light active material particulate formed by the commingling of a layered particle of hole transport/emissive layer material with a particle of electron transport material.
Figure 90:
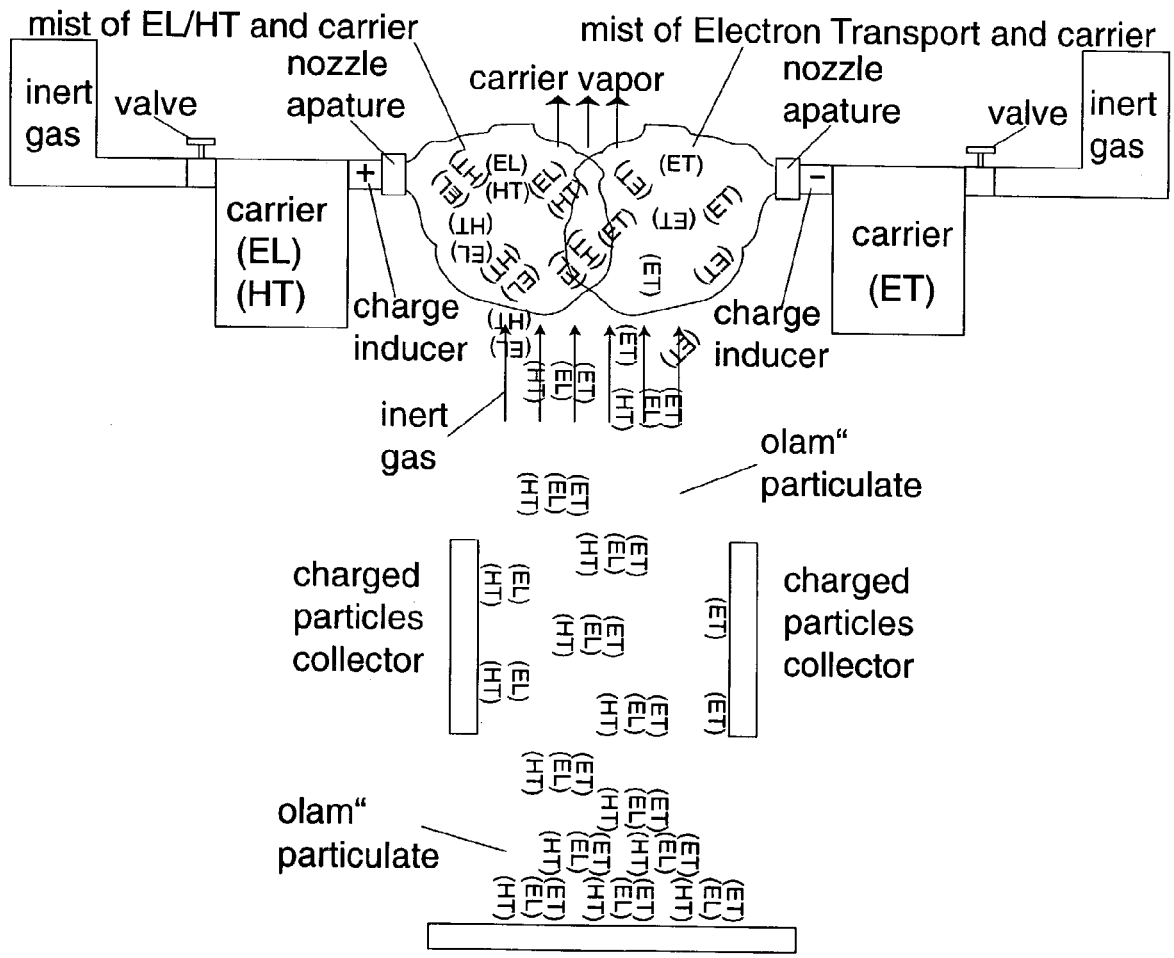
FIG. 90 illustrates the inventive method of forming a multi-layered organic light active material particulate from a hole transport/emissive layer constituent and an electron transport constituent.

FIG. 89 illustrates a multi-layered organic light active material particulate formed by the commingling of a layered particle of hole transport/emissive layer material with a particle of electron transport material. FIG. 90 illustrates the inventive method of forming a multi-layered organic light active material particulate from a hole transport/emissive layer constituent and an electron transport constituent. An organic light active material particulate can be formed having multiple layers. A third mixture is formed of a third organic light active component material (ET) and a third carrier fluid. A fourth mixture is formed of the first layered organic light active material particulate ((HT)(EL)) and a fourth carrier fluid. A mist of the third mixture is generated in the environment so that a third particulate of the third organic light active component material is temporarily suspended. A mist of the fourth mixture is generated so that the first layered organic light active material particulate is temporarily suspended in the environment. The third particulate and the first layered organic light active material particulate are allowed to commingle and attract together in the environment to form a second layered organic light active material particulate. This second layered organic light active material particulate includes the first organic light active material particulate and the third organic light active component material. Thus the resulting organic light active material particulate has a multilayered structure that includes all three of the organic light active component materials arranged in a desired order ((HT)(EL)(ET)).

Figure 93:
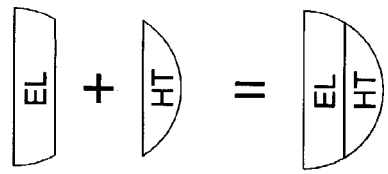
FIG. 93 illustrates a layered organic light active material particulate formed by the commingling of a particle of emissive layer material with a particle of hole transport material.
Figure 94:
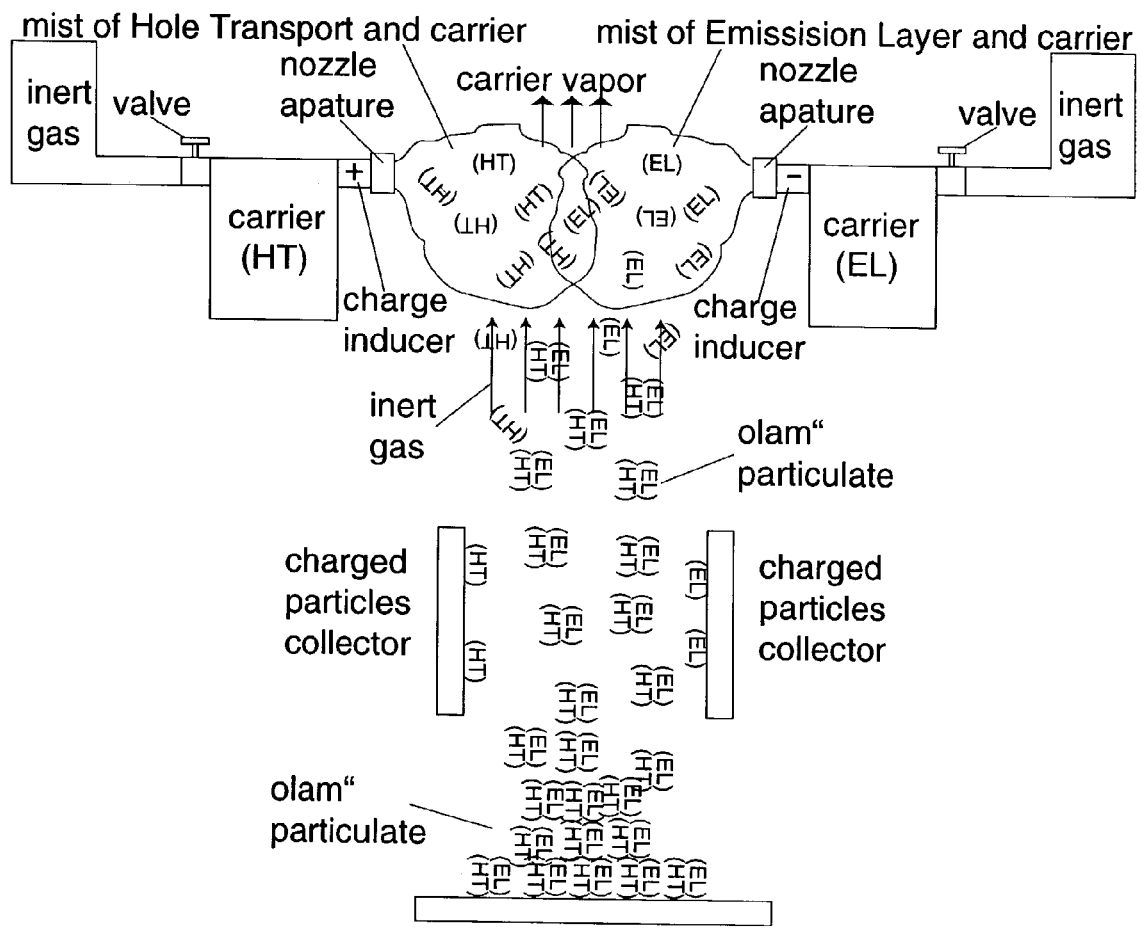
FIG. 94 illustrates the inventive method of forming a layered organic light active material particulate from an emissive layer constituent and a hole transport constituent.
Figure 95:
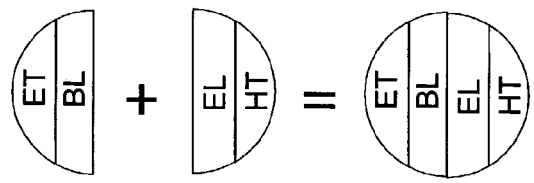
FIG. 95 illustrates a multi-layered organic light active material particulate formed by the commingling of a layered particle of blocking/electron transport material with a layered particle of emissive layer/hole transport material.
Figure 96:
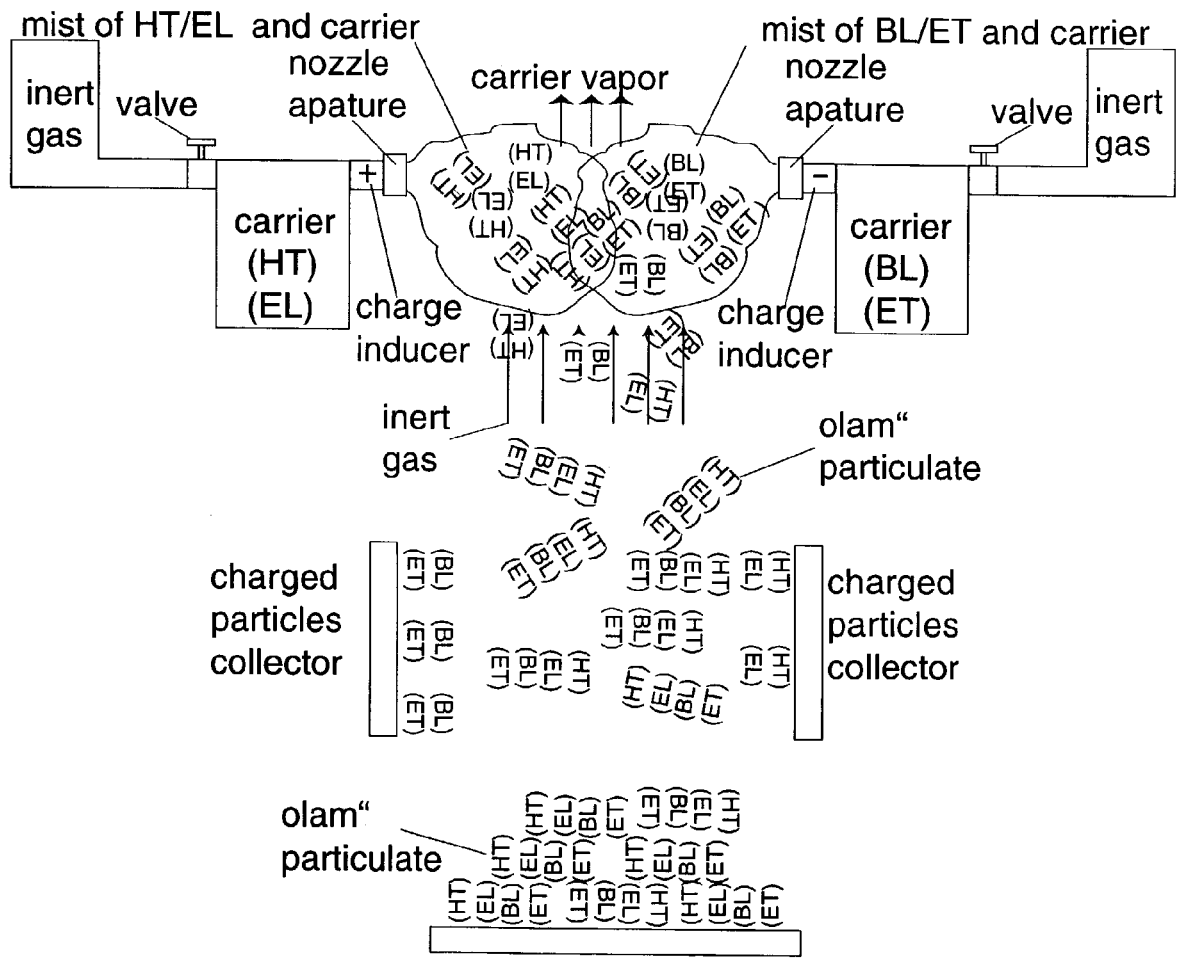
FIG. 96 illustrates the inventive method of forming a multi-layered organic light active material particulate from a blocking/electron transport constituent and a hole transport/emissive layer constituent.
Figure 97:
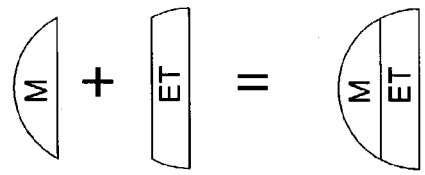
FIG. 97 illustrates a layered organic light active material particulate formed by the commingling of a particle of field attractive material with a particle of electron transport material.
Figure 98:
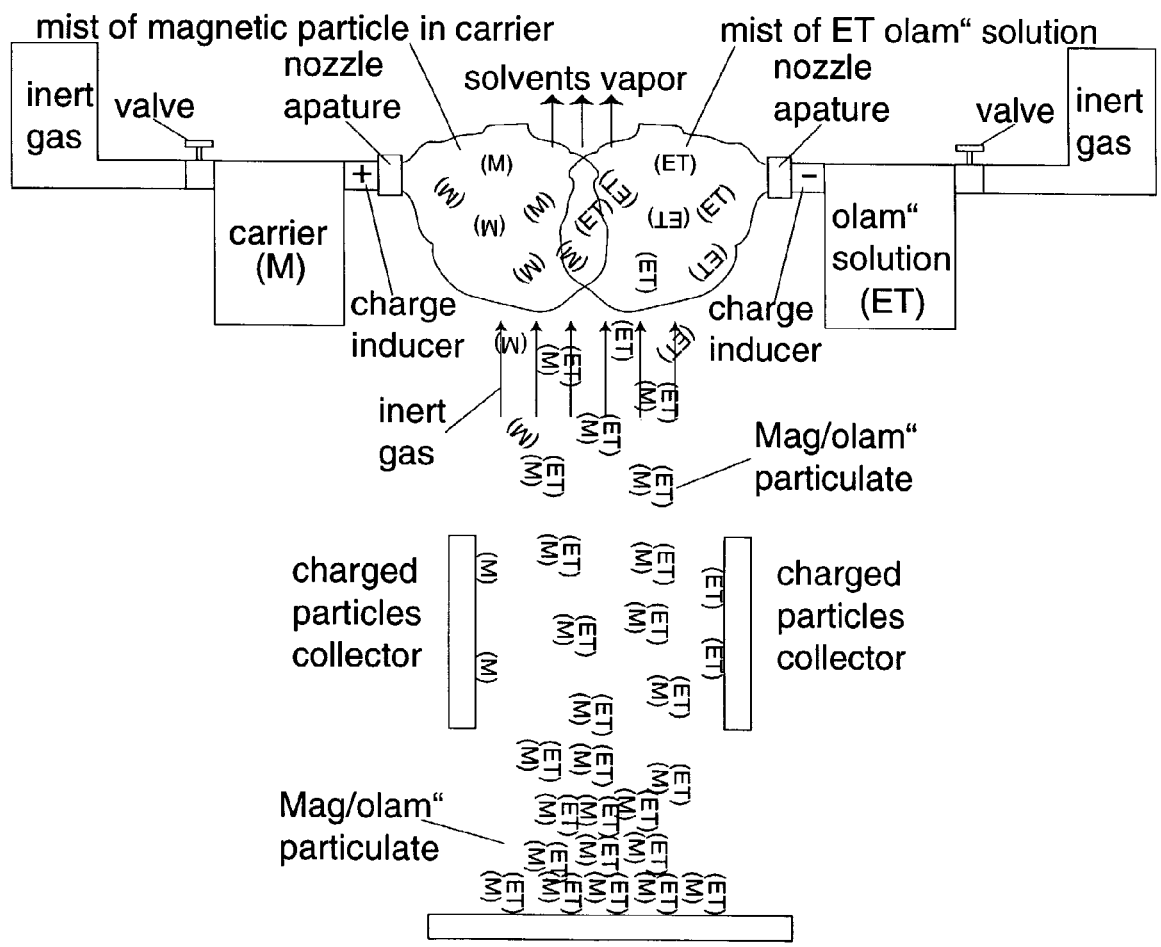
FIG. 98 illustrates the inventive method of forming a layered organic light active material particulate from a field attractive constituent and an electron transport constituent.
Figure 99:
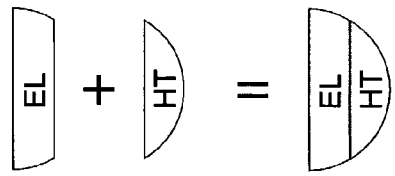
FIG. 99 illustrates a layered organic light active material particulate formed by the commingling of a particle of emissive layer material with a particle of hole transport material.
Figure 100:
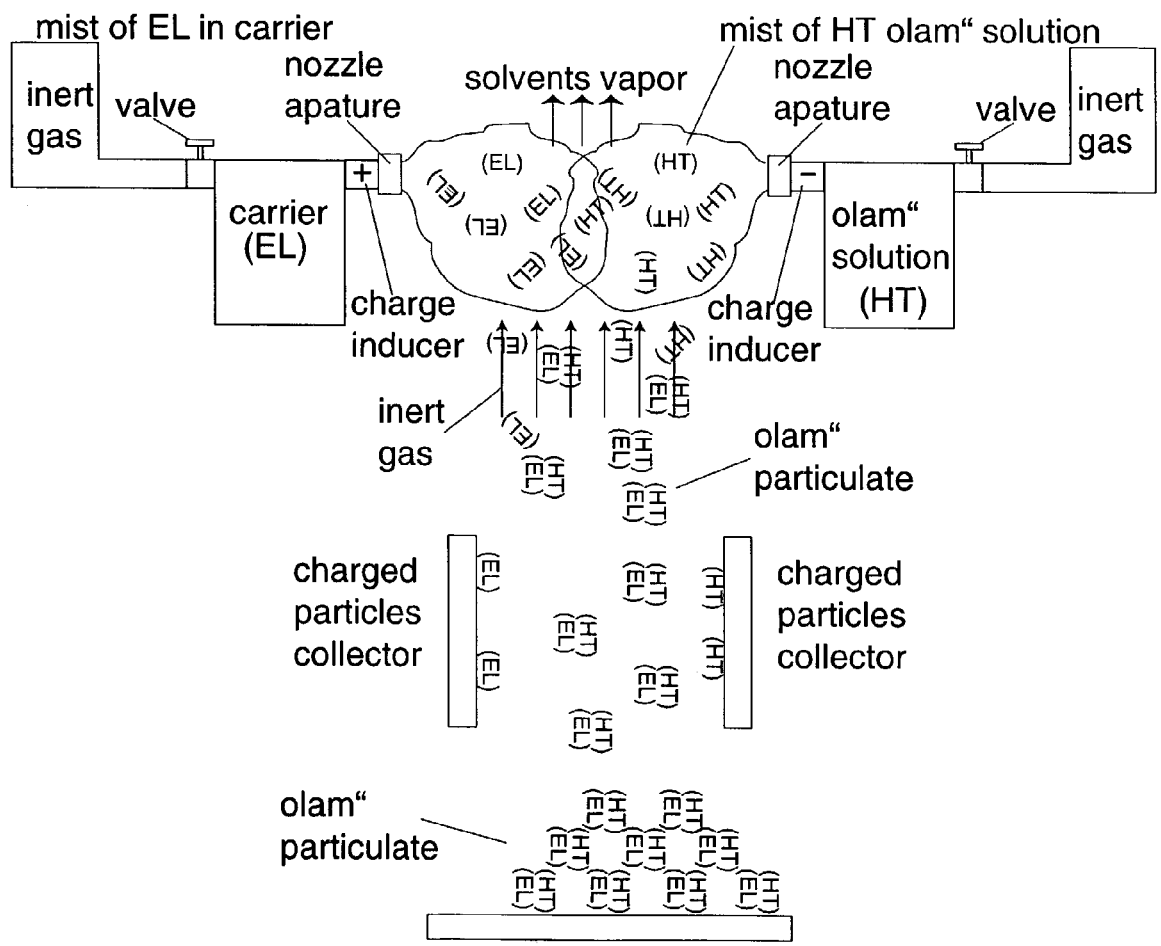
FIG. 100 illustrates the inventive method of forming a layered organic light active material particulate from an emissive layer constituent and a hole transport constituent.
Figure 101:
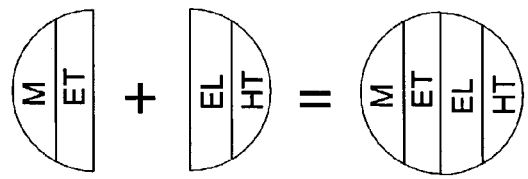
FIG. 101 illustrates a multi-layered organic light active material particulate formed by the commingling of a layered particle of field attractive/electron transport material with a layered particle of emissive layer/hole transport material.
Figure 102:
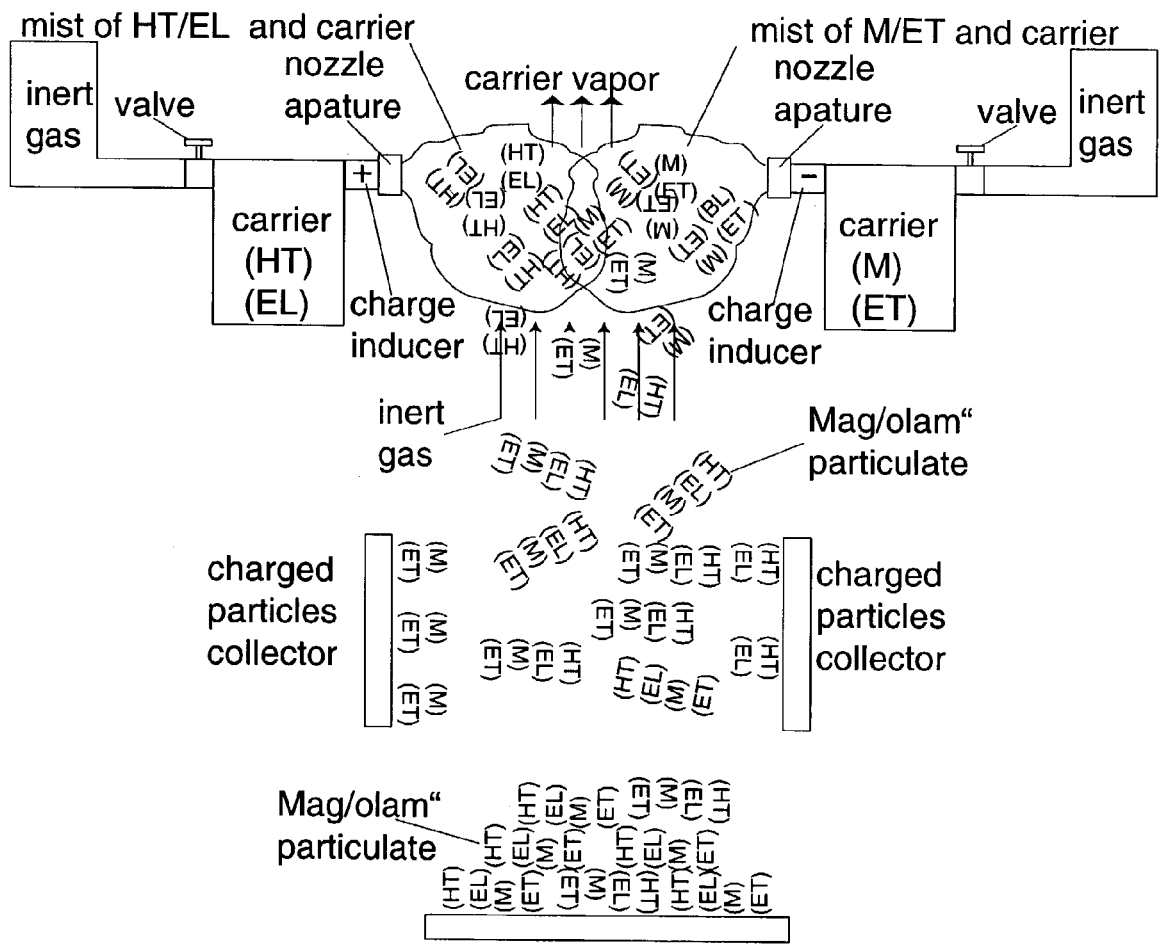
FIG. 102 illustrates the inventive method of forming a multi-layered organic light active material particulate from a field attractive/electron transport constituent and a hole transport/emissive layer constituent.

In accordance with the present invention, a multilayered particulate structure can be obtained for obtaining electrophosphorescent OLED particulate. FIG. 91 illustrates a layered organic light active material particulate formed by the commingling of a particle of blocking material with a particle of electron transport material. FIG. 92 illustrates the inventive method of forming a layered organic light active material particulate from a blocking constituent and an electron transport constituent. FIG. 93 illustrates a layered organic light active material particulate formed by the commingling of a particle of emissive layer material with a particle of hole transport material. FIG. 94 illustrates the inventive method of forming a layered organic light active material particulate from an emissive layer constituent and a hole transport constituent. FIG. 95 illustrates a multi-layered organic light active material particulate formed by the commingling of a layered particle of blocking/electron transport material with a layered particle of emissive layer/hole transport material. FIG. 96 illustrates the inventive method of forming a multi-layered organic light active material particulate from a blocking/electron transport constituent and a hole transport/emissive layer constituent. As shown in FIGS. 89-96, a multi-layered particle can be built up having the constituent parts ordered in a desired manner so that the multi-layered particle is an effective point source light emitter.

Additional layers can be added to the multilayered structure by forming another mixture of another organic light active component material and another carrier fluid and forming yet another mixture of a previously formed layered organic light active material particulate and yet another carrier fluid. The resulting particles are suspended in the environment as described above and allowed to commingle and attract together to form the multilayered particulate structure.

At least one of the first, second and subsequent organic active component material may comprise at least one of a hole transport material, an emission layer material, an electron transport material, and a blocking material. Other organic active component material can include at least one of a magnetic material, an electrostatic material, a desiccant, hole injecting material, and an electron injecting material. Thus, a selection of constituents can be made so that a multilayered particulate structure can be formed having desired electrical, optical, mechanical, field attractive and chemical properties.

FIG. 97 illustrates a layered organic light active material particulate formed by the commingling of a particle of field attractive material with a particle of electron transport material. FIG. 98 illustrates the inventive method of forming a layered organic light active material particulate from a field attractive constituent and an electron transport constituent. FIG. 99 illustrates a layered organic light active material particulate formed by the commingling of a particle of emissive layer material with a particle of hole transport material. FIG. 100 illustrates the inventive method of forming a layered organic light active material particulate from an emissive layer constituent and a hole transport constituent. FIG. 101 illustrates a multi-layered organic light active material particulate formed by the commingling of a layered particle of field attractive/electron transport material With a layered particle of emissive layer/hole transport material. FIG. 102 illustrates the inventive method of forming a multi-layered organic light active material particulate from a field attractive/electron transport constituent and a hole transport/emissive layer constituent. As shown in FIGS. 97-102, the point source light emitting particulate can be field attractive by the inclusion of a material, such as a magnetically reactive material, as one of the constituents of the particulate.

At least one of the first and the second and subsequent carrier fluids may be a solvent of the organic light active component material, and the solvent removed by evaporation or otherwise to leave the particulate suspended in the environment. Alternatively, a precipitation can be obtained by a suitable chemical reaction depending on the component material and the solvent. The chemical reaction may be caused by the addition of material to the solution prior to of after forming the mist. The chemical reaction may be caused by the carrier material of the opposing mist, or the precipitating material may be otherwise applied when the solution is in the mist form.

The first, second and subsequent organic light active component material may a fine particulate insoluble in the respective first, second and subsequent carrier fluids. The third and subsequent organic light active particulate may be a multi-layered organic light active material particulate, which may be formed by the inventive method, microencapsulation, chemical reaction of two or more constituents, electric or magnetic attraction of two or more constituents, or other means for forming a multi-layered organic light active material particulate. The organic light active material particulate formed in accordance with the inventive method may also be encapsulated in a shell to impart chemical, magnetic, electrical or optical attributes to the particulate. For example, in the case of a voltage controlled emitter, the microcapsule shell can be composed of a material selected to prevent unwanted photon emission from the internal phase emitter, and/or to promote wanted photon emission from the emitter, depending on the applied turn-on voltage.

The environment in which the particulate is formed can be an inert gas, reactive gas, a vacuum, a liquid or other suitable medium. For example, it may advantageous for the environment to include elements that perform a catalytic function to promote a chemical reaction in or between the constituents in the mists. A characteristic enhancing treatment may be performed on the formed layered organic light active material particulate. The treatment may be a temperature treatment, a chemical treatment, a light energy treatment to cause, for example, light activated cross-linking, or other characteristic enhancing treatment to impart desired attributes to the formed particulate.

The constituents that attract and form the particulate may be given a charge to encourage the commingling into the particulate. For example, the first mist may be given a charge have a polarity and the second mist given a charge having an opposite polarity. The electrical attraction is thus enhanced between the first organic light active particulate and the second organic light active particulate.

FIG. 103 is a cross section of a coated cathode fiber having a blocking layer formed on the cathode fiber and an electron transport layer formed on the blocking layer. FIG. 104 is a cross section of a coated anode fiber having a hole transport layer formed on the anode fiber and an emissive layer formed on the hole transport layer.

FIG. 105 illustrated the coated cathode fiber and the coated anode fiber twisted together to form an emissive fiber. In accordance with this aspect of the invention, a conductive fiber is coated with the organic light emitting material. A single conductive fiber can be coated with all or any number of the layers of the organic stack, including a blocking layer, electron transport layer, emissive layer, hole transport layer, etc. A second conductor can then be formed over the organic stack, such as ITO, so that light generated in the organic stack is emitted through the transparent ITO layer. Alternatively, a conductive wire can be coiled around the organic stack to act as the second conductor. As shown in FIGS. 35 and 36, as another alternative, the cathode and anode fibers can be coated with respective layers of the organic stack and then, as shown in FIG. 105, twisted together to form an emissive fiber.

Figure 106:
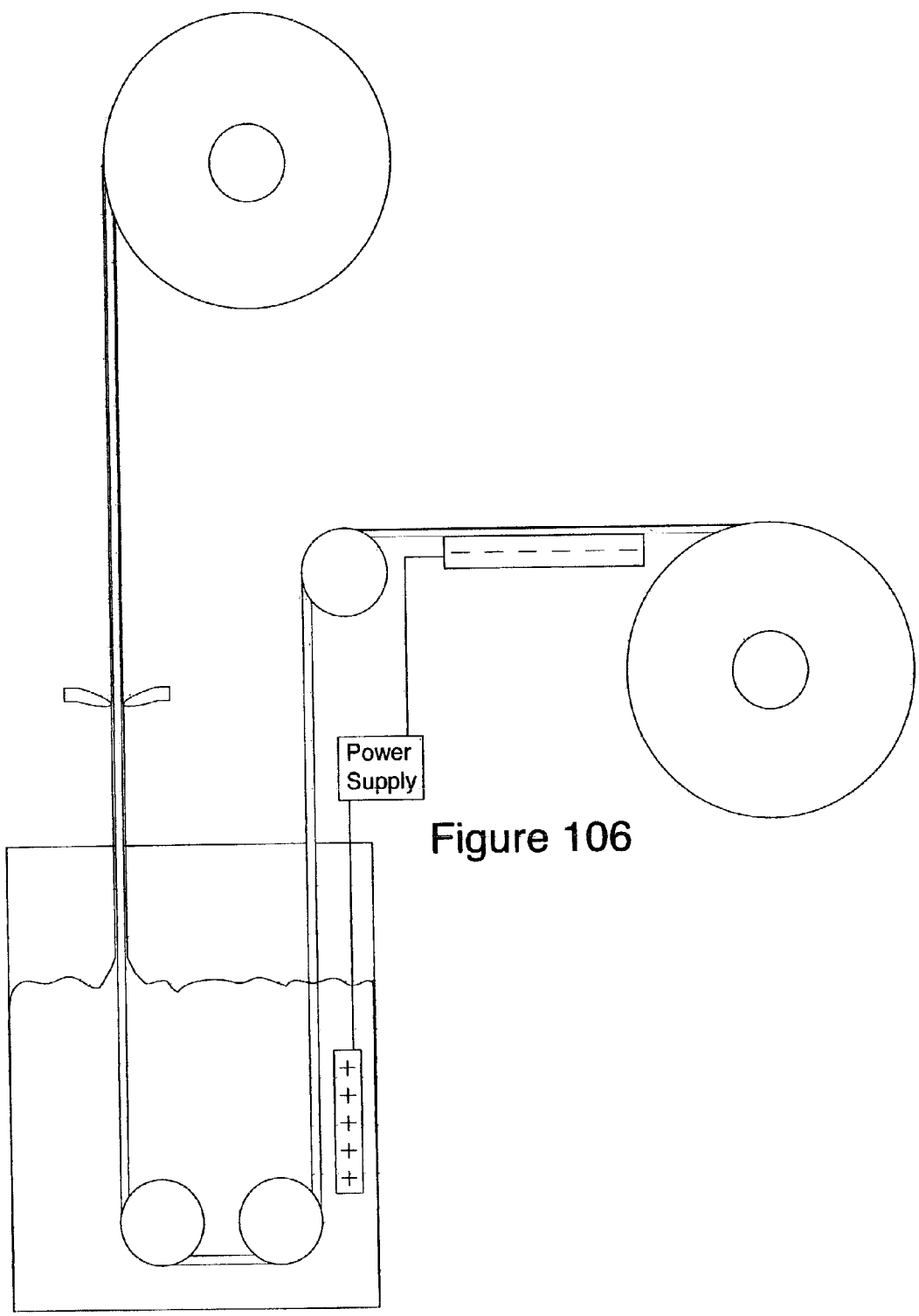
FIG. 106 shows a method for coating an electrode wire with organic light active device material.

FIG. 106 shows a method for coating an electrode fiber with organic light active device material. The electrode fiber can be spray coated, spin coated, dip coated and/or plated with the appropriate layers of the organic stack. Alternatively, the electrode fiber can be vacuum coated, evaporation coated, etc.

These emissive fibers can be used for making items, such as lights, clothing, wall hanging and carpeting that emit light.

With respect to the above description, it is realized that the optimum dimensional relationships for parts of the invention, including variations in size, materials, shape, form, function, and manner of operation, assembly and use, are deemed readily apparent and obvious to one skilled in the art. All equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described. Accordingly, all suitable modifications and equivalents may be resorted to, falling within the scope of the invention.

The invention claimed is:

1. A voltage controlled light active device for emitting two or more colors of light, comprising:
    a first electrode;
    a second electrode disposed adjacent to the first electrode and defining a gap therebetween;
    a light active layer comprised of a mixture of a light active particulate and a conductive carrier material, said mixture being disposed within said gap,
    said light active particulate comprised of
        first emitting particles including a first electroluminescent conjugated polymer, the first emitting particles emitting a number of photons of a first color in response to a first turn-on voltage applied to the electrodes and emitting a different number of photons of the first color in response to other turn-on voltages,
        said light active particulate further comprised of second emitting particles, the second emitting particles emitting a number of photons of a second color in response to a second turn-on voltage and a different number of photons of the second color in response to other turn-on voltages.

2. A light emitting device comprising:
    a first electrode;
    a second electrode disposed adjacent to said first electrode and defining a gap therebetween;
    a mixture comprising light active particulate dispersed within a conductive carrier material, said mixture being disposed within said gap and emitting light in response to an applied voltage,
    said light active particulate comprising
        a plurality of first particles having a first electroluminescent conjugated polymer emitting a first number of photons of a first color in response to a first turn-on voltage applied to said first and second electrodes and emitting a second number of photons of said first color in response to other turn-on voltages, and
        a plurality of second particles having a second electroluminescent conjugated polymer emitting a third number of photons of a second color in response to a second turn-on voltage applied to said first and second electrodes and fourth number of photons of the second color in response to said other turn-on voltages.

3. The light emitting device of claim 2 wherein said conductive carrier is comprised of an electrically conductive material.

4. The light emitting device of claim 2 wherein at least one of said plurality of first particles and said plurality of second particles includes members selected from the group consisting of polythiophenes, poly(paraphenylenes), and poly(paraphenylene vinylene), at least some of said members having substituents selected from the group consisting of alkyl, alkoxy, cycloalkyl, cycloalkoxy, flouroalkyl, alkylphenylene, and alkoxyphenylene vinylene.

* * * * *